(12) United States Patent
Elliott et al.

(10) Patent No.: US 8,338,937 B2
(45) Date of Patent: Dec. 25, 2012

(54) FLANGE PACKAGE FOR A SEMICONDUCTOR DEVICE

(75) Inventors: Alex Elliott, Tempe, AZ (US); Phuong T. Le, Goodyear, AZ (US)

(73) Assignee: Estivation Properties LLC, Dover, DE (US)

( * ) Notice: Subject to any disclaimer, the term of this patent is extended or adjusted under 35 U.S.C. 154(b) by 586 days.

(21) Appl. No.: 12/506,721

(22) Filed: Jul. 21, 2009

(65) Prior Publication Data

US 2010/0032825 A1 Feb. 11, 2010

Related U.S. Application Data

(60) Provisional application No. 61/087,050, filed on Aug. 7, 2008.

(51) Int. Cl.
*H01L 23/49* (2006.01)
(52) U.S. Cl. .............. 257/692; 257/701; 257/E23.024
(58) Field of Classification Search ............ 257/692, 257/E23.024, E23.135, E23.06, 678, 690, 257/701, 729, 734
See application file for complete search history.

(56) References Cited

U.S. PATENT DOCUMENTS

| 6,713,317 B2 * | 3/2004 | Knapp et al. ............ 438/106 |
| 7,667,314 B2 * | 2/2010 | Yoon et al. ............ 257/687 |
| 8,063,475 B2 * | 11/2011 | Choi et al. ............ 257/686 |
| 2007/0057289 A1 | 3/2007 | Davies | |

FOREIGN PATENT DOCUMENTS

WO WO 2005/069378 A2 7/2005

* cited by examiner

*Primary Examiner* — Roy Potter

(57) ABSTRACT

In accordance with one or more embodiments, a flange package comprises a flange and an interposer having two or more fingers disposed in an interposer trench. The flange has a mold lock formed about a periphery of the interposer trench. A dielectric ring comprising a dielectric material is formed in the interposer trench, and in and around the periphery of the mold lock. A semiconductor die is disposed within the dielectric ring having gate pads and source pads formed on a first side, and having drain pads disposed on a second side of the die. The gate pads are coupled to the interposer and the source pads are coupled to the flange. A gate lead is coupled to the interposer and a drain lead is coupled to the drain pads. Other embodiments are disclosed.

20 Claims, 33 Drawing Sheets

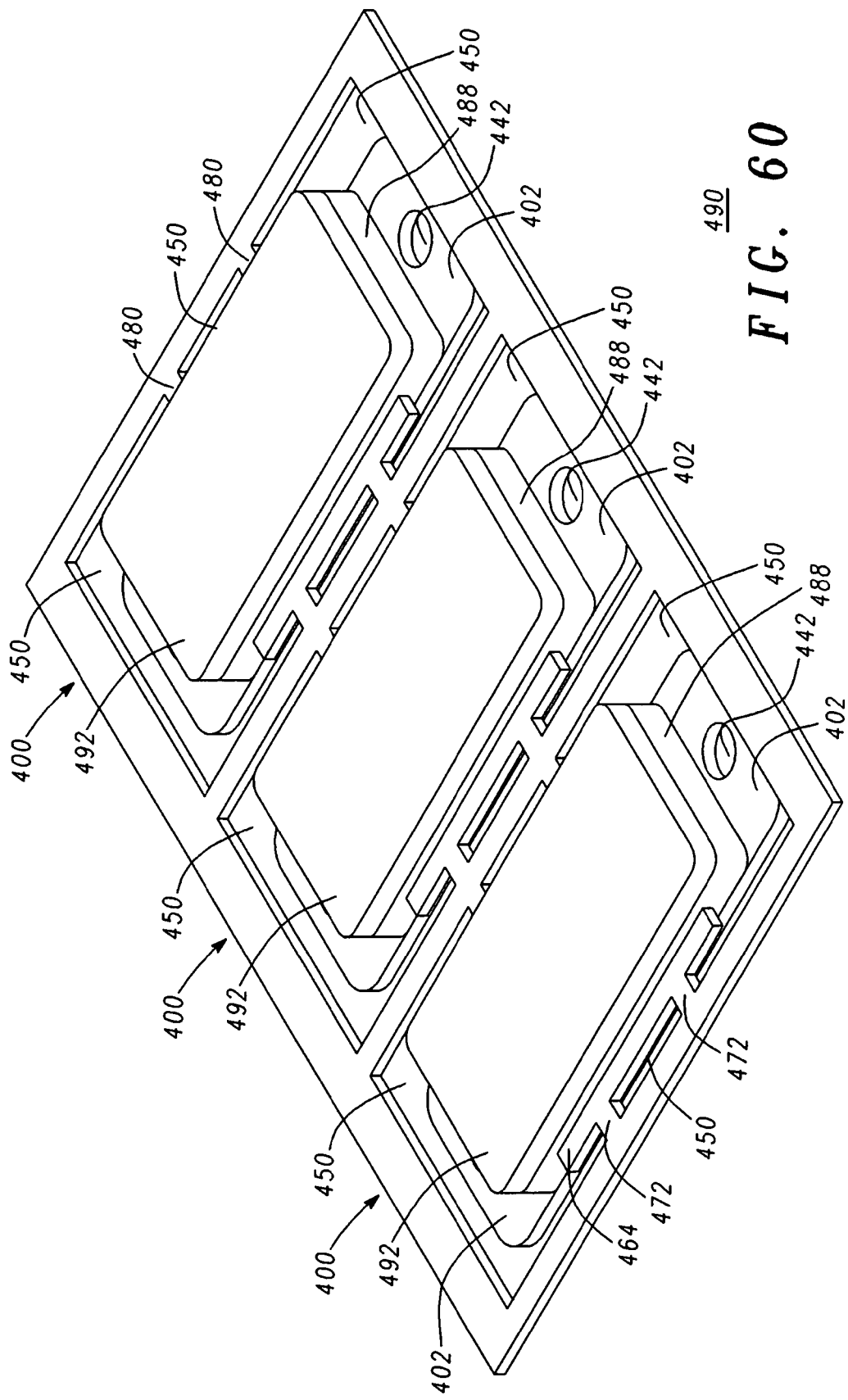

FLANGE PACKAGE FOR A SEMICONDUCTOR DEVICE

CROSS-REFERENCE TO RELATED APPLICATIONS

The present application claims the benefit of U.S. Provisional Application No. 61/087,050 filed Aug. 7, 2008. Said Application No. 61/087,050 is hereby incorporated herein by reference in its entirety.

TECHNICAL FIELD

Embodiments disclosed herein relate generally to electrical technology, and more specifically to a semiconductor component.

BACKGROUND

Semiconductor conductor component manufacturers are constantly striving to increase the performance of their products. The packaging of semiconductor die may affect the performance of a semiconductor component that includes the semiconductor die. Discrete semiconductor devices and integrated circuits are fabricated in wafers, which are then singulated or diced to produce semiconductor die. One or more semiconductor die are placed in a package to protect them from environmental and/or physical stresses.

The packaging of semiconductor die should provide protection, permit transmission of electrical signals to and from the semiconductor die, and permit removal of heat generated by the semiconductor die. Further, different packaging structures may increase the parasitic capacitances in a packaged semiconductor component which may decrease the frequency of operation of the packaged semiconductor component.

BRIEF DESCRIPTION OF THE DRAWINGS

The present claimed subject matter will be better understood from a reading of the following detailed description, taken in conjunction with the accompanying drawing figures, in which like reference numbers designate like elements and in which:

FIG. 60 is an isometric view of a plurality of semiconductor components of FIG. 59 at a later stage of manufacture in accordance with one or more embodiments.

For simplicity of illustration and ease of understanding, elements in the various figures are not necessarily drawn to scale, unless explicitly so stated. In some instances, well-known methods, procedures, components and circuits have not been described in detail so as not to obscure the claimed subject matter. The following detailed description is merely exemplary in nature and is not intended to limit the disclosure of this document and uses of the disclosed embodiments. Furthermore, there is no intention to be bound by any expressed or implied theory presented in the preceding text, including the title, technical field, background, or abstract.

DETAILED DESCRIPTION

In the following description and claims, the terms "comprise" and "include," along with their derivatives, may be used and are intended as synonyms for each other. In addition, in the following description and claims, the terms "coupled" and "connected," along with their derivatives, may be used. "Connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but they do not contact each other and that they may have another element or elements in between the two elements.

Figure 1:
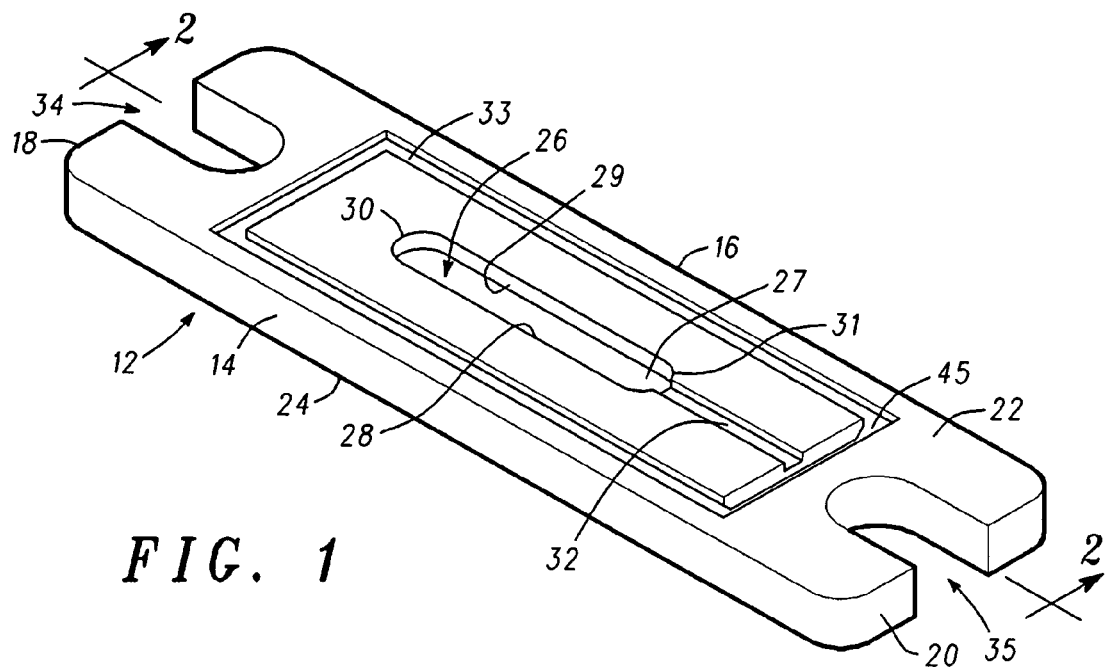
FIG. 1 is an isometric view of a flange for a semiconductor component in accordance with one or more embodiments.

Referring now to FIG. 1, an isometric view of a flange for a semiconductor component in accordance with one or more embodiments will be discussed. As shown in FIG. 1, a heat-sink or flange 12 may be utilized in the manufacturing of a semiconductor component 10 such as shown in and described with respect to FIG. 22. Flange 12 may also be referred to as a support structure or heat spreader, and has opposing sides 14 and 16 that are parallel to, or substantially parallel to, each other, opposing sides 18 and 20 that are parallel to, or substantially parallel to, each other, and opposing surfaces 22 and 24 that are parallel to, or substantially parallel to, each other. Arrows are used in some of the figures to denote recesses, openings, voids, slots, cavities, and notches, and arrows are also used in some of the figures to denote surfaces or sides that are not visible in isometric views.

Surface 22 may be referred to as a top surface and surface 24 may be referred to as a bottom surface. In some embodiments, flange 12 is made from a material that is thermally and electrically conductive and has a coefficient of thermal expansion (CTE) that matches, or substantially matches, the CTE of silicon or ceramic. Examples of suitable materials for flange 12 include copper, an alloy such as a copper alloy, a copper-tungsten alloy, aluminum, or the like. In addition, the material for flange 12 may include metal laminates such as, for example, a copper-molybdenum-copper laminate. A result of using metal laminates is that their CTEs match that of silicon better than does the CTE of copper. The material for flange 12 is not a limitation of the claimed subject matter. Thus, flange 12 can be made from materials having CTEs that do not match those of silicon or ceramic. Although flange 12 is described as being a copper flange that is gold-plated, the claimed subject matter is not limited in this regard. In other embodiments, flange 12 may be a tin-plated copper flange. A barrier material such as, for example, nickel, may be formed on flange 12 prior to plating flange 12 with tin.

Figure 17:
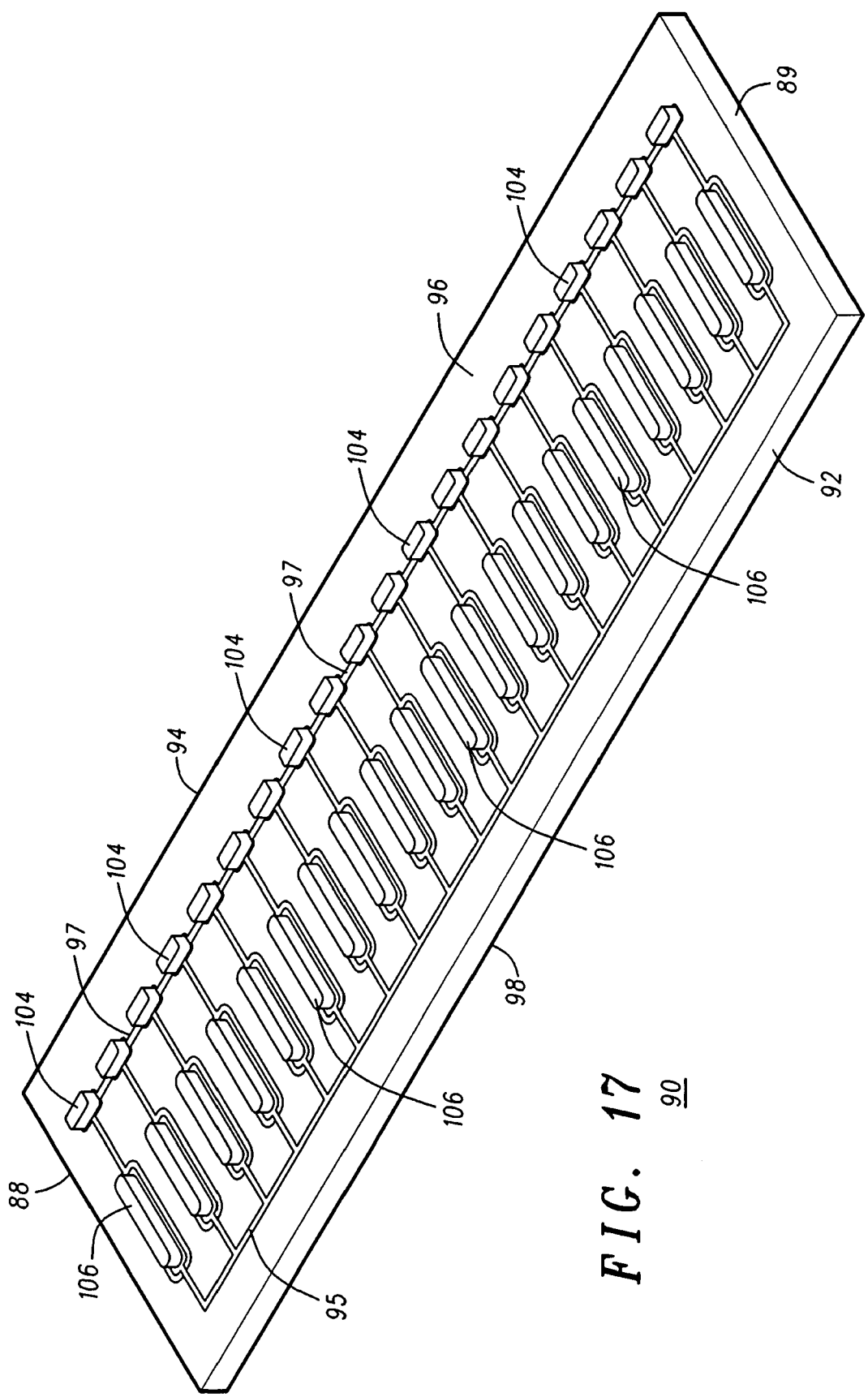
FIG. 17 is an isometric view of the semiconductor die of FIG. 16 at a later stage of manufacturing in accordance with one or more embodiments.

Flange 12 is sized to assist in maintaining the temperature of a semiconductor die 90 as shown in FIG. 17 at or below a predetermined temperature during operation of semiconductor die 90. For example, in some radio frequency (RF) applications, it may be desirable to keep the junction temperature of an RF power transistor at a temperature of less than about 200 degrees Celsius (° C.) during operation. By way of example, flange 12 has a length ranging from about 20 millimeters (mm) (about 800 mils) to about 40 mm (about 1600 mils), a width ranging from about 5 mm (about 200 mils) to about 15 mm (about 600 mils), and a thickness ranging from about 1 mm (about 40 mils) to about 3 mm (about 120 mils). The dimensions of flange 12 are not limitations of the claimed subject matter. As may be appreciated, a mil is one-thousandth of an inch.

A slot, groove, trench, or cavity 26 having a floor 27, sidewalls 28 and 29, and ends 30 and 31 is formed in flange 12. Slot 26 may be formed by milling, etching, grinding, stamping, or the like, and may have a rectangular shape, a quadrilateral shape, or other polygonal shape. In addition, slot 26 may have an oval shape. Slot 26 may be referred to as an interposer trench. The shape of slot 26 is not a limitation of the claimed subject matter; however, in some embodiments, it is desirable that slot 26 have at least one sidewall that is substantially straight. By way of example, slot 26 has a length of about 6.6 mm (about 260 mils), a width of about 1 mm (about 40 mils), and a depth of about 0.3 mm (about 12 mils).

A channel 32 that extends from end 31 of slot 26 is formed in flange 12. Like slot 26, channel 32 may be formed by milling, etching, grinding, stamping, or the like. Channel 32 may be referred to as an access channel. In accordance with some embodiments, channel 32 extends from end 31 of slot 26 to a mold lock feature 33 that surrounds slot 26. Mold lock feature 33 is described further hereinbelow.

Mold lock feature 33 having a floor 45 is formed in flange 12 and may be a trench or opening having sidewalls that are comprised of portions 43 and 44. Mold lock feature 33 is further described with reference to FIG. 2. In accordance with some embodiments, mold lock feature 33 is a trench extending from surface 22 into the body of flange 12. Mold lock feature 33 may be formed using techniques similar to those used for forming slot 26 and channel 32. It should be noted that the configuration of mold lock feature 33 is not a limitation of the claimed subject matter. Alternatively, the mold lock feature may comprise one or more trenches that are formed in flange 12 and that are parallel to or substantially parallel to a longitudinal axis of slot 26, one or more trenches that are formed in flange 12 and that are perpendicular to the longitudinal axis of slot 26, combinations of trenches having different orientations may be formed in flange 12, or the like. Preferably, slot 26, channel 32, and mold lock feature 33 are formed simultaneously using the same process. For example, slot 26, channel 32, and mold lock feature 33 may be formed during the same grinding operation, or the same milling operation, or the same stamping operation, etc.

Figure 22:
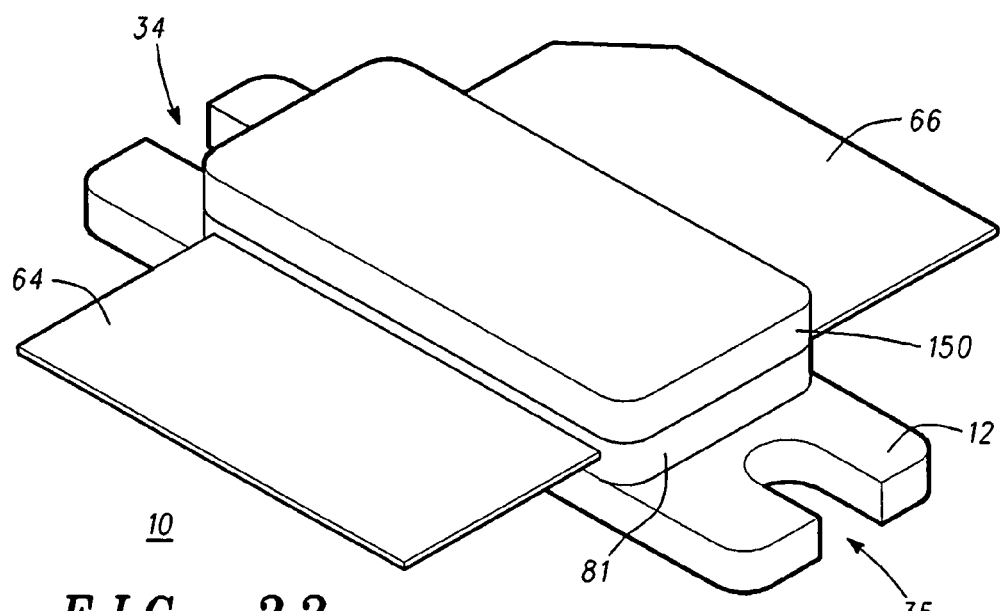
FIG. 22 is an isometric view of a semiconductor component of the plurality of semiconductor components of FIG. 20 at a later stage of manufacture in accordance with one or more embodiments.

Notches 34 and 35 extend inward from sides 18 and 20, respectively, into flange 12 and are typically used for securing semiconductor component 10 as shown in FIG. 22 to another structure using a fastener. By way of example, the other structure may be a printed circuit board (PCB), a heat sink, or the like and the fastener may be a screw, bolt, or the like. Notches 34 and 35 are optional, as other securing techniques may be used to secure flange 12 to other structures.

Figure 2:
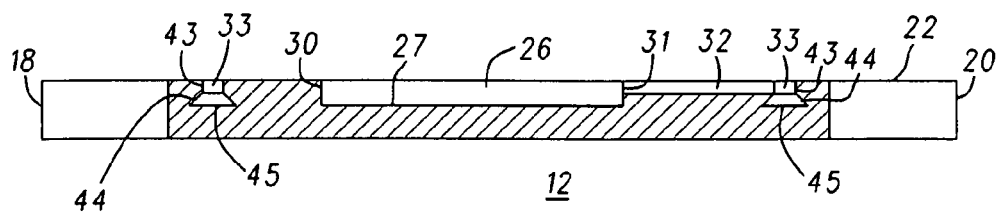
FIG. 2 is a cross-sectional view of the flange of FIG. 1 taken along section line 2-2 of FIG. 1 in accordance with one or more embodiments.

Referring now FIG. 2, a cross-sectional view of the flange of FIG. 1 taken along section line 2-2 of FIG. 1 in accordance with one or more embodiments will be discussed. FIG. 2 further illustrates channel 32 extending from end 31 of slot 26 to mold lock feature 33. End 31 of slot 26 is indicated by a vertically oriented line. Mold lock feature 33 comprises an opening extending into flange 12 from top surface 22. Portions 43 of the sidewalls of mold lock feature 33 are at the beginning of the opening of mold lock feature 33 and are substantially perpendicular to top surface 22. Portions 44 of the sidewalls of mold lock feature 33 are located in an interior portion of the body of flange 12 and form an angle that is oblique with respect to top surface 22 such that floor 45 of mold lock feature 33 has a greater width than the portion of the opening near top surface 22.

Figure 3:
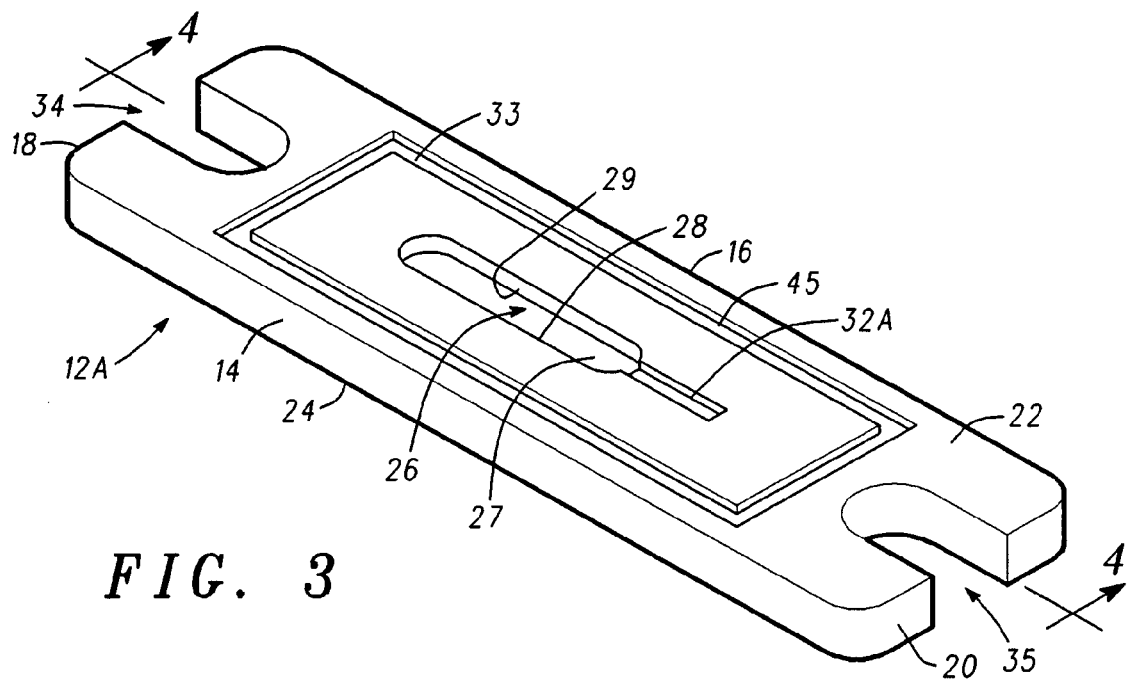
FIG. 3 is an isometric view of an alternative flange for a semiconductor component in accordance with one or more embodiments.

Referring now to FIG. 3, an isometric view of an alternative flange for a semiconductor component in accordance with one or more embodiments will be discussed. Heatsink or flange 12A may be utilized in the manufacturing of semiconductor component 10 as shown in FIG. 22, below. Flange 12A is similar to flange 12 except that channel 32A of FIG. 2 does not extend to mold lock feature 33. Rather, flange 12A has a channel 32A that extends from end 31 of slot 26 towards mold lock feature 33 but remains spaced apart from mold lock feature 33. Because of the differences in the lengths between channels 32A and 32, the flange of FIG. 3 is identified by reference number 12A rather than reference number 12. Like flange 12, flange 12A may also be referred to as a support structure or heat spreader, and has opposing sides 14 and 16 that are parallel to, or substantially parallel to, each other, opposing sides 18 and 20 that are parallel to, or substantially parallel to, each other, and opposing surfaces 22 and 24 that are parallel to, or substantially parallel to, each other. Flange 12A includes a slot 26 having a floor 27 and sidewalls 28 and 29, and a mold locking feature 33 having sidewall portions 43 and 44 and a floor 45, and sides 34 and 35. Arrows are used in some of the figures to denote recesses, openings, voids, slots, cavities, and notches, and arrows are also used in some of the figures to denote surfaces or sides that are not visible in isometric views.

Figure 4:
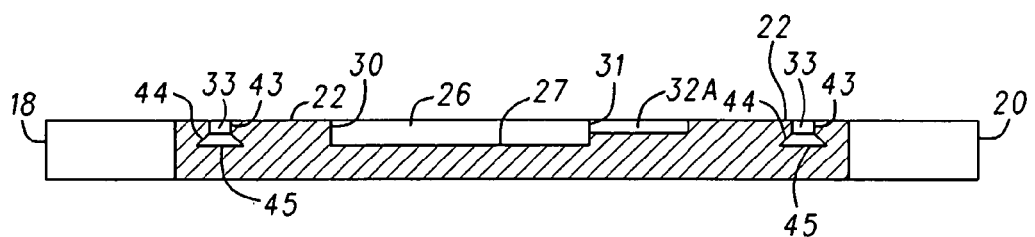
FIG. 4 is a cross-sectional view of the flange of FIG. 3 taken along section line 4-4 of FIG. 3 in accordance with one or more embodiments.

Referring now to FIG. 4, a cross-sectional view of flange 12A taken along section line 4-4 of FIG. 3 in accordance with one or more embodiments will be discussed. FIG. 4 further illustrates channel 32A extending from end 31 of slot 26. End 31 of slot 26 is indicated by a vertically oriented line. Like in FIG. 2, mold lock feature 33 comprises an opening extending into flange 12 from top surface 22. Portions 43 of the sidewalls of mold lock feature 33 are at the beginning of the opening of mold lock feature 33 and are substantially perpendicular to top surface 22. Portions 44 of the sidewalls of mold lock feature 33 are located at an interior of flange 12 and form an angle that is oblique with respect to top surface 22 such that the floor 45 of mold lock feature 33 has a greater width than the portion of the opening of mold lock feature 33 near top surface 22.

Figure 5:
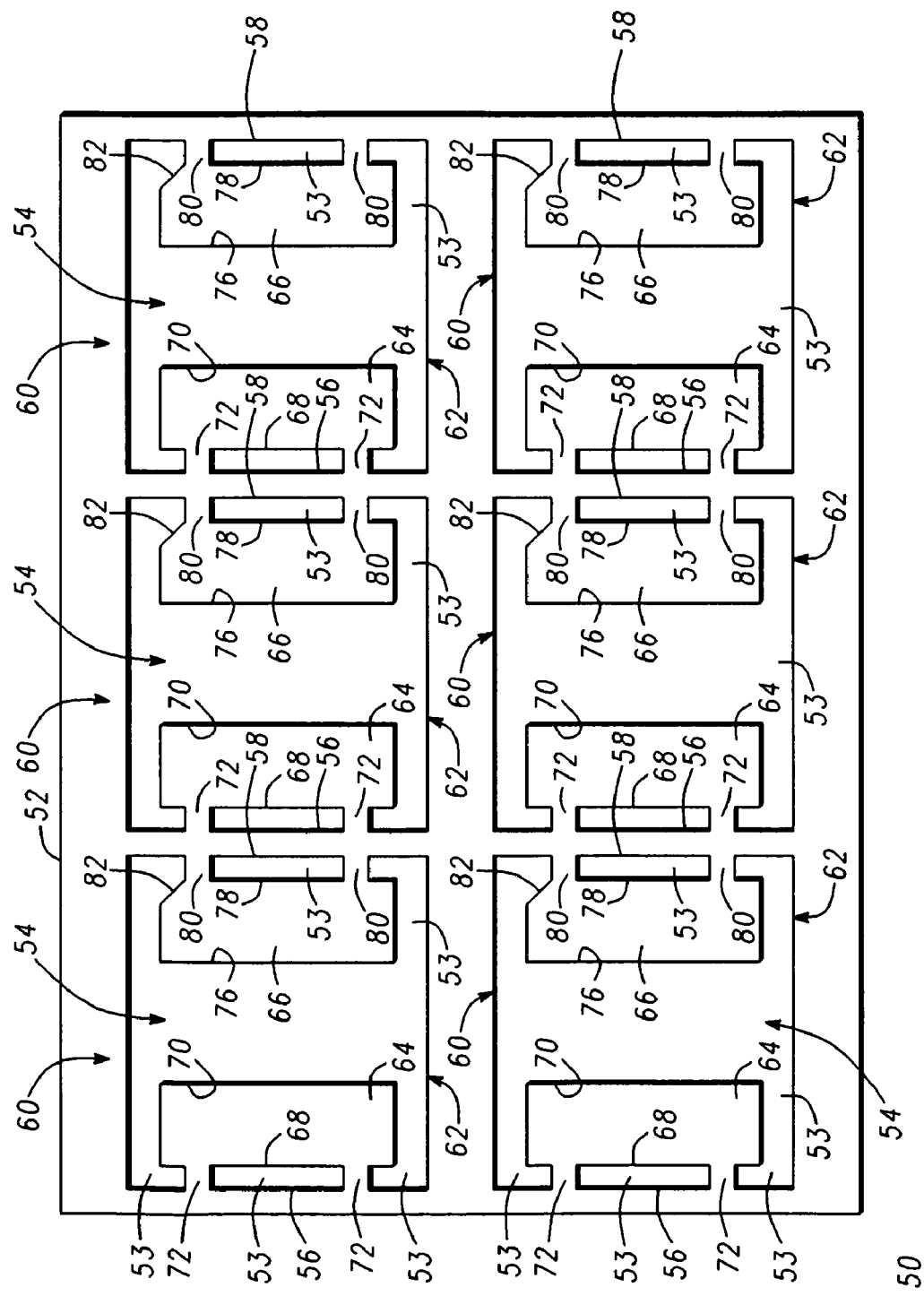
FIG. 5 is a top view of a leadframe suitable for use in manufacturing a semiconductor component in accordance with one or more embodiments.

Referring now to FIG. 5, a top view of a leadframe 50 having a leadframe body 52, a plurality of openings 53, and a plurality semiconductor device regions 54 in accordance with one or more embodiments will be discussed. Each semiconductor device region 54 has opposing sides 56 and 58, opposing sides 60 and 62, a gate lead 64 and a drain lead 66. Gate lead 64 has opposing sides 68 and 70. Tabs 72 extend from side 68 of gate lead 64 to side 56 of semiconductor device region 54 and couple gate lead 64 to leadframe 50. Drain lead 66 has opposing sides 76 and 78. Tabs 80 extend from side 78 of drain lead 66 to side 58 of semiconductor device region 54 and couple drain lead 66 to leadframe 50. Drain lead 66 has an optional notch 82 which is used by some manufacturers in some industries to indicate that it is the drain lead, although the methods and apparatuses described herein are not limited in this regard.

Figure 6:
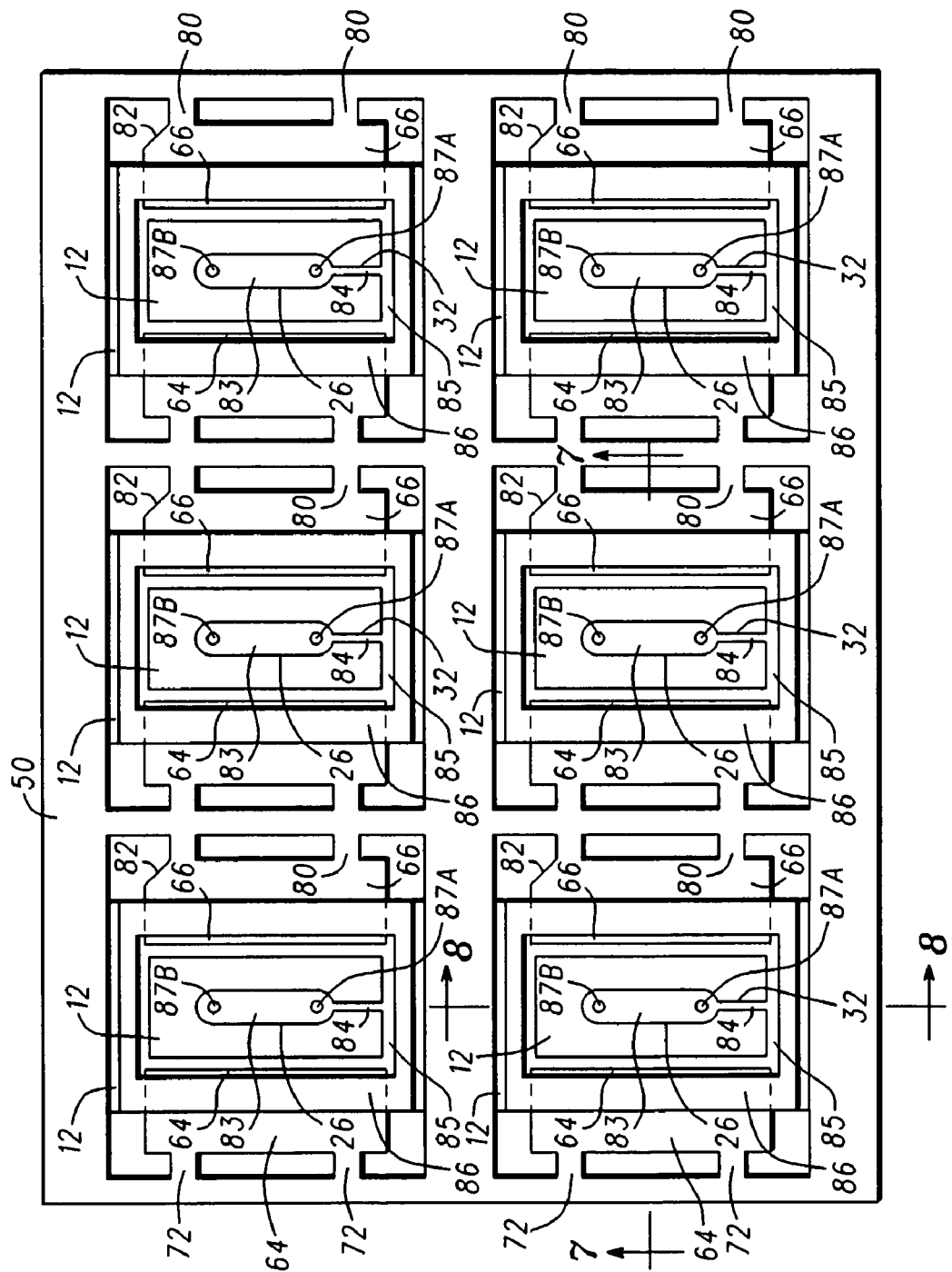
FIG. 6 is a top view of a plurality of the flanges of FIG. 1 coupled to the leadframe of FIG. 5 in accordance with one or more embodiments.
Figure 11:
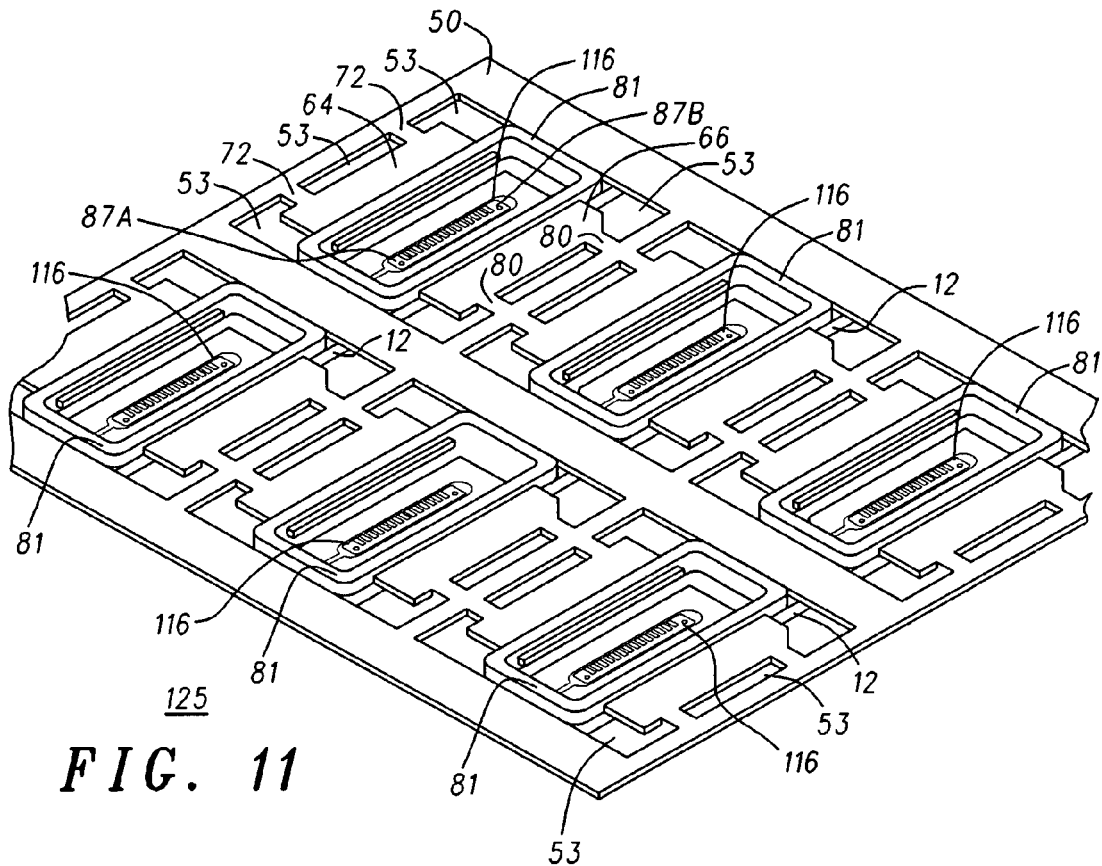
FIG. 11 is an isometric view of an assembly in accordance with one or more embodiments.

Referring now to FIG. 6, a top view of flanges 12 coupled to leadframe 50 by a dielectric material in accordance with one or more embodiments will be discussed. More particularly, flanges 12 and leadframe 50 are placed in a mold die (not shown) and dielectric material such as, for example, a mold compound is injected into the mold die. The cavities within the mold die are configured such that a portion 83 of the dielectric material is in slot 26, a portion 84 of the dielectric material is in channel 32, a portion 85 of the dielectric material is in mold lock feature 33 and extends above surface 22 of flange 12 and below and in contact with leadframe leads 64 and 66, and a portion 86 of the dielectric material is above and in contact with leadframe leads 64 and 66 and above and in contact with portion 85 of the dielectric material. Portions 85 and 86 of the dielectric material are formed as ring-like structures that together form a dielectric ring 81 as shown in FIG. 11. In addition, alignment features 87A and 87B are formed as extending from portion 83 of the dielectric material. Preferably portions 83, 84, 85, 86, 87A, and 87B of the dielectric material are formed at the same time using a dielectric material such as, for example, a liquid crystal polymer. Other suitable dielectric materials for portions 83, 84, 85, 86, 87A, and 87B of the dielectric material include ceramic, polyimide, glass, etc. Portions 83, 84, 85, 86, 87A, and 87B of the dielectric material may be formed using an injection molding process, a transfer molding process, etc.

Figure 7:
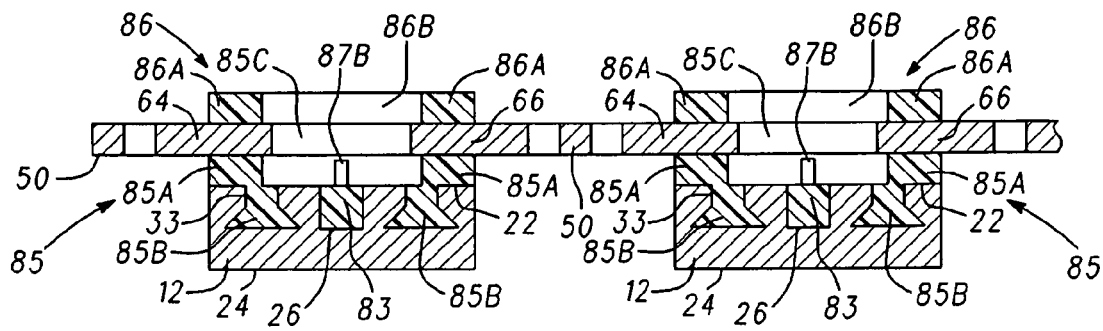
FIG. 7 is a cross-sectional view of the plurality of flanges and leadframe of FIG. 6 taken along section line 7-7 of FIG. 6 in accordance with one or more embodiments.

Referring now to FIG. 7, a cross-sectional view taken along section line 7-7 of FIG. 6 in accordance with one or more embodiments will be discussed. FIG. 7 further illustrates coupling flanges 12 to leadframe 50. More particularly, FIG. 7 illustrates flange 12 having surfaces 22 and 24, slot 26, and mold lock feature 33 coupled to leadframe 50 by portions 83, 85, and 86 of the dielectric material. It should be noted that portions 83 and sub-portions 85A, 85B of portion 85 of the dielectric material and sub-portions 86A of portion 86 of the dielectric material are cross-sectional views, whereas sub-portions 85C of portion 85 and sub-portions 86B of portion 86 are side views. In addition, FIG. 7 illustrates a side view of alignment feature 87B, and a cross-sectional view of gate lead 64 and drain lead 66.

Figure 8:
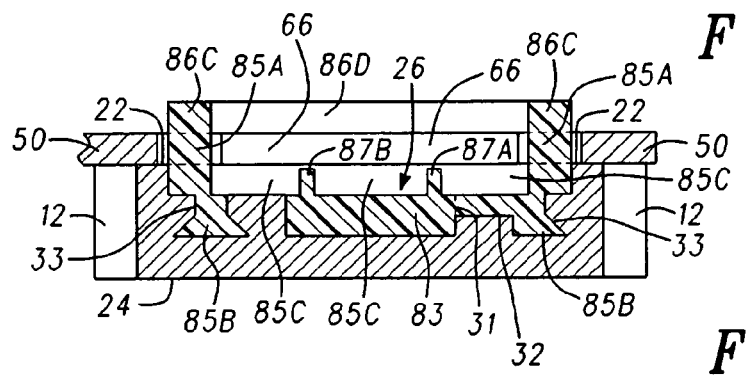
FIG. 8 is a cross-sectional view of the flanges and leadframe of FIG. 6 taken along section line 8-8 of FIG. 6 in accordance with one or more embodiments.

Referring now to FIG. 8, a cross-sectional view taken along section line 8-8 of FIG. 6 in accordance with one or more embodiments will be discussed. FIG. 8 shows flange 12 having surfaces 22 and 24, slot 26, channel 32, and mold lock feature 33 coupled to leadframe 50 by portions 83, 84, 85, and 86 of the dielectric material. It should be noted that sub-portions 85A and 85B are cross-sectional views and sub-portions 85C are side views of portion 85 of the dielectric material and that sub-portions 86C are cross-sectional views and sub-portion 86D is a side view of portion 86 of the dielectric material. In addition, FIG. 8 illustrates a cross-sectional view of alignment features 87A and 87B and a side view of drain lead 66. For the sake of clarity, a vertically oriented broken line is included to show the location of end 31 of slot 26 and a horizontally oriented broken line is included to show where sub-section 86C meets sub-section 85A.

Figure 9:
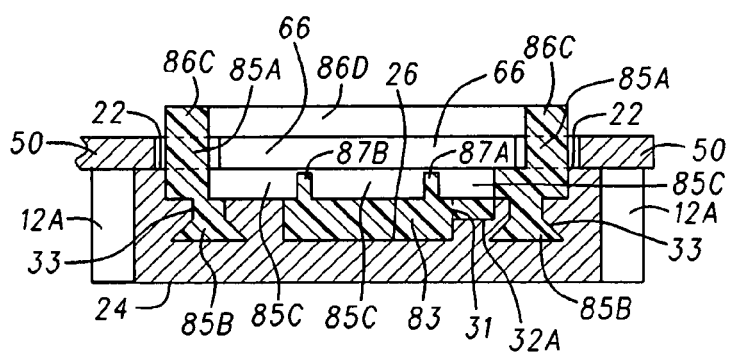
FIG. 9 is a cross-sectional view of a semiconductor component during manufacture in accordance with another embodiment, wherein the cross-section is taken along the same location as section line 8-8 of FIG. 6 in accordance with one or more embodiments.

Referring now to FIG. 9, a cross-sectional view of a semiconductor component in accordance with another embodiment in which flange 12A is used rather than flange 12 will be discussed. The cross-sectional view of FIG. 9 is taken along the same location as that taken along section line 8-8 of FIG. 6. FIG. 9 shows flange 12A having surfaces 22 and 24, slot 26, channel 32A, and mold lock feature 33 coupled to leadframe 50 by portions 83, 84, sub-portions 85A and 85B of portion 85, and sub-portions 86C of the dielectric material. It should be noted that sub-portions 85A and 85B are cross-sectional views and sub-portions 85C are side views of portion 85 of the dielectric material and that sub-portions 86C are cross-sectional views and sub-portion 86D is a side view of portion 86 of the dielectric material. In addition, FIG. 8 illustrates cross-sectional views of alignment features 87A and 87B and a side view of drain lead 66. For the sake of clarity, a vertically oriented broken line is included to show the location of end 31 of slot 26. It should be noted that flange 12A of FIG. 9 is similar to flange 12 of FIG. 8 and that the difference between them is that the channel of FIG. 8, i.e., channel 32, extends to mold lock feature 33, whereas the channel of FIG. 9, i.e., channel 32A, does not extend to mold lock feature 33. It should be noted that the semiconductor structures manufactured using either flange 12 or flange 12A are similar but the configuration of the mold die may be different when using flanges 12 and 12A.

Figure 10:
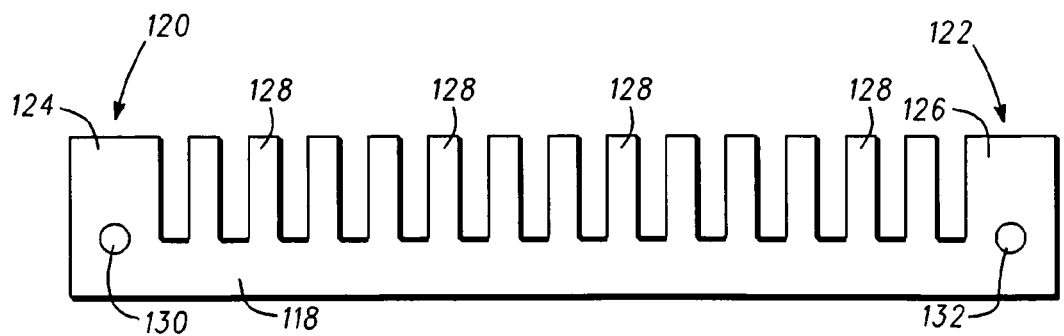
FIG. 10 is a top view of an interposer in accordance with one or more embodiments.

Referring now to FIG. 10, a top view of interposer 116 suitable for use in manufacturing semiconductor component 10 in accordance with one or more embodiments will be discussed. Interposers may also be referred to as connectors. Interposer 116 is a comb-like structure comprising a support portion or spine 118 having end regions 120 and 122, end extensions 124 and 126, and a plurality of central extensions 128. End extensions 124 and 126 extend in a perpendicular or substantially perpendicular direction from the length of spine 118. Likewise, central extensions 128 extend in a perpendicular or substantially perpendicular direction from the length of spine 118. Central extensions 128 are between end extensions 124 and 126 and may be referred to as gate interconnect pads, teeth, or fingers. Holes 130 and 132 are formed in end regions 120 and 122, respectively. It should be noted that the dimensions of interposer 116 are not a limitation of the claimed subject matter.

Interposer 116 may be made by milling, stamping, grinding, etching, or the like. In some embodiments, interposer 116 is made from a material that is thermally and electrically conductive and has a CTE that matches, or substantially matches, the CTE of silicon. Examples of suitable materials for interposer 116 include copper, an alloy such as a copper alloy, a copper-tungsten alloy, or the like. The material for interposer 116 is not a limitation of the claimed subject matter. Thus, interposer 116 can be made from materials having CTEs that do not match that of silicon. In other embodiments, interposer 116 may comprise aluminum, gold, silver, or tantalum. Interposer 116 may be formed using a conductive leadframe structure and may be referred to as a conductive structure, a leadframe interposer, a leadframe structure, or a conductive leadframe structure.

Referring now to FIG. 11, an isometric view of a plurality of flanges 12 coupled to a leadframe 50 by a dielectric material to form a leadframe assembly 125 in accordance with one or more embodiments will be discussed. As described with reference to FIGS. 6-9, in some embodiments leadframe 50 and flanges 12 are placed in a mold die and a dielectric material is injected into the mold die using an injection molding process to form portions 83, 84, 85, and 86 of the dielectric structure that couple flanges 12 to leadframe 50. Portions 85 and 86 of the dielectric material are collectively referred to as dielectric rings 81. In addition, portions of the dielectric material form alignment features 87A and 87B as described with reference to FIG. 6. Portion 85 of the dielectric material fills mold locking features 33 to help it adhere to flanges 12. Suitable materials for the dielectric material include a ceramic, polyimide, glass, or a mold compound such as, for example liquid crystal polymer.

Portion 85 of dielectric rings 81 are formed on the top and bottom surfaces of leadframe 50 such that it is over surface 22 of flange 12 and under portions of gate leads 64 and drain leads 66. Portion 86 of dielectric rings 81 is formed over portions of gate leads 64 and drain leads 66 and over portion 85. After individual packaged semiconductor components 10 as shown in FIG. 22 are singulated from leadframe 50, dielectric rings 85 electrically isolate gate leads 64, drain leads 66, and flanges 12 from each other.

Figure 12:
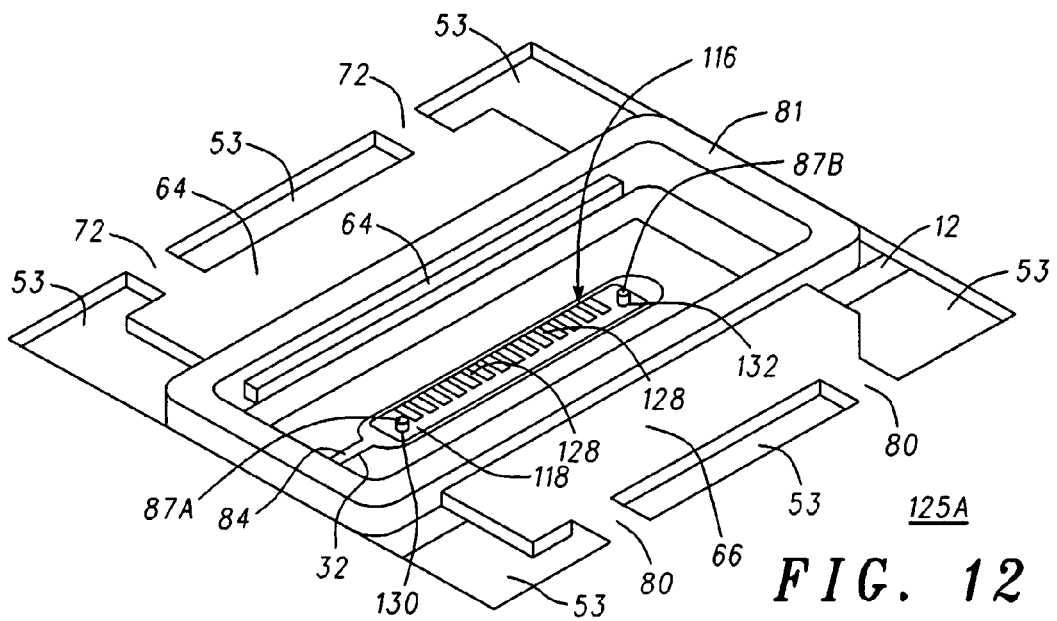
FIG. 12 is an expanded isometric view of the assembly of FIG. 11 in accordance with one or more embodiments.

Referring now to FIG. 12, an expanded isometric view of a single assembly 125A of leadframe assembly 125 having an interposer 116 mounted to portion 83 of the dielectric material in slot 26 in accordance with one or more embodiments will be discussed. More particularly, alignment holes 130 and 132 of interposers 116 are aligned to alignment features 87B and 87A, respectively, of slots 26 containing portion 83 of the dielectric material. Interposers 116 are placed on portion 83 of the dielectric material in each slot 26 such that alignment features 87B and 87A extend through openings 132 and 130, respectively. Alignment features 87A and 87B are melted to attach interposer 116 to portion 83 of the dielectric material.

It should be noted that in some embodiments, interposer 116 may be coupled to flange 12 through portion 83 of the dielectric material during the molding process. For example, interposer 116 may be placed in the mold die and held in place under vacuum when the mold die is sealed. Then the mold compound is injected into the mold die and fills slot 26 via channel 32 to mold it into position within slot 26. Before describing the coupling of a semiconductor chip to interposer 116 and leadframe leads 64 and 66, an example of a suitable semiconductor chip for coupling to interposer 116 and leadframe leads 64 and 66 is discussed, below, with respect to FIG. 13.

Figure 13:
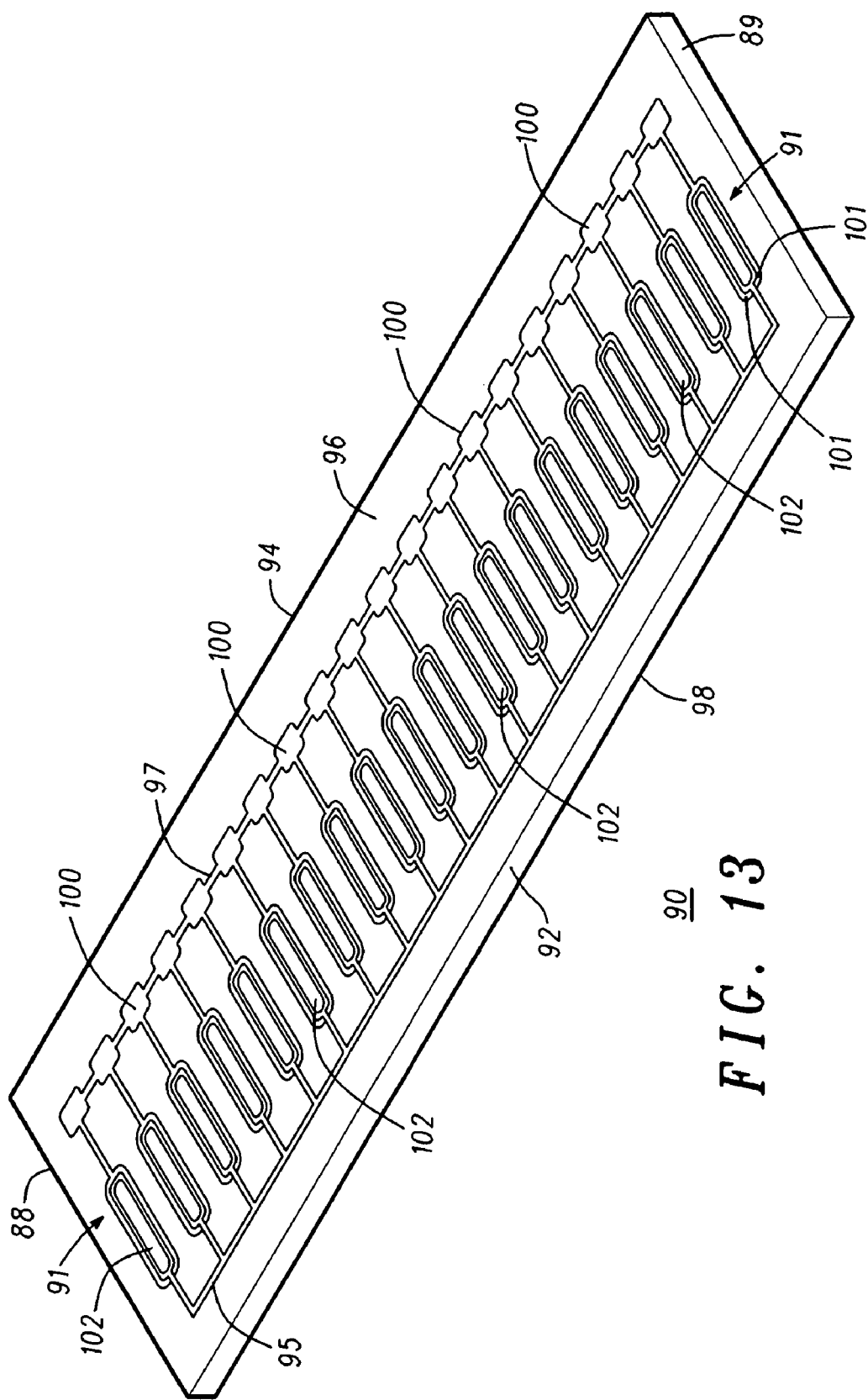
FIG. 13 is an isometric view of a semiconductor die in accordance with one or more embodiments.

Referring now to FIG. 13, an isometric view of a semiconductor chip or die 90 having sides or edges 92 and 94 that are substantially parallel to each other, edges 88 and 89 that are substantially parallel to each other, and a top surface 96 and a bottom surface 98 that are substantially parallel to each other will be discussed. Semiconductor die 90 may comprise a semiconductor material such as, for example, silicon (Si) or germanium, or a compound semiconductor material such as, for example, gallium arsenide (GaAs).

Although the scope of the claimed subject matter is not limited in this respect, in some embodiments, the length of semiconductor die 90, that is, the distance between edges 88 and 89 is about 5,080 micrometers (μm) (about 203 mils). The width of semiconductor die 90, that is, the distance between edges 92 and 94 is about 1,270 μm (about 51 mils). The thickness of semiconductor die 90, that is, the distance between surfaces 96 and 98 ranges from about 125 μm (about 5 mils) to about 625 μm (about 25 mils).

Semiconductor die 90 includes an electrical interconnect layer 95 and an electrical interconnect layer 97. Electrical interconnect layer 95 includes electrical pads 102 and may be a metal layer comprising, for example, aluminum, copper, or gold. Similarly, electrical interconnect layer 97 includes electrical pads 100 and may be a metal layer comprising, for example, aluminum, copper, or gold.

In some embodiments, semiconductor die 90 is comprised of twenty transistor cell regions 91, wherein each transistor cell region 91 comprises a plurality of active devices such as, for example, transistors, although the methods and apparatuses described herein are not limited in this regard.

In some embodiments, semiconductor die 90 is a discrete transistor such as a discrete power transistor, wherein each transistor cell region 91 comprises, for example, a plurality of vertical metal oxide semiconductor field effect transistors (MOSFETs) or vertical bipolar transistors (not shown). The transistors of the multiple transistor cell regions 91 are coupled to each other to function as a single transistor. In these embodiments, semiconductor component 10 (shown in FIG. 22) may be referred to as a discrete semiconductor device, having an input lead 64, an output lead 66, and a common lead 12. Leads 64, 66, and 12 may also be referred to as terminals, interconnects, or interconnections.

A power transistor is a device that may be capable of handling a relatively large amount of electrical current such as, for example, at least about 100 milliamps (mA) of electrical current in some embodiments. In addition a power transistor is a device that can be coupled to relatively large operating voltage potentials of, for example, at least about 20 volts to over about 100 volts, and may be used in power amplifiers to generate at least about one Watt of output power.

Although the scope of the claimed subject matter is not limited in this regard, in some embodiments, semiconductor die 90 is a radio frequency (RF) power transistor constructed to operate at frequencies of greater than about one megahertz (MHz) and to have a power output greater than about one Watt. RF power transistors can be used in RF power amplifiers that may be used in wireless communications applications such as, for example, cellular base stations, high frequency (HF), very high frequency (VHF) and ultra high frequency (UHF) broadcast transmitters, microwave radar systems, and avionics systems. Some RF power amplifiers (RFPAs) provide from about five Watts (W) to more than about 200 W of output power. In some embodiments, semiconductor die 90 is an RF power transistor adapted to operate at frequencies of greater than about 500 MHz and has an output power greater than about 5 W.

In the embodiments wherein semiconductor die 90 includes vertical MOSFETs (not shown), these vertical MOSFETs each have a source region (not shown), a drain region (not shown), and a gate (not shown). Electrical pads 102 may be coupled to the source regions of the vertical MOSFETs and may be referred to as source pads, contacts, terminals, interconnects, or interconnections. Further, source pads 102 are coupled together to function as a single source interconnect. Electrical pads 100 may be coupled to the gates of the vertical MOSFETs and may be referred to as gate pads, contacts, terminals, interconnects, or interconnections. Further, gate pads 100 are coupled together to function as a single gate interconnect. In addition, semiconductor die 90 includes a drain interconnect or terminal 99 (shown in FIG. 18) over surface 98 of semiconductor die 90, wherein the drain terminal 99 is coupled to the drain regions of the vertical MOSFETs. It should be noted that although extensions 101 are shown in FIG. 13, they are described with reference to FIG. 14.

The vertical MOSFET is vertical in that source pads 102 and drain terminal 99 are at or adjacent to opposite surfaces of semiconductor die 90. Gate pads 100 are formed at the same surface 96 of semiconductor die 90 as source pads 102. During operation, the electrical current flow from source pads 102 to drain terminal 99 in the discrete vertical power transistor may be substantially perpendicular to surfaces 96 and 98 of semiconductor die 90. In other words, current flows essentially vertically through the vertical MOSFET from source pads 102 located adjacent one surface 96 of semiconductor die 90 to drain terminal 99 located adjacent the opposite surface 98 of semiconductor die 90. An example of a vertical power transistor is described in U.S. patent application having application Ser. No. 10/557,135, titled "POWER SEMICONDUCTOR DEVICE AND METHOD THEREFOR," filed Nov. 17, 2005, which claims priority to Patent Cooperation Treaty (PCT) International Application Number PCT/US2005/000205 titled "POWER SEMICONDUCTOR DEVICE AND METHOD THEREFOR," having an International Filing Date of Jan. 6, 2005, and an International Publication Date of Jul. 28, 2005, the contents of both of these patent applications are incorporated herein by reference in their entirety. In other embodiments, the transistors in semiconductor die 90 may be vertical bipolar transistors such as insulated gate bipolar transistors (IGBTs). In such embodiments, one side of semiconductor die 90 may have an emitter region and a base region and the other side of the die may have a collector region.

Although semiconductor die 90 is described as including vertical transistors in some embodiments, this is not a limitation of the claimed subject matter. In alternate embodiments, semiconductor die 90 may include lateral transistor structures such as, for example, a laterally diffused metal-oxide-semiconductor (LDMOS) transistor structure. In an LDMOS power transistor, the gate, the source region, and the drain region are located adjacent the same surface of a semiconductor die and electrical current flows laterally through the transistor between the source and drain regions of the LDMOS power transistor.

Generally, transistors such as bipolar transistors and field effect transistors (FETs) discussed herein are understood to provide a conduction path between first and second conduction electrodes when a control signal is applied to a control electrode. For example, in a FET a channel region formed between the drain and source provides the conduction path which is controlled in accordance with the magnitude of the control signal. The gate electrode of a FET may be referred to as a control electrode and the drain and source electrodes of a FET may be referred to as current carrying electrodes or conduction electrodes. Likewise, the base of a bipolar transistor may be referred to as the control electrode and the collector and emitter electrodes of the bipolar transistor may be referred to as conduction electrodes or current carrying electrodes. In addition, the drain and source electrodes of a FET may be referred to as power electrodes and the collector and emitter electrodes of a bipolar transistor may also be referred to as power electrodes.

Figure 14:
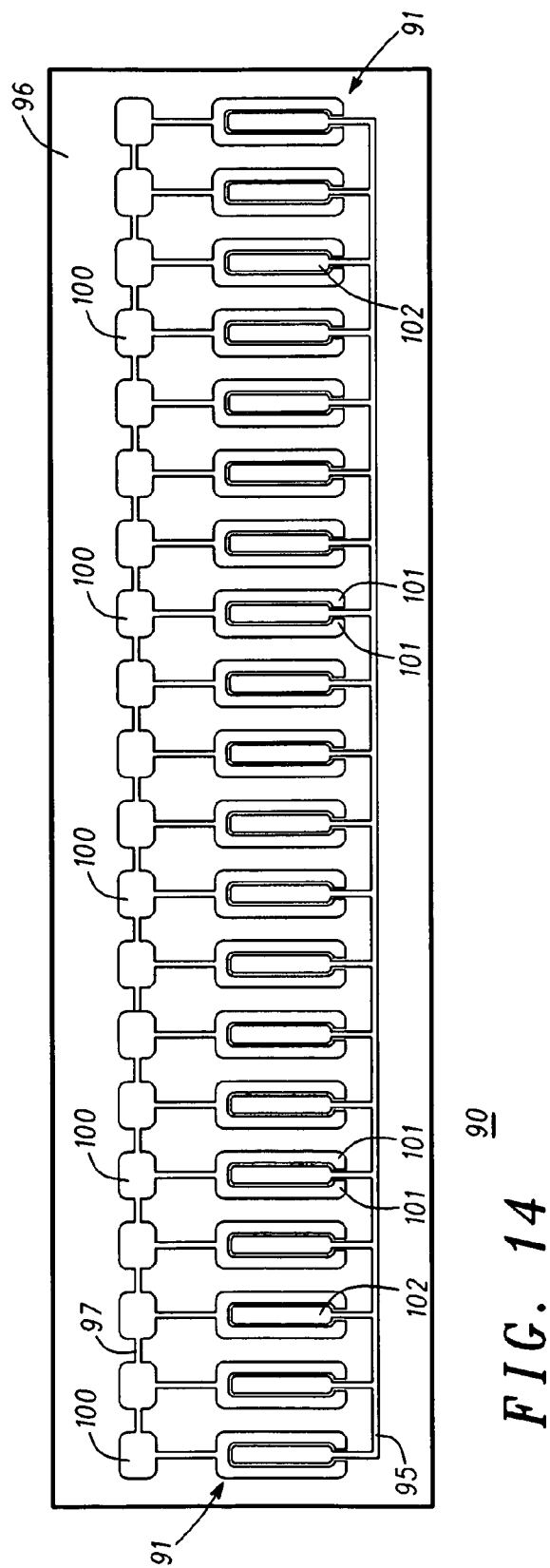
FIG. 14 is a top view of the semiconductor die of FIG. 13 in accordance with one or more embodiments.

Referring now to FIG. 14, a top view of the semiconductor die of FIG. 13 in accordance with one or more embodiments will be discussed. FIG. 14 shows a top view of semiconductor die 90. Electrical interconnect layer 97 includes extensions 101 that are spaced apart from source bond pads 102. Extensions 101 surround three sides of source bond pads 102 and are laterally adjacent a fourth side of source bond pads 102.

Figure 15:
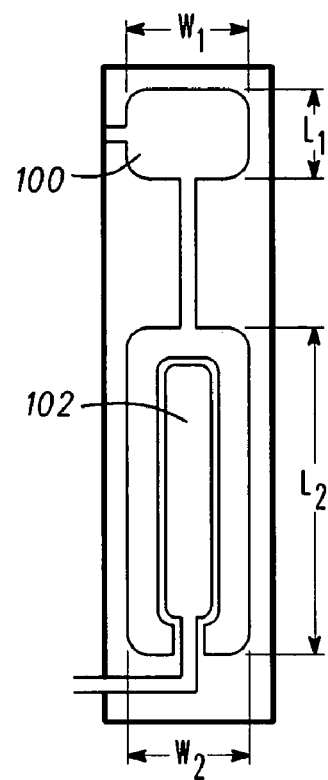
FIG. 15 is a top view of a gate pad and a source pad of the semiconductor die of FIG. 14 in accordance with one or more embodiments.

Referring now to FIG. 15, a top view of a gate pad and a source pad of the semiconductor die of FIG. 14 in accordance with one or more embodiments will be discussed. FIG. 15 shows a top view of a single gate pad 100 and source pad 102 of semiconductor die 90. FIG. 15 further shows electrical pad 100 having a width labeled $W_1$ and a length, labeled $L_1$ and shows extensions 101 having a width labeled $W_2$ and a length labeled $L_2$. In some embodiments, width $W_1$ is about 94 um, length $L_1$ is about 83 um, width $W_2$ is about 120 um, and length $L_2$ is about 493 um.

Figure 16:
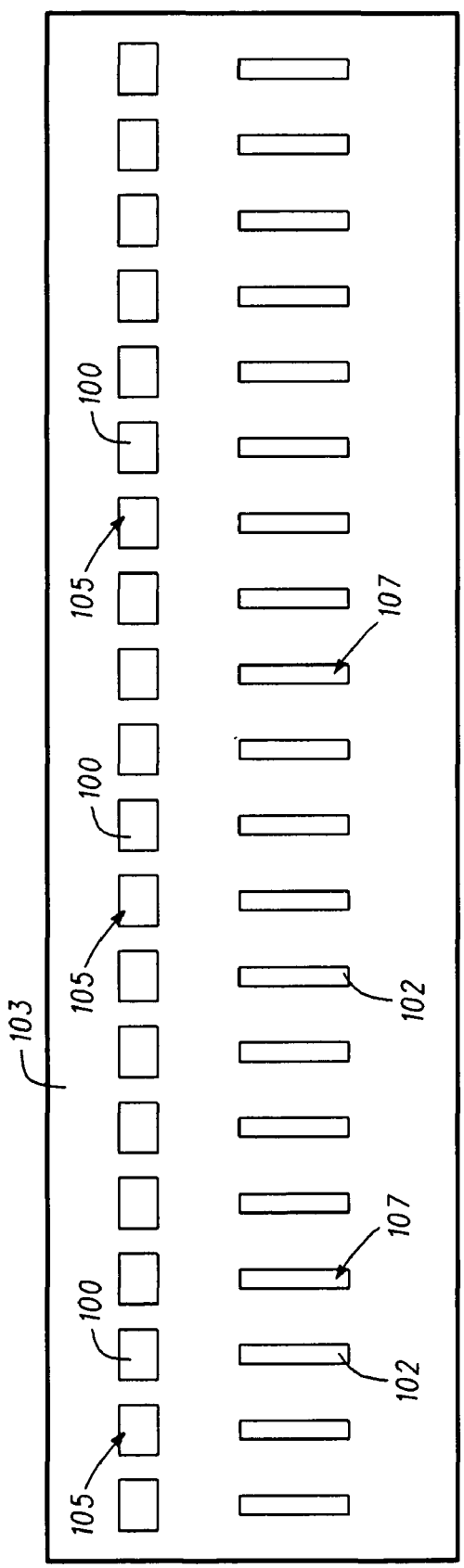
FIG. 16 is a top view of the semiconductor die of FIG. 13 at a later stage of manufacture in accordance with one or more embodiments.

Referring now to FIG. 16, a top view of semiconductor die 90 at a later stage of manufacturing will be discussed. A passivation layer 103 is formed over semiconductor die 90. Passivation layer 103 is pattered to form openings 105 and 107 to expose portions of bond pads 100 and 102 for subsequent assembly processing to connect wafer bumps 104 and 106 (shown in FIG. 17) to bond pads 100 and 102, respectively. In some embodiments, passivation layer 103 may be an oxide layer. Openings 105 that expose gate bond pads 100 are within the lateral boundaries of gate bond pads 100 and openings 107 that expose source bond pads 102 are within the lateral boundaries of source bond pads 102.

Referring now to FIG. 17, an isometric view of semiconductor die 90 at a later stage of manufacturing will be discussed. For purposes of clarity, passivation layer 103 is not shown in FIG. 17 to illustrate the formation of wafer bumps 104 and 106. Gate bumps 104 are formed contacting gate bond pads 100 and source bumps 106 are formed contacting source bond pads 102.

Bumps 104 and 106 may be referred to as wafer bumps that may be formed on semiconductor die 90 while it is still part of a wafer. Bumps 104 and 106 may comprise gold and may be formed using an electroplating process. Although not shown, an electroplating process may be used to form a cap layer over gold bumps 104 and 106. The cap layer may have a thickness of about three microns and may comprise tin, and in these embodiments bumps 104 and 106 may be referred to as gold-tin (AuSn) wafer bumps or gold bumps having a tin cap. Eutectic bonding may be used to couple or attach flange 12 to wafer bumps 104 and 106.

In some embodiments, wafer bumps 106 may each have a length of about 500 μm and a width of about 120 μm and wafer bumps 104 may each have a length of about 80 μm and a width of about 80 μm. In addition, bumps may have a height or thickness ranging from about 25 μm (about 1 mil) to about 100 μm (about 4 mils). As may be appreciated, a mil is one-thousandth of an inch. Further, bumps 106 may be spaced apart from each other by about 60 microns, although the methods and apparatuses described herein are not limited in this regard.

Bumps 104 and 106 may be useful for coupling elements of the active area of semiconductor die 90 to other electrical elements or components within or external to a package employed to encapsulate and protect semiconductor die 90 and attendant circuitry from environmental insults, such as chemical attack, physical abrasion, and the like.

As discussed in more detail below, the height of wafer bumps 104 and 106 may be set to provide a predetermined amount of space or air between semiconductor die 90 and flange 12. In embodiments wherein semiconductor die 90 comprises a plurality of transistors coupled together to function as a discrete power transistor, spacing semiconductor die 90 further from flange 12 can increase the standoff voltage of semiconductor die 90. As a general guideline, for every 25 μm (1 mil) of air or space, this may result in about 50 volts of standoff voltage. Thus, forming bumps 104 and 106 to have a height of at least about 50 μm may result in semiconductor die 90 being capable of having a standoff voltage of at least about 100 volts. As is generally understood, the standoff voltage is typically designed to be greater than the desired breakdown voltage of the device. For example, if the desired breakdown voltage of semiconductor die 90 is about 100 volts, then the standoff voltage of semiconductor die 90 should be at least about 100 volts or greater.

Accordingly, wafer bumps 106 may be relatively high current-carrying contacts for a power electrode of a gain element such as a transistor, for example, wafer bumps 106 may be current carrying contacts for a source of a discrete power field effect transistor (FET). In addition, bumps 106 may also function as a thermal path to transfer heat from semiconductor die 90 to a heat sink or heat spreader such as, for example, flange 12 (shown in FIG. 1). As may be appreciated, contact between all of bumps 106 and flange 12 may enhance the thermal conductivity to remove heat generated by semiconductor die 90. If contact to only some, but not all, of bumps 106 is made by flange 12, then optimal removal of heat from semiconductor die 90 may not be achieved.

Wafer bumps 104 and 106 may be referred to as bumps, interconnects, interconnections, or semiconductor die attach elements. Results of forming wafer bumps 104 and 106 having a thickness of at least about 25 microns or greater include an increase in the standoff voltage of semiconductor die 90 to support relatively higher drain-to-source breakdown voltages (BVds) and a reduction in the drain-to-source capacitance (Cds). Increasing the standoff and breakdown voltages of semiconductor die 90 results in devices that may be operated with relatively higher voltages and reducing the parasitic capacitances of semiconductor component 10 (shown in FIG. 22) may increase the operating frequency of semiconductor component 10. Further, forming relatively large wafer bumps such as described herein, provides bumps that have a relatively high electrical current conduction and thermal conduction capability. In addition, if bumps 104 and 106 comprise a relatively malleable material such as, for example, gold or a gold alloy, this may aid in the manufacture and operation of semiconductor component 10 as shown in FIG. 22, as bumps 104 and 106 may deform or absorb mechanical stress that may be caused by a CTE mismatch of the material of semiconductor die 90 and the material of flange 12.

Figure 18:
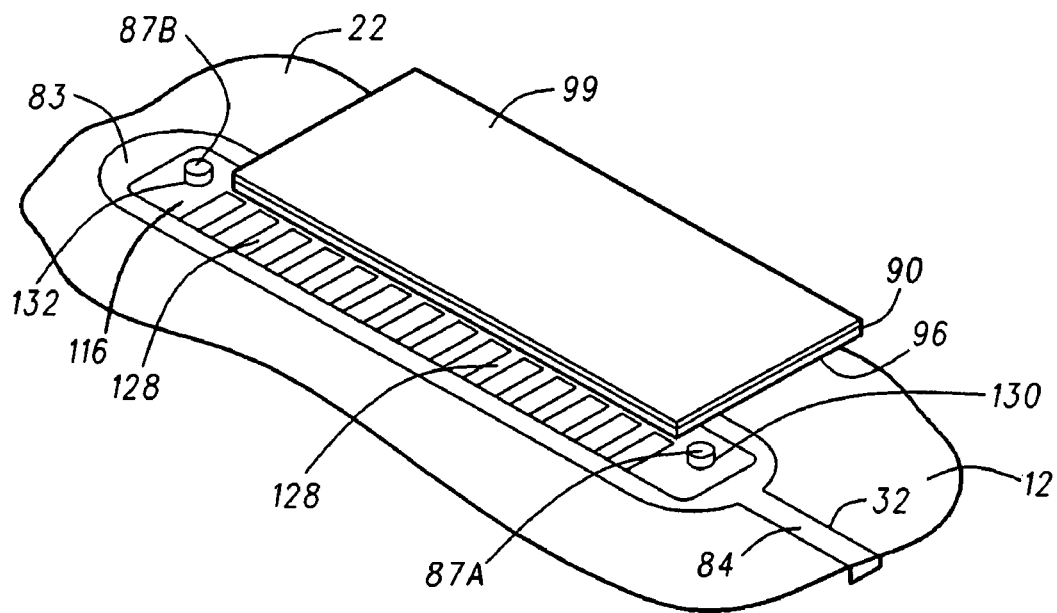
FIG. 18 is an isometric view of the single semiconductor die, interposer, and flange further along in manufacture in accordance with one or more embodiments.

Although not shown in FIG. 17, drain terminal 99 as shown in FIG. 18 of semiconductor die 90 may be a layer of an electrically conductive material such as, for example, gold or copper, that may be formed overlying surface 98 of semiconductor die 90 prior to coupling semiconductor die 90 to an interposer 116 and flange 12. Source terminals 106, gate terminals 104, and drain terminal 99 are electrically isolated from each other.

Referring now to FIG. 18, an isometric view of semiconductor die 90 bonded to interposer 116 and to flange 12 will be discussed. In particular, semiconductor die 90 is flipped so that gate bumps 104 as shown in FIG. 17 contact support portion 118 as shown in FIG. 10 of interposer 116 and so that source bumps 106 as shown in FIG. 17 contact surface 22 of flange 12.

Gate bumps 104 and source bumps 106 may be respectively attached to support portion 118 of interposer 116 and to surface 22 of flange 12 using eutectic bonding. For example, a die bonder (not shown) may be used to pick up a semiconductor die 90 and place it on interposer 116 and flange 12 so that gate bumps 104 contact support portion 118 of interposer 116 and so that source bumps 106 contact surface 22 of flange 12. Then, heat and pressure, and optionally ultrasonic energy, may be applied to form the eutectic bond at the points where gate bumps 104 contact support portion 118 of interposer 116 and at the points where source bumps 106 contact surface 22 of flange 12.

In embodiments wherein bumps 104 and 106 comprise a gold bump having a tin cap layer (not shown), the heat and pressure used to bond semiconductor die 90 to flange 12 and interposer 116 may cause the gold and tin to diffuse together to form an alloy composition of, for example, 80% gold (Au) and 20% tin (Sn) at upper portions of bumps 104 and 106 that may be used to bond bumps 104 and 106 to interposer 116 and flange 12, respectively. As an example, a temperature of about 280° C. to about 320° C. is applied to flange 12 and semiconductor die 90 for a time period ranging from about 20 seconds to about 40 seconds.

Although the scope of the claimed subject matter is not limited in this respect, in some embodiments, flange 12 may comprise copper and may be gold-plated with about 30 microinches (about 0.762 microns) of gold. During the eutectic bonding process, some of the gold from the gold plating of flange 12 may be consumed during the bonding process to form the eutectic bond.

Figure 19:
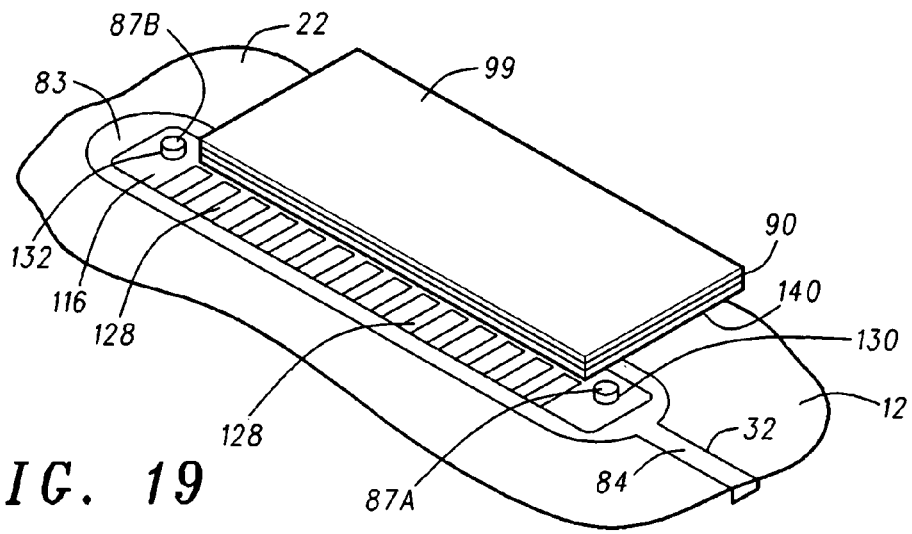
FIG. 19 is an isometric view of the single semiconductor die, interposer, and flange of FIG. 18 further along in manufacture in accordance with one or more embodiments.

Referring now to FIG. 19, an underfill material 140 dispensed between semiconductor die 90 and interposer 116 and between semiconductor die 90 and flange 12 will be discussed. After dispensing underfill material 140, it is cured. By way of example, underfill material 140 is polyimide. As is discussed below, a result of including underfill material 140 in the spaces between flange 12 and semiconductor die 90 is that it increases the breakdown voltage of the transistors formed in semiconductor die 90. Underfill material 140 may also be used for mechanical integrity to distribute mechanical stresses more uniformity in wafer bumps 104 and 106. As may be appreciated, the type of underfill dielectric material selected may alter drain-to-gate and drain-to-source capacitance depending on the dielectric constant of the underfill dielectric material.

Figure 20:
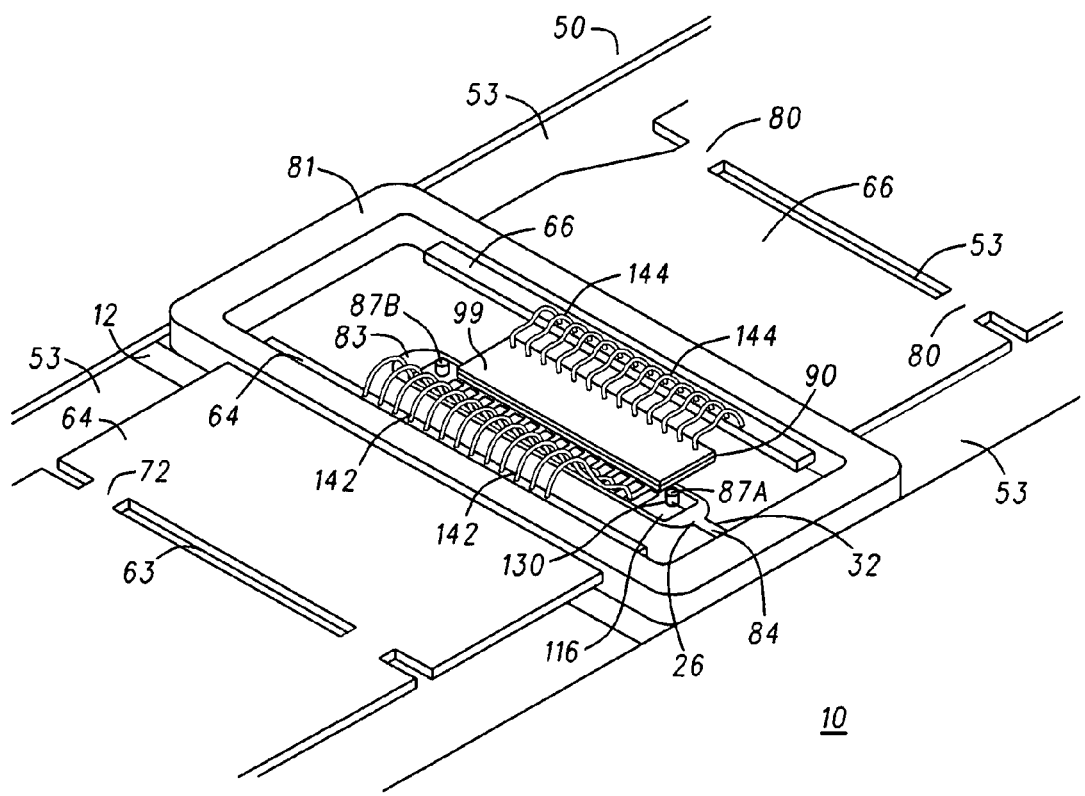
FIG. 20 is an isometric view of the single semiconductor die, interposer, and flange of FIG. 19 further along in manufacture in accordance with one or more embodiments in accordance with one or more embodiments.

Referring now to FIG. 20, wirebonds 142 formed from gate interconnect pads 128 to gate leads 64 and wirebonds 144 formed from drain terminal 99 of semiconductor die 90 to drain leads 66 will be discussed. Wirebonds 142 and 144 may have a diameter ranging from about 25 microns to about 50 microns and are also referred to as bonding wires or bond wires. Suitable materials for wirebonds 142 and 144 include gold, copper, or aluminum. In alternate embodiments, rather than using wirebonds 142 and 144, a metal clip (not shown) may be used to couple gate lead 64 to gate interconnect pads 128 and another metal clip (not shown) may be used to couple drain terminal 99 to drain lead 66. It should be noted that not using wire bonds may reduce parasitic inductance in semiconductor component 10.

Figure 21:
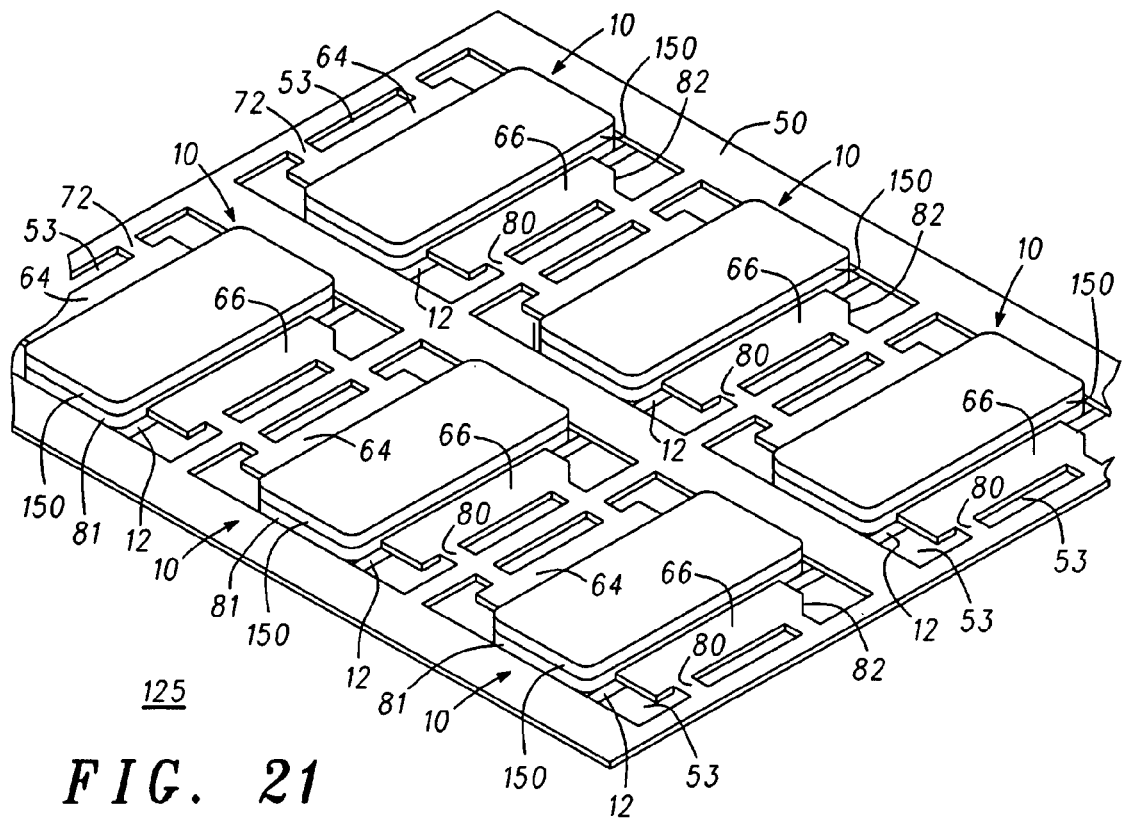
FIG. 21 is an isometric view of a plurality of semiconductor components of FIG. 20 at a later stage of manufacture in accordance with one or more embodiments.

Referring now to FIG. 21, lids 150 comprising a dielectric material such as, for example, ceramic or plastic, are attached to dielectric rings 81 using for example, an epoxy, thereby forming a plurality of non-singulated semiconductor components 10. Alternatively, lids 150 may comprise a liquid crystal polymer that is ultrasonically bonded or fused to ring 81 that also comprises liquid crystal polymer.

Referring now to FIG. 22, individual packaged semiconductor components 10 are singulated from leadframe assembly 125 as shown in FIG. 21 that include a plurality of non-singulated semiconductor components. As may be appreciated, tabs 80 and 72 as shown in FIG. 21 are cut to singulate the plurality of semiconductor components 10. Techniques for singulating semiconductor components from leadframes are known to those skilled in the art.

A portion of gate lead 64 is partially exposed external to semiconductor component 10 to provide electrical coupling of a bias signal such as, for example, a voltage ranging from about one volt to about four volts, from an external source (not shown) to gate bond pads 100 as shown in FIG. 17 of semiconductor die 90 via gate lead wirebonds 142 as shown in FIG. 20, gate interconnect pads 128 as shown in FIG. 18, and gate bumps 104 as shown in FIG. 17. A portion of drain lead 66 is partially exposed external to semiconductor component 10 to provide electrical coupling of a bias signal such as, for example, a voltage ranging from about 20 volts to about 100 volts, from an external source (not shown) to drain terminal 99 of semiconductor die 90 via drain lead 66 and wirebonds 144 as shown in FIG. 20. Flange 12 is partially exposed external to semiconductor component 10 to provide electrical coupling of a bias signal such as, for example, ground, to source bond pads 102 as shown in FIG. 17 of semiconductor die 90 via flange 12 and source bumps 106 as shown in FIG. 17. Flange 12 is also partially exposed to allow coupling of flange 12 to a thermally conductive material having a relatively low thermal resistance such as, for example, a metal heat sink (not shown) to provide a thermal path for removing heat generated by semiconductor die 90.

In the embodiment wherein semiconductor die 90 is a discrete power transistor, spacing flange 12 further away from the edges of semiconductor die 90 may result in increased the breakdown voltage of semiconductor component 10. In some embodiments, flange 12 may be coupled to ground and drain terminal 99 of semiconductor die 90 may be coupled to a relatively high voltage or a high voltage potential ranging from, for example, at least about 20 volts (V) to over 100 V. During operation, electric field potentials may be concentrated at the edges of semiconductor die 90, and therefore, flange 12 may be positioned to be spaced apart at a predetermined distance from the edges of semiconductor die 90 to prevent arcing between semiconductor die 90 and flange 12 which may adversely affect the breakdown voltage of the power transistor of semiconductor die 90. As was discussed above, wafer bumps 104 and 106 are formed to have a predetermined height ranging from about 25 µm to about 100 µm to provide this amount of spacing between semiconductor die 90 and flange 12 to support drain-to-source breakdown voltages (BVds) ranging from about 50 volts to about 200 volts. Further, forming dielectric underfill material such as, for example, underfill material 140 discussed with reference to FIG. 19, in the spaces between flange 12 and semiconductor die 90 may further increase the standoff and breakdown voltages of semiconductor die 90.

Figure 23:
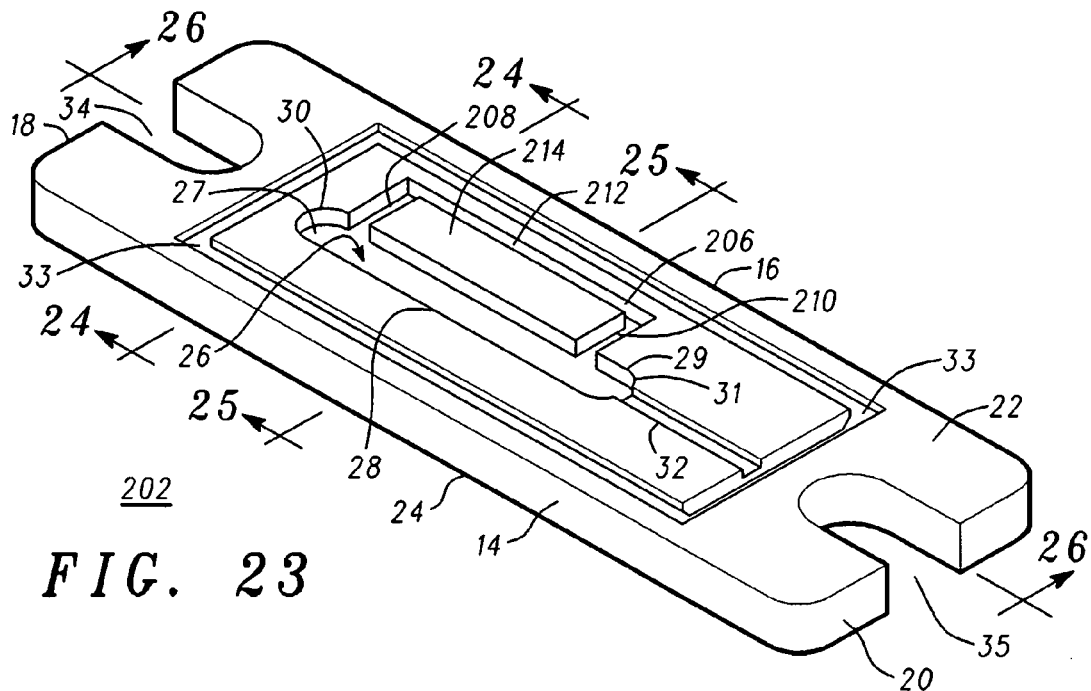
FIG. 23 is an isometric view of a flange used in the manufacture of a semiconductor component in accordance with another embodiment in accordance with one or more embodiments.
Figure 36:
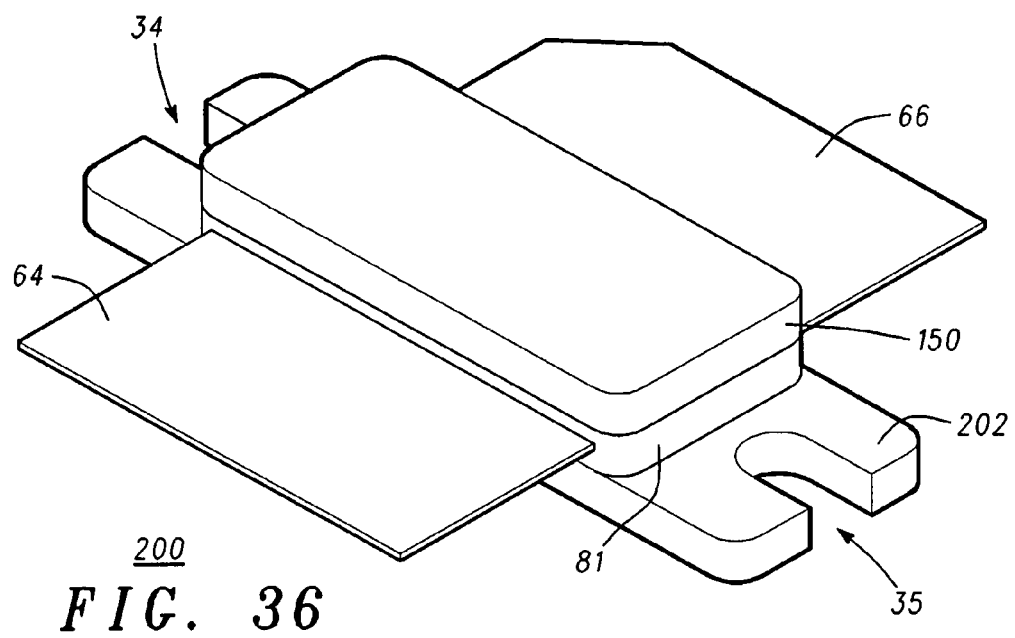
FIG. 36 is an isometric view of a semiconductor component of the plurality of semiconductor components of FIG. 35 at a later stage of manufacture in accordance with one or more embodiments.

FIG. 23 is an isometric view of a heatsink or flange 202 used in manufacturing a semiconductor component 200 as shown in FIG. 36 in accordance with another embodiment. Like flange 12, flange 202 may also be referred to as a heat spreader, and has opposing sides 14 and 16 that are substantially parallel to each other, opposing sides 18 and 20 that are substantially parallel to each other, and opposing surfaces 22 and 24 that are substantially parallel to each other, and notches 34 and 35 that extend inward from sides 18 and 20, respectively, into flange 252. Arrows are used in some of the figures to denote recesses, openings, voids, slots, cavities, and notches, and arrows are also used in some of the figures to denote surfaces or sides that are not visible in isometric views.

As discussed with respect to flange 12, surface 22 may be referred to as a top surface and surface 24 may be referred to as a bottom surface. In some embodiments, flange 202 is made from a material that is thermally and electrically conductive and has a CTE that matches, or substantially matches, the CTE of silicon. The dimensions of flange 202 and examples of suitable materials for flange 202 may be the same as those for flange 12.

In addition to slot 26 having a floor 27, sidewalls 28 and 29, ends 30 and 31, channel 32, and mold lock feature 33 having sidewall portions 43 and 44 and floor 45, flange 202 has a trench 206 that extends from side 29 of slot 26 towards side 16 of flange 202. In some embodiments, trench 206 is a U-shaped structure having legs 208 and 210 that are spaced apart from each other and extend substantially orthogonally from side 29. Trench 206 further includes a connecting portion 212 that connects one end of leg 208 to a corresponding end of leg 210. Like slot 26 and channel 32, trench 206 may be formed by milling, etching, grinding, stamping, or the like. Formation of trench 206 leaves a portion 214 of flange 202 and a portion of top surface 22 bounded on three sides by trench 206 and laterally bounded on one side by slot 26. Portion 214 is the portion of flange 202 where source bumps 106 of semiconductor die 90 as shown in FIG. 17 will be attached. During operation, electric field potentials may be concentrated at the edges of semiconductor die 90, which lowers the breakdown voltage of semiconductor component 200. Trench 206 spaces flange 202 apart from the edges of a semiconductor die such as, for example, semiconductor die 90, which increases the standoff voltage of semiconductor die 90 resulting in an increased breakdown voltage. In addition, it may flange 202 positioned to be spaced apart at a predetermined distance from the edges of semiconductor die 90 to prevent arcing between semiconductor die 90 and flange 202 which may adversely affect the breakdown voltage of the power transistor of semiconductor die 90. As was discussed above, wafer bumps 104 and 106 are formed to have a predetermined height ranging from about 25 µm to about 100 µm to provide this amount of spacing between semiconductor die 90 and flange 202 to support drain-to-source breakdown voltages (BVds) ranging from about 50 volts to about 200 volts.

Figure 24:
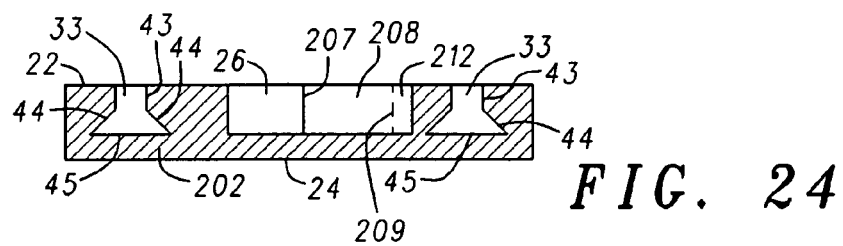
FIG. 24 is a cross-sectional view of the flange of FIG. 23 taken along section line 24-24 of FIG. 23 in accordance with one or more embodiments.

FIG. 24 is a cross-sectional view of flange 202 taken along section line 24-24 of FIG. 23. FIG. 24 further illustrates surfaces 22 and 24 of flange 202, slot 26, leg 208, trench 206, and mold lock feature 33. The location of the edges between slot 26 and leg 208 is identified by vertically oriented line 207, and the location of the edges between leg 208 and connecting portion 212 is identified by vertically oriented broken line 209. Mold lock feature 33 comprises an opening extending into flange 202 from top surface 22. Portions 43 of the sidewalls of mold lock feature 33 near the beginning of the opening of mold lock feature 33 are substantially perpendicular to top surface 22. Portions 44 of the sidewalls of mold lock feature 33 are located at an interior portion of or within the body of flange 202 and form an angle that is oblique with respect to top surface 22 such that the floor 45 of mold lock feature 33 has a greater width than the portion of the opening near top surface 22.

Figure 25:
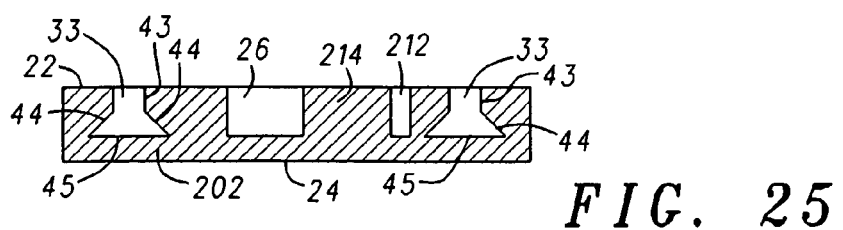
FIG. 25 is a cross-sectional view of the flange of FIG. 23 taken along section line 25-25 of FIG. 23 in accordance with one or more embodiments.

FIG. 25 is a cross-section view of flange 202 taken along section line 25-25 of FIG. 23. FIG. 25 further illustrates surfaces 22 and 24 of flange 202, slot 26, source attachment portion 214, connecting portion 212 of trench 206, and mold lock feature 33 having sidewall portions 43 and 44 and floor 45.

Figure 26:
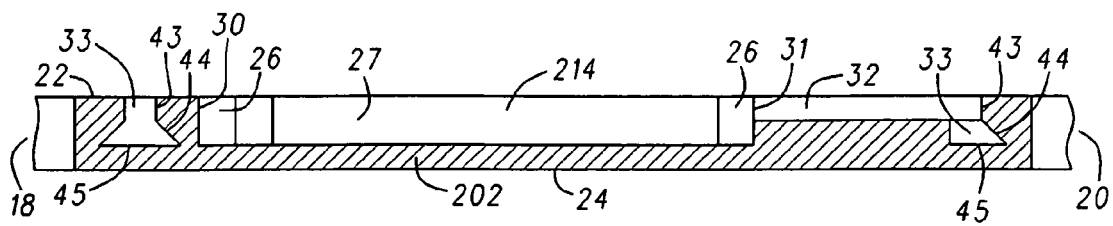
FIG. 26 is a cross-sectional view of the flange of FIG. 23 taken along section line 26-26 of FIG. 23 in accordance with one or more embodiments.

FIG. 26 is a cross-sectional view of flange 202 taken along section line 26-26 of FIG. 23. FIG. 26 further illustrates slot 26 and channel 32 extending from end 31 of slot 26 to mold lock feature 33. End 31 of slot 26 is indicated by a vertically oriented line. Mold lock feature 33 comprises an opening extending into flange 12 from top surface 22. Portions 43 of the sidewalls of mold lock feature 33 are at the beginning of the opening of mold lock feature 33 and are substantially perpendicular to top surface 22. Portions 44 of the sidewalls of mold lock feature 33 are located at an interior of flange 12 and form an angle that is oblique with respect to top surface 22 such that floor 45 of mold lock feature 33 has a greater width than the portion of the opening near top surface 22. In some embodiments, channel 32 extends to mold lock feature 33. In some embodiments, channel 32 extends from slot 26 but stops short of mold lock feature 33 as shown and described with reference to FIG. 4.

Figure 27:
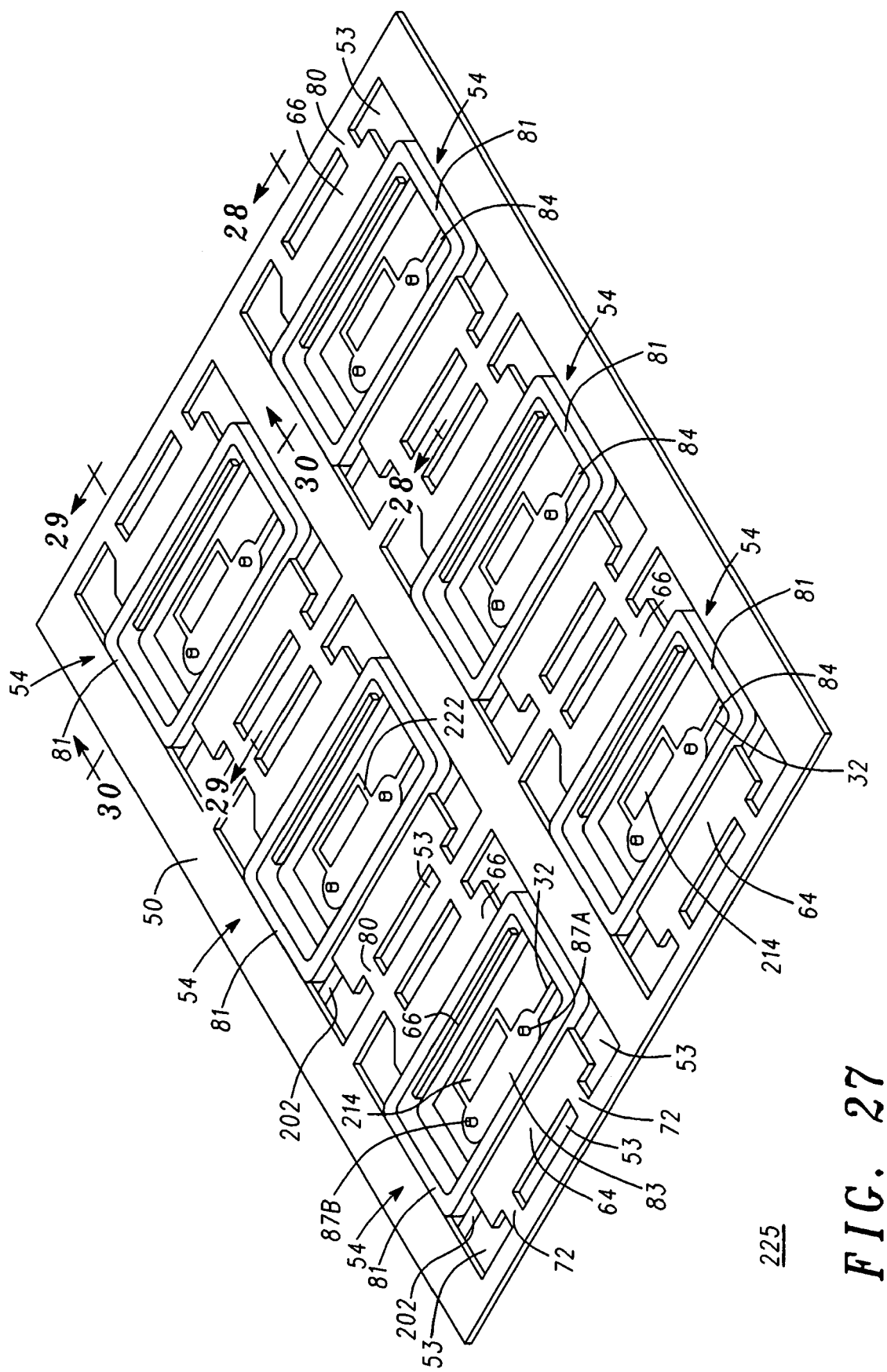
FIG. 27 is an isometric view of a leadframe assembly in accordance with one or more embodiments.

FIG. 27 is an isometric view of a plurality of flanges 202 coupled to a leadframe 50 by a dielectric material to form a leadframe assembly 225. In some embodiments leadframe 50 and flanges 202 are placed in a mold die and a dielectric material is injected into the mold die using an injection molding process to form portions 83, 84, 85, 86, and 222 of the dielectric structure that couple flanges 202 to leadframe 50. Portion 222 fills trench 206 including legs 208 and 210 as shown in FIG. 23. Portions 85 and 86 of the dielectric material are collectively referred to as dielectric rings 81. In addition, portions of the dielectric material form alignment features 87A and 87B as described with reference to FIG. 6. Portion 85 of the dielectric material fills mold locking features 33 to help leadframe 50 adhere to flanges 202. Suitable materials for the dielectric material include a mold compound such as, for example liquid crystal polymer, ceramic, polyimide, or glass.

Portion 85 of dielectric rings 81 are formed on the top and bottom surfaces of leadframe 50 such that it is over surface 22 of flange 202 and under portions of gate leads 64 and drain leads 66. Portion 86 of dielectric rings 81 are formed over portions of gate leads 64 and drain leads 66 and over portion 85 of dielectric rings 81. It should be noted that the positioning of portions 85 and 86 are more clearly shown in FIG. 28. After individual packaged semiconductor components 200 as shown in FIG. 36 are singulated from leadframe 50, dielectric rings 81 electrically isolate gate leads 64, drain leads 66, and flanges 12 from each other.

Figure 28:
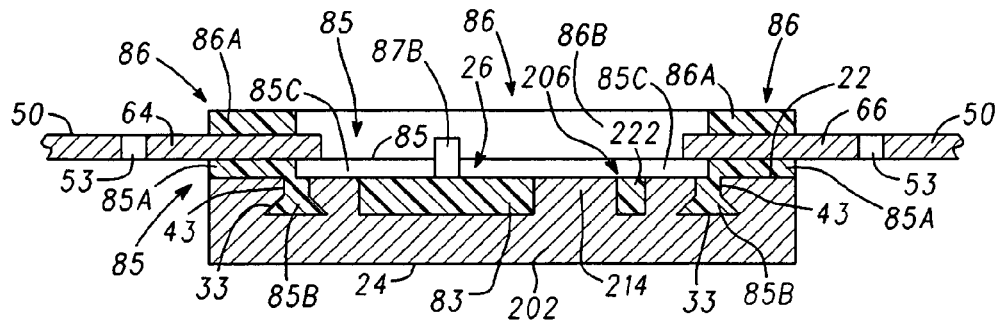
FIG. 28 is a cross-sectional view of the leadframe assembly of FIG. 27 taken along section line 28-28 of FIG. 27 in accordance with one or more embodiments.
Figure 30:
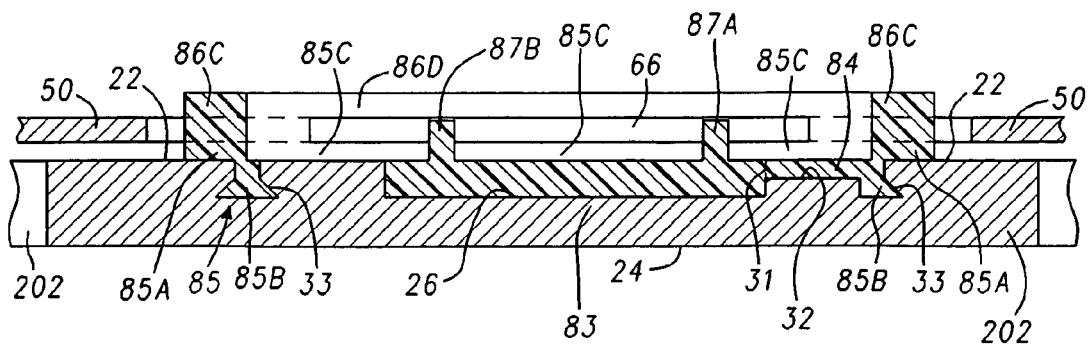
FIG. 30 is a cross-sectional view of the leadframe assembly of FIG. 27 taken along section line 30-30 of FIG. 27 in accordance with one or more embodiments.

FIG. 28 is a cross-sectional view taken along section line 28-28 of FIG. 27. FIG. 28 further illustrates coupling flanges 202 to leadframe 50. More particularly, FIG. 28 illustrates flange 202 having surfaces 22 and 24, slot 26, and mold lock feature 33 coupled to leadframe 50 by portions 83, 85, 86, and 222 of the dielectric material. It should be noted that portion 85 is comprised of sub-portions 85A, 85B, and 85C, and portion 86 is comprised of sub-portions 86A, 86B, 86C, and 86D wherein sub-portions 86C and 86D are shown in FIG. 30. Portions 83 and 222, sub-portions 85A, 85B of portion 85 of the dielectric material, and sub-portions 86A of portion 86 of the dielectric material are cross-sectional views, whereas sub-portions 85C are side views of portion 85 of the dielectric material and sub-portion 86B is a side view of portion 86 of the dielectric material. In addition, FIG. 28 illustrates a cross-sectional view of gate lead 64 and drain lead 66 and a side view of alignment feature 87B.

Figure 29:
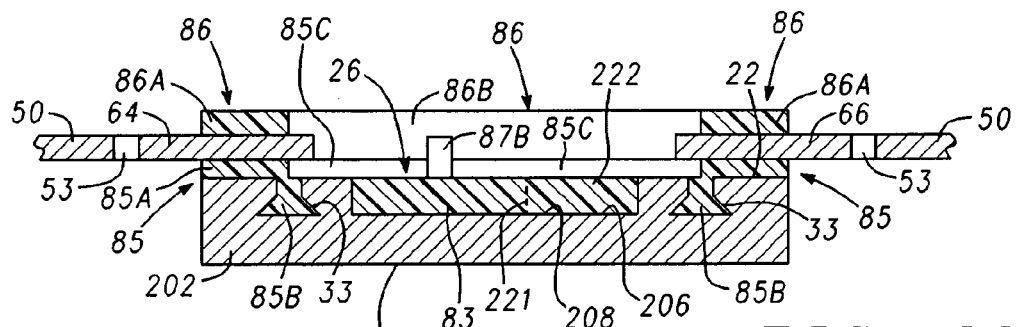
FIG. 29 is a cross-sectional view of the leadframe assembly of FIG. 27 taken along section line 29-29 of FIG. 27 in accordance with one or more embodiments.

FIG. 29 is a cross-sectional view taken along section line 29-29 of FIG. 27. FIG. 29 further illustrates the coupling of flanges 202 to leadframe 50. More particularly, FIG. 29 illustrates flange 202 having surfaces 22 and 24, slot 26, and mold lock feature 33 coupled to leadframe 50 by portions 83, 84, 85, 86, and 222 of the dielectric material. It should be noted that portions 83 and 222 and sub-portions 85A, 85B, and 86A of the dielectric material are cross-sectional views, whereas sub-portions 85C is a side view of portion 85 of the dielectric material and sub-portion 86B is a side view of portion 86 of the dielectric material. It should be further noted that a vertically oriented broken line 221 is included in FIG. 29 to show the boundaries between portions 83 and 222 of the dielectric material. In addition, FIG. 29 illustrates cross-sectional views of gate lead 64, and drain lead 66, and a side view of alignment feature 87B.

FIG. 30 is a cross-sectional view taken along section line 30-30 of FIG. 27. FIG. 30 shows flange 202 having surfaces 22 and 24, slot 26, channel 32, and mold lock feature 33 coupled to leadframe 50 by portions 83 and 84, and sub-portions 85A, 85B, 85C, 86C, and 86D of the dielectric material. It should be noted that sub-portions 85A and 85B are cross-sectional views and sub-portions 85C are side views of portion 85 of the dielectric material and that sub-portions 86C are cross-sectional views and sub-portion 86D is a side view of portion 86 of the dielectric material. In addition, FIG. 30 illustrates cross-sectional views of alignment features 87A and 87B and a side view of drain lead 66. For the sake of clarity, FIG. 30 includes a vertically oriented line to show the location of end 31 of slot 26 and a horizontally oriented broken line to show sub-portions 85A and 86C, i.e., portions 85 and 86.

Figure 31:
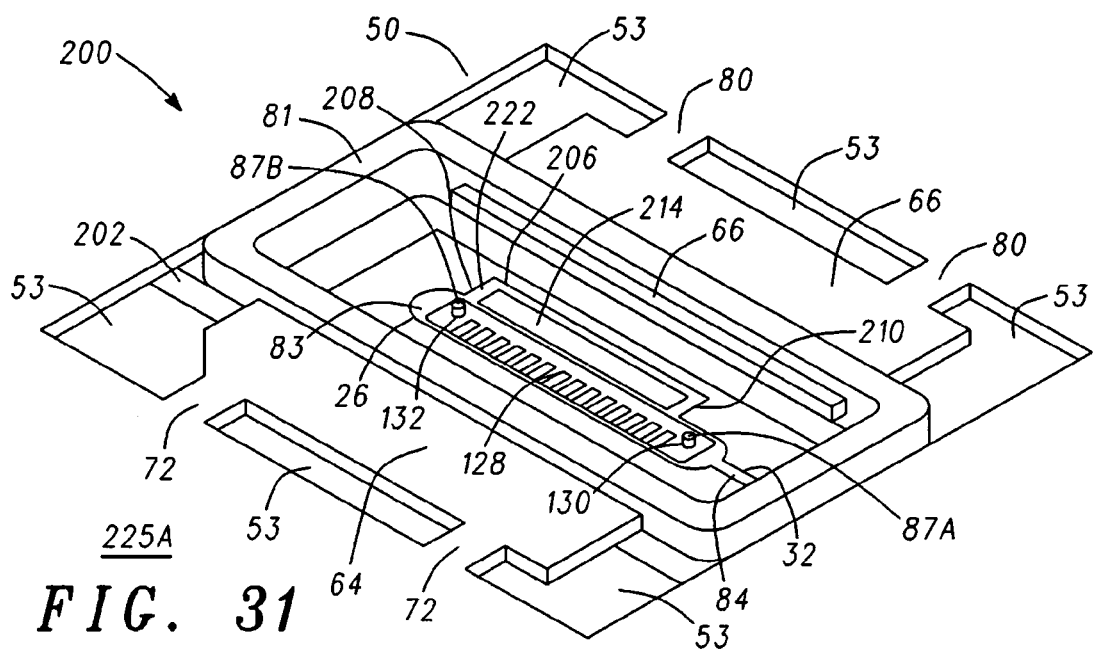
FIG. 31 is an expanded isometric view of the leadframe assembly of FIG. 27 in accordance with one or more embodiments.

FIG. 31 is an expanded isometric view of a single assembly 225A of leadframe assembly 225 having an interposer 116 mounted to portion 83 of the dielectric material in slot 26. More particularly, alignment holes 130 and 132 of interposers 116 are aligned to alignment features 87B and 87A, respectively, of the dielectric material in each slot 26. Interposers 116 are placed on portion 83 of the dielectric material in each slot 26 such that alignment features 87B and 87A extend through openings 132 and 130, respectively. Alignment features 87A and 87B are melted to attach interposer 116 to portion 83 of the dielectric material.

Figure 32:
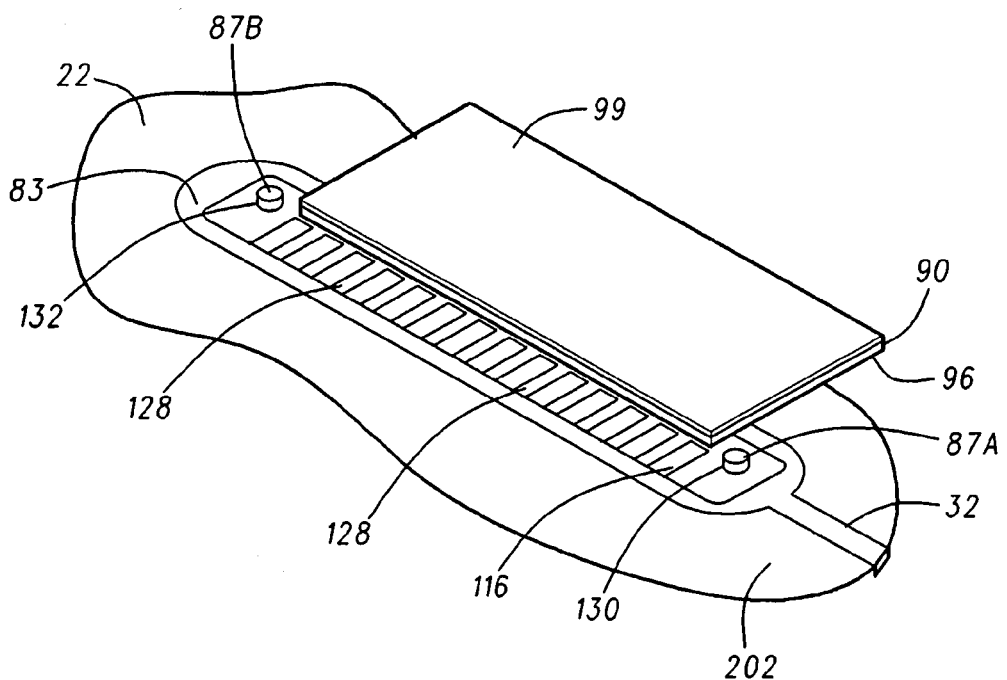
FIG. 32 is an isometric view of the single semiconductor die, interposer, and flange of FIG. 31 further along in manufacture in accordance with one or more embodiments.

FIG. 32 is an isometric view of semiconductor die 90 bonded to interposer 116 and to flange 202. More particularly, semiconductor die 90 is flipped so that gate bumps 104 as shown in FIG. 17 contact support portion 118 of interposer 116 and so that source bumps 106 as shown in FIG. 17 contact surface 22 of flange 202.

Gate bumps 104 and source bumps 106 may be respectively attached to support portion 118 of interposer 116 and to portion 114 of flange 202 using eutectic bonding. For example, a die bonder (not shown) may be used to pick up a semiconductor die 90 and place it on interposer 116 and flange 202 so that gate bumps 104 contact support portion 118 of interposer 116 and so that source bumps 106 contact portion 114 of flange 202. Then, heat and pressure, and optionally ultrasonic energy, may be applied to form the eutectic bond at the points where gate bumps 104 contact support portion 118 of interposer 116 and at the points where source bumps 106 contact portion 114 of flange 202.

In embodiments wherein bumps 104 and 106 comprise a gold bump having a tin cap layer (not shown), the heat and pressure used to bond semiconductor die 90 to flange 202 and interposer 116 may cause the gold and tin to diffuse together to form an alloy composition of, for example, 80% gold (Au) and 20% tin (Sn) at the upper portions of bumps 104 and 106 that may be used to bond bumps 104 and 106 to interposer 116 and flange 202, respectively. As an example, a temperature of about 280° C. to about 320° C. is applied to flange 202 and semiconductor die 90 for a time period ranging from about 20 seconds to about 40 seconds.

Although the scope of the claimed subject matter is not limited in this respect, in some embodiments, flange 202 may comprise copper and may be gold-plated with about 30 microinches (about 0.762 microns) of gold. During the eutectic bonding process, some of the gold from the gold plating of flange 202 may be consumed during the bonding process to form the eutectic bond.

Figure 33:
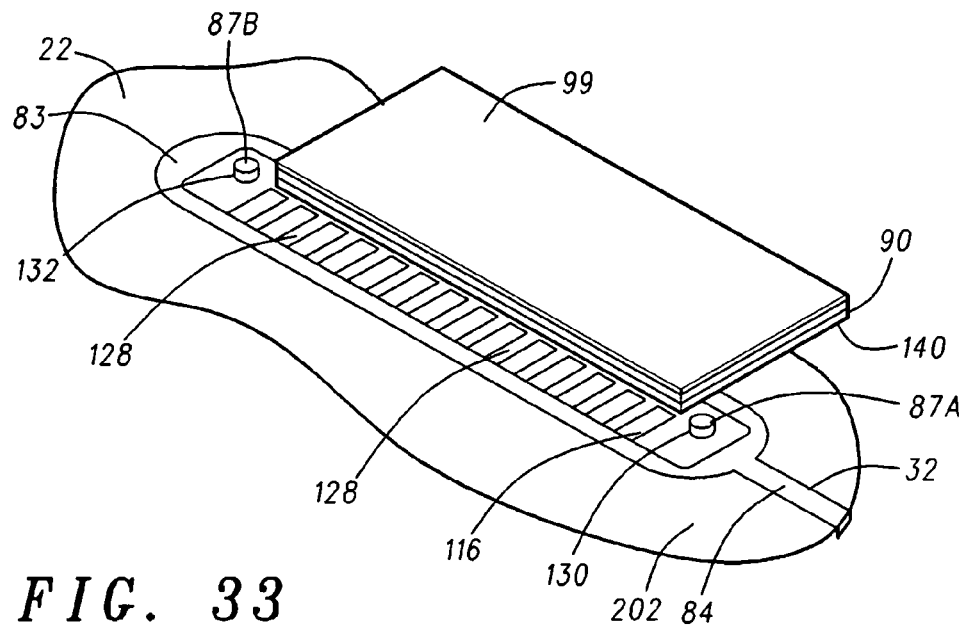
FIG. 33 is an isometric view of the single semiconductor die, interposer, and flange of FIG. 32 further along in manufacture in accordance with one or more embodiments.

Referring now to FIG. 33, an underfill material 140 may be dispensed between semiconductor die 90 and interposer 116 and between semiconductor die 90 and flange 202 and then cured. By way of example, underfill material 140 is polyimide. As is discussed below, including underfill material 140 in the spaces between flange 202 and semiconductor die 90 may increase the breakdown voltage of the transistors formed in semiconductor die 90. Underfill material 140 may also be used for mechanical integrity to distribute mechanical stresses more uniformly in wafer bumps 104 and 106. As may be appreciated, the type of underfill dielectric material selected may alter drain-to-gate and drain-to-source capacitance depending on the dielectric constant of the underfill dielectric material.

Figure 34:
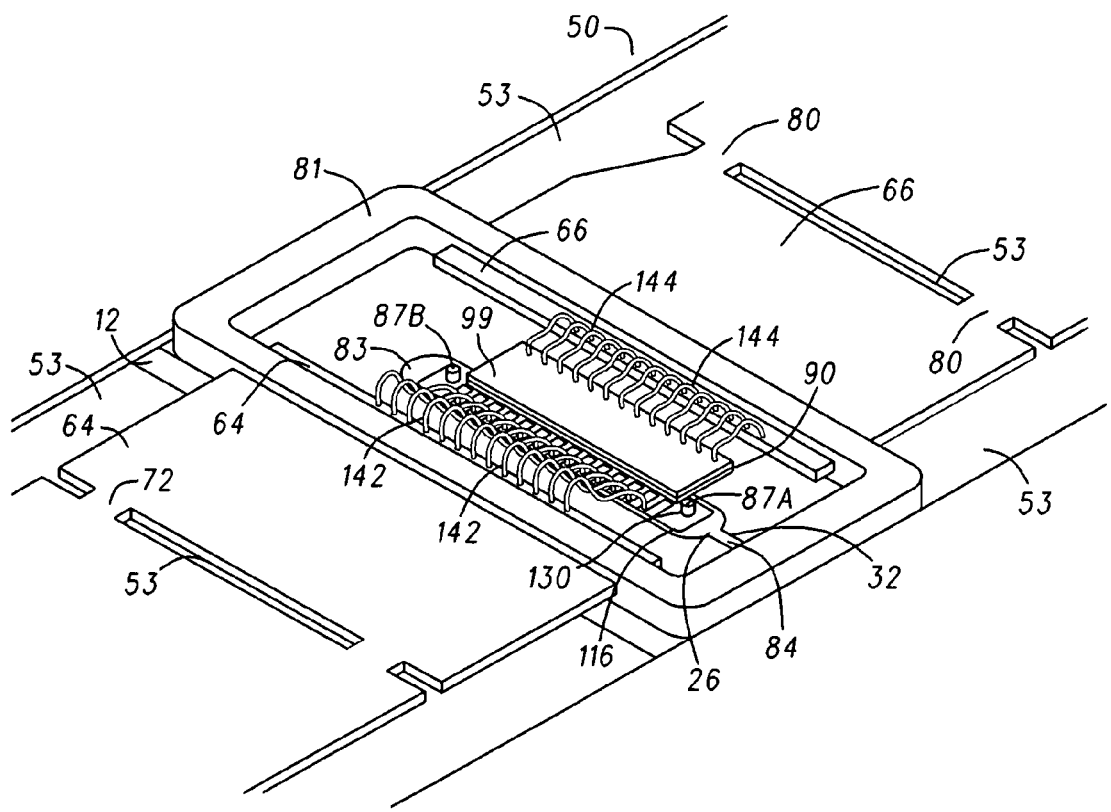
FIG. 34 is an isometric view of the single semiconductor die, interposer, and flange of FIG. 33 further along in manufacture in accordance with one or more embodiments.

Referring now to FIG. 34, wirebonds 142 are formed that couple gate interconnect pads 128 to gate leads 64 and wirebonds 144 are formed that couple drain terminal 146 of semiconductor die 90 to drain leads 66. Wirebonds 142 and 144 may have a diameter ranging from about 25 microns to about 50 microns and are also referred to as bonding wires or bond wires. Suitable materials for wirebonds 142 and 144 include gold, copper, or aluminum. In alternate embodiments, rather than using wirebonds 142 and 144, a metal clip (not shown) may be used to couple gate lead 64 of each semiconductor component 200 to gate interconnect pads 128 and another metal clip (not shown) may be used to couple drain terminal 99 to drain lead 66 of each semiconductor component 200. It should be noted that not using wire bonds may reduce parasitic inductance in semiconductor component 10.

Figure 35:
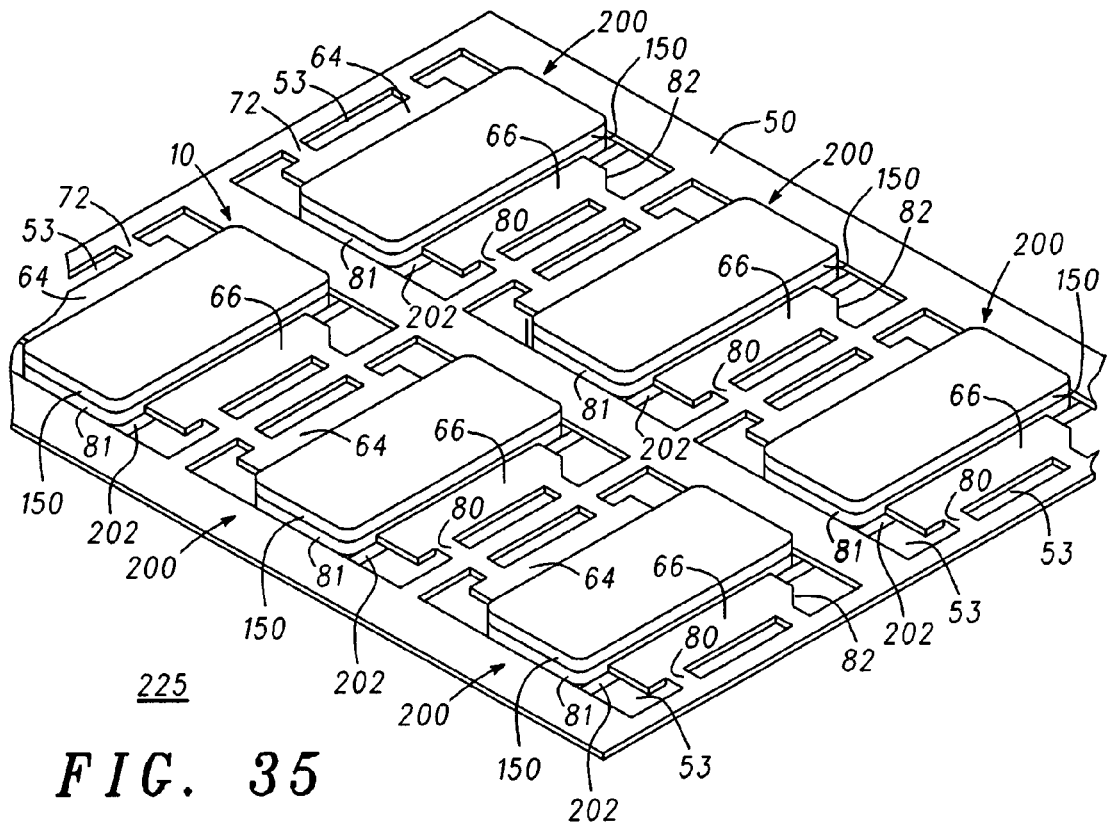
FIG. 35 is an isometric view of a plurality of semiconductor components of FIG. 34 at a later stage of manufacture in accordance with one or more embodiments.

Referring now to FIG. 35, lids 150 comprising a dielectric material such as, for example, ceramic or plastic, are attached to dielectric rings 81 using for example, an epoxy, thereby forming a plurality of non-singulated semiconductor components 200. Alternatively, lids 150 may comprise a liquid crystal polymer that is ultrasonically bonded or fused to dielectric rings 81 that also comprise liquid crystal polymer.

Referring now to FIG. 36, individual packaged semiconductor components 200 are singulated from leadframe assembly 225 as shown in FIG. 35 that include a plurality of non-singulated semiconductor components. As may be appreciated, tabs 80 and 72 as shown in FIG. 35 are cut to singulate the plurality of semiconductor components 200. Techniques for singulating semiconductor components from leadframes are known to those skilled in the art.

A portion of gate lead 64 is partially exposed external to semiconductor component 200 to provide electrical coupling of a bias signal such as, for example, a voltage ranging from about one volt to about four volts, from an external source (not shown) to gate bond pads 100 as shown in FIG. 17 of semiconductor die 90 via gate lead wirebonds 142 as shown in FIG. 34, gate interconnect pads 128 as shown in FIG. 18, and gate bumps 104 as shown in FIG. 17. A portion of drain lead 66 is partially exposed external to semiconductor component 200 to provide electrical coupling of a bias signal such as, for example, a voltage ranging from about 20 volts to about 100 volts, from an external source (not shown) to drain terminal 99 of semiconductor die 90 via drain lead 66 and wirebonds 144 as shown in FIG. 34. Flange 202 is partially exposed external to semiconductor component 200 to provide electrical coupling of a bias signal such as, for example, ground, to source bond pads 102 as shown in FIG. 17 of semiconductor die 90 via flange 202 and source bumps 106 as shown in FIG. 17. Flange 202 is also partially exposed to allow coupling of flange 202 to a thermally conductive material having a relatively low thermal resistance such as, for example, a metal heat sink (not shown) to provide a thermal path for removing heat generated by semiconductor die 90.

In the embodiment wherein semiconductor die 90 is a discrete power transistor, spacing flange 202 further away from the edges of semiconductor die 90 may accomplished to increase the breakdown voltage of semiconductor component 200. In some embodiments, flange 202 may be coupled to ground and drain terminal 99 of semiconductor die 90 may be coupled to a relatively high voltage or voltage potential ranging from, for example, at least about 20 volts (V) to over 100 V. During operation, electric field potentials may be concentrated at the edges of semiconductor die 90, and therefore, flange 202 may be positioned to be spaced apart at a predetermined distance from the edges of semiconductor die 90 to prevent arcing between semiconductor die 90 and flange 202. Arcing may adversely affect the breakdown voltage of the power transistor of semiconductor die 90. As was discussed above, wafer bumps 104 and 106 are formed to have a predetermined height ranging from about 25 µm to about 100 µm to provide the desired amount of spacing between semiconductor die 90 and flange 202 to support drain-to-source breakdown voltages (BVds) ranging from about 50 volts to about 200 volts. Further, forming dielectric underfill material such as, for example, underfill material 140 discussed with reference to FIG. 33, in the spaces between flange 12 and semiconductor die 90 may further increase the standoff and breakdown voltages of semiconductor die 90.

Figure 37:
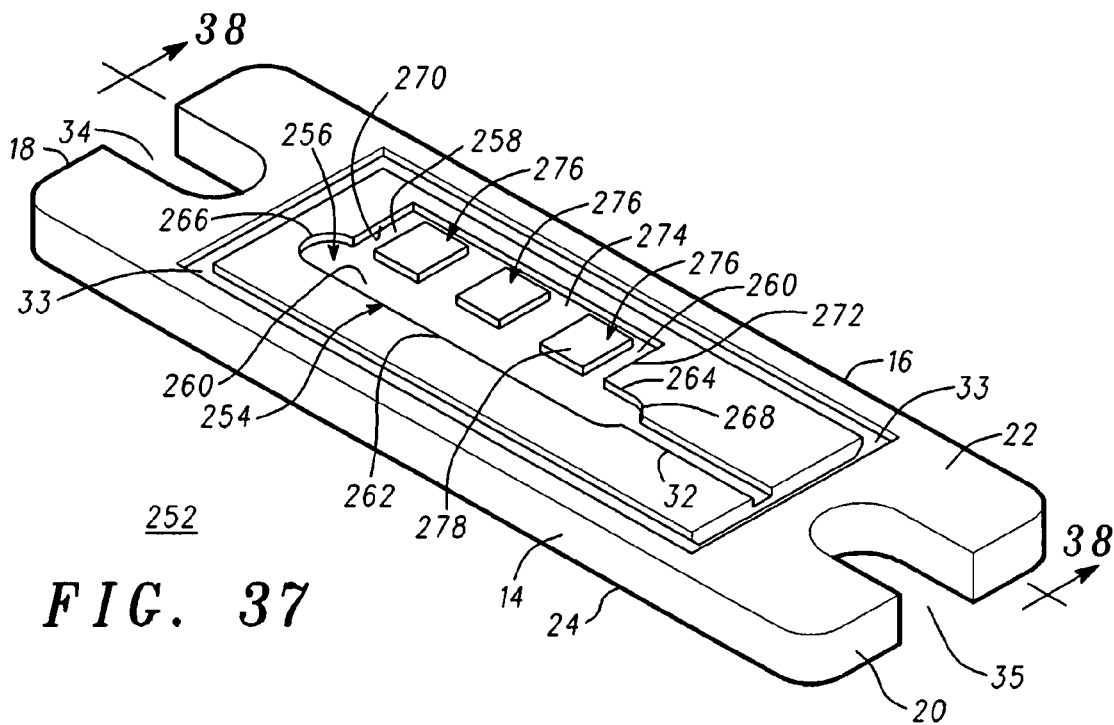
FIG. 37 is an isometric view of a flange used in the manufacture of a semiconductor component in accordance with one or more embodiments.
Figure 50:
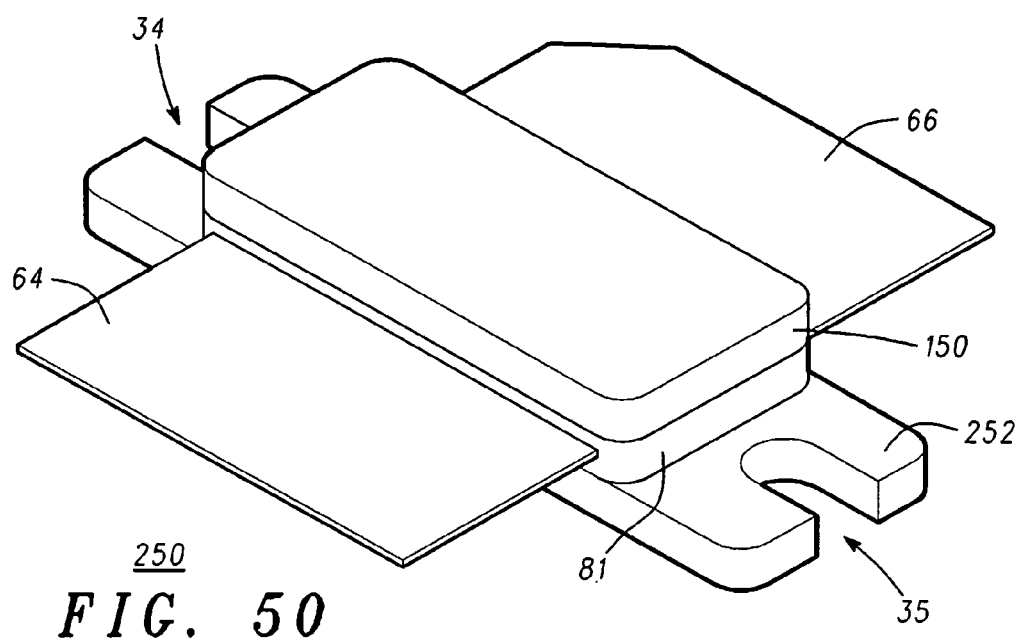
FIG. 50 is an isometric view of a semiconductor component of the plurality of semiconductor components of FIG. 49 at a later stage of manufacture in accordance with one or more embodiments.

FIG. 37 is an isometric view of a heatsink or flange 252 used in manufacturing a semiconductor component 250 as shown in FIG. 50 in accordance with another embodiment. Like flanges 12, 12A, and 202, flange 252 may also be referred to as a heat spreader, and has opposing sides 14 and 16 that are parallel to or substantially parallel to each other, opposing sides 18 and 20 that are parallel to or substantially parallel to each other, and opposing surfaces 22 and 24 that are parallel to or substantially parallel to each other. Arrows are used in some of the figures to denote recesses, openings, voids, slots, cavities, and notches, and arrows are also used in some of the figures to denote surfaces or sides that are not visible in isometric views.

Like flanges 12, 12A, and 202, surface 22 may be referred to as a top surface and surface 24 may be referred to as a bottom surface. In some embodiments, flange 252 is made from a material that is thermally and electrically conductive and has a CTE that matches, or substantially matches, the CTE of silicon. The dimensions of flange 252 and examples of suitable materials for flange 252 may be the same as those for flange 12.

Like flanges 12, 12A, and 202, surface 22 of flange 252 may be referred to as a top surface and surface 24 may be referred to as a bottom surface. In some embodiments, flange 252 is made from a material that is thermally and electrically conductive and has a CTE that matches, or substantially matches, the CTE of silicon or ceramic. The dimensions of flange 252 may be the same as those for flange 12 and examples of suitable materials for flange 252 may be the same as for flange 12.

Flange 252 has a recess 254 that extends from top surface 22 into the body of flange 252. Recess 254 has a slot portion 256, a slot extension 258 that extends from slot portion 256 towards side 16, and a floor 260 that is common to slot portion 256 and slot extension 258. Slot portion 256 has sidewalls 262 and 264 and opposing ends 266 and 268. Slot extension 258 has sidewalls 270 and 272 that are parallel to or substantially parallel to each other and a sidewall 274 that is parallel to or substantially parallel to sidewall 262.

Figure 45:
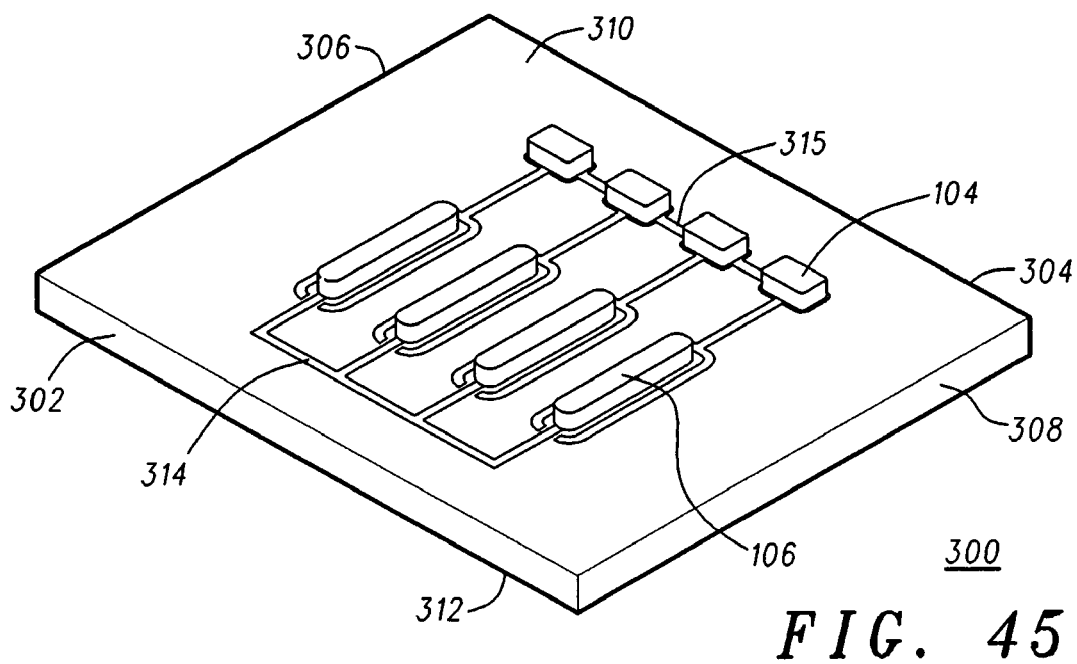
FIG. 45 is an isometric view of the semiconductor die of FIG. 44 at a later stage of manufacture in accordance with one or more embodiments.

A plurality of contacts 276 extend from floor 260 upward in the direction of surface 22. Contacts 276 have surfaces 278 that were portions of top surface 22 before the formation of recess 254. Formation of slot extension 258 leaves contacts 276 between slot portion 256 and sidewalls 270, 272, and 274. Contacts 276 are the portions of flange 252 where source bumps 106 of semiconductor die 300 as shown in FIG. 45 will be attached. During operation, electric field potentials may be concentrated at the edges of semiconductor die 300, which lowers the breakdown voltage of semiconductor component 250. Contacts 276 space floor 260 of flange 252 apart from the edges of a semiconductor die such as, for example, semiconductor die 300, which increases the standoff voltage of semiconductor die 300 resulting in an increased breakdown voltage. In addition, flange 252 may be positioned to be spaced apart at a predetermined distance from the edges of semiconductor die 300 to prevent arcing between semiconductor die 300 and flange 252. Arcing may adversely affect the breakdown voltage of the power transistor of semiconductor die 300. As was discussed above, wafer bumps 104 and 106 are formed to have a predetermined height ranging from about 25 μm to about 100 μm to provide the desired amount of spacing between semiconductor die 300 and flange 252 to support drain-to-source breakdown voltages (BVds) ranging from about 50 volts to about 200 volts.

Flange 252 also has a channel 32 extending from end 268 of slot portions 256 to a mold lock feature 33 having sidewalls 43 and 44 and a floor 45. Mold lock feature 33 comprises an opening extending into flange 252 from top surface 22. Portions 43 of the sidewalls of mold lock feature 33 are at the beginning of the opening of mold lock feature 33 and are substantially perpendicular to top surface 22. Portions 44 of the sidewalls of mold lock feature 33 are located at an interior of flange 252 and form an angle that is oblique with respect to top surface 22 such that floor 45 of mold lock feature 33 has a greater width than the portion of the opening near top surface 22. It should be noted that the configuration of mold lock feature 33 is not a limitation of the claimed subject matter. Alternatively, one or more trenches that are parallel to a longitudinal axis of recess 254 may be formed in flange 252, one or more trenches that are perpendicular to the longitudinal axis of recess 254 may be formed in flange 252, combinations of trenches may be formed in flange 252, or the like.

Like slot 26, recess 254, channel 32, and mold lock feature 33 may be formed by milling, etching, grinding, stamping, or the like. In some embodiments, channel 32 extends from end 268 of slot portion 256 to mold lock feature 33. In some embodiments, channel 32 extends from end 268 of slot portion 256 but stops short of mold lock feature 33 as shown and described with reference to FIG. 4. Slot 26, recess 254, channel 32, and mold lock feature 33 may be formed simultaneously during the same processing step or during different processing steps.

Notches 34 and 35 extend inward from sides 18 and 20, respectively, into flange 252 and are typically used for securing semiconductor component 250 to another structure using a fastening means. By way of example, the other structure may be a printed circuit board (PCB), a heat sink, or the like and the fastener means may be a screw, bolt, or the like. Notches 34 and 35 are optional, as other means may be used to secure flange 252 to other structures.

Figure 38:
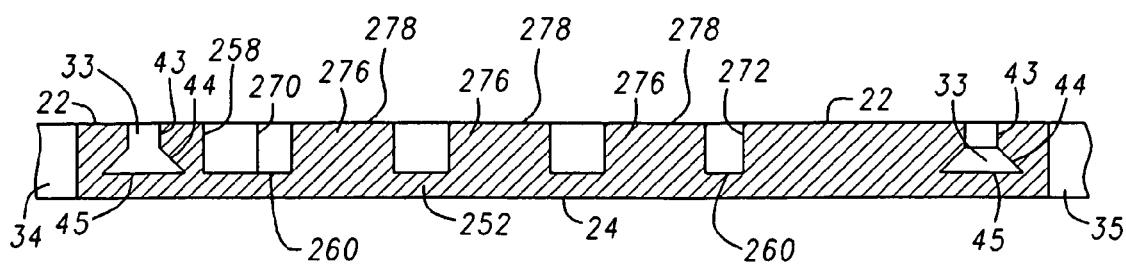
FIG. 38 is a cross-sectional view of the flange of FIG. 37 taken along section line 38-38 of FIG. 37 in accordance with one or more embodiments.

FIG. 38 is a cross-sectional view of flange 252 taken along section line 38-38 of FIG. 37. FIG. 38 further illustrates slot extension 258, contacts 276, floor 260, and surfaces 22, 24, and 278, ends 34 and 35, and mold lock feature 33 having sidewall portions 43 and 44 and floor 45.

Figure 39:
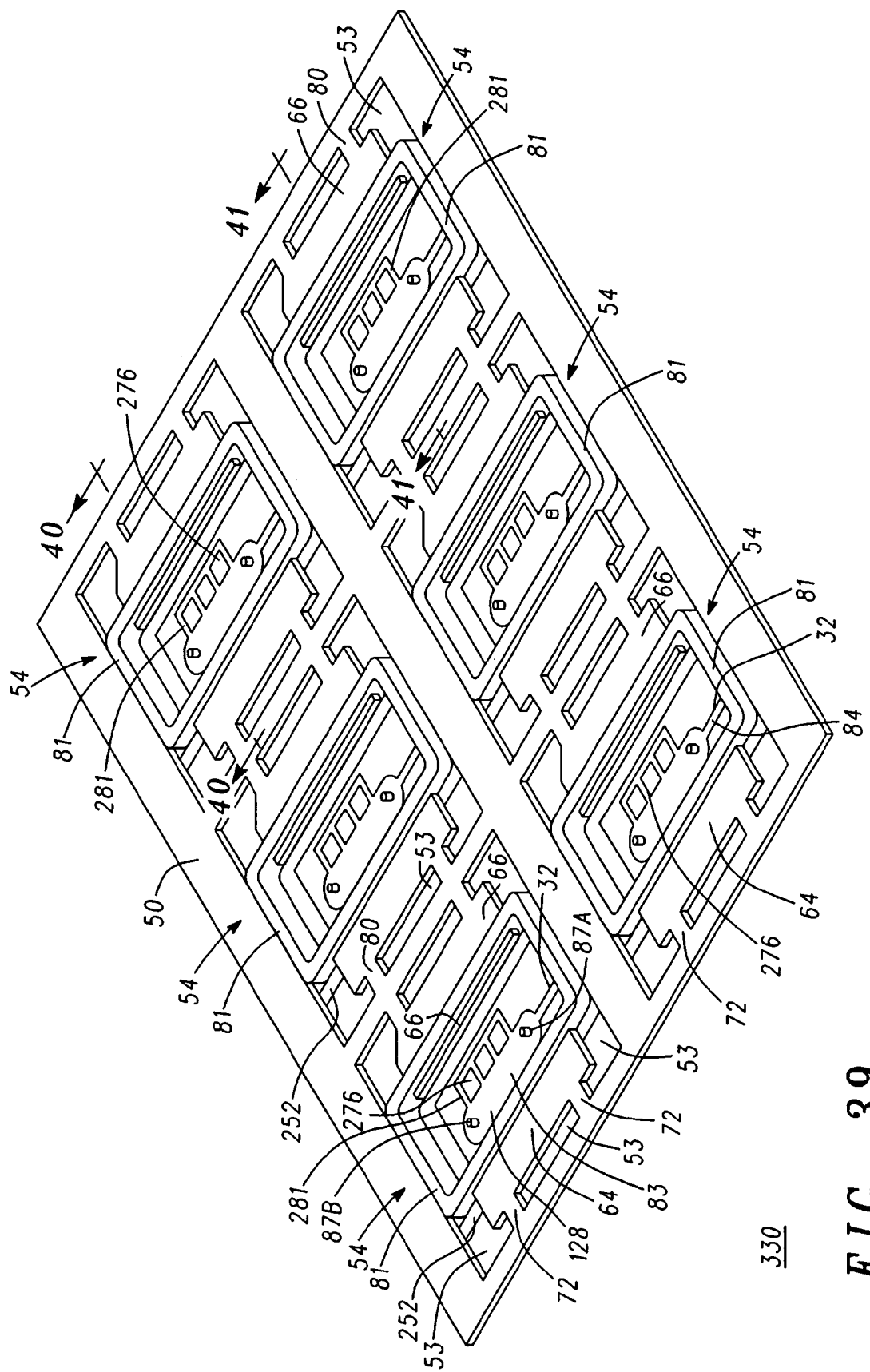
FIG. 39 is an isometric view of a leadframe assembly in accordance with one or more embodiments.
Figure 40:
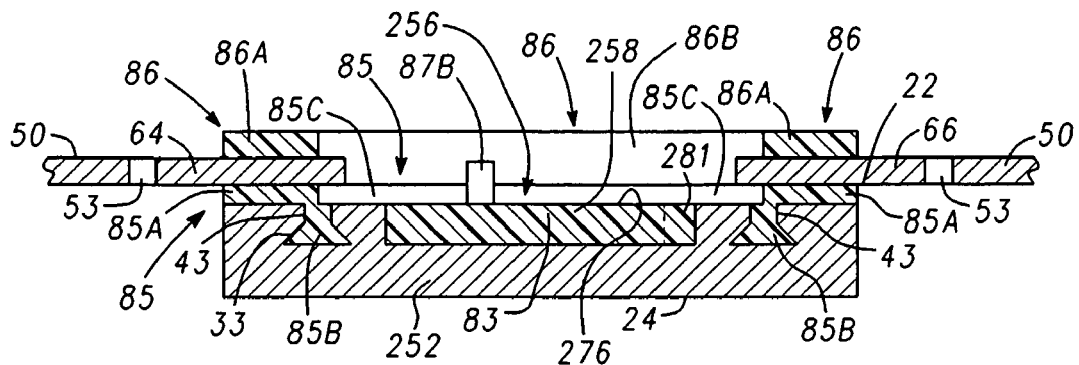
FIG. 40 is a cross-sectional view of the leadframe assembly of FIG. 39 taken along section line 40-40 of FIG. 39 in accordance with one or more embodiments.
Figure 41:
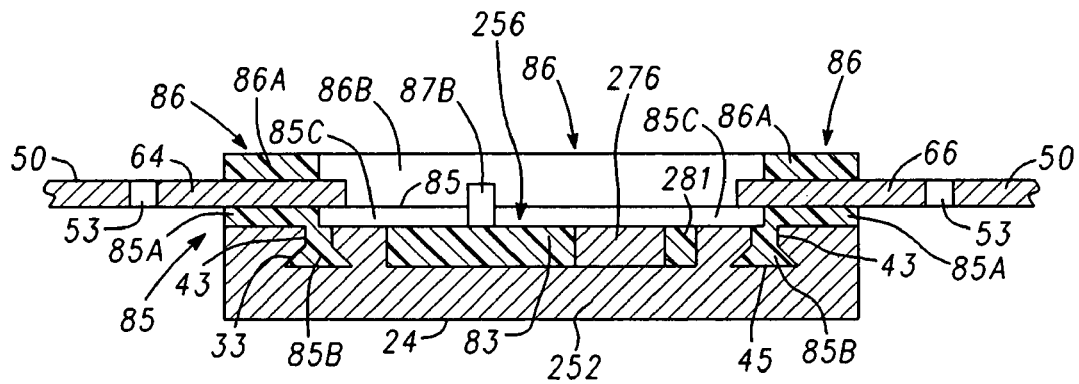
FIG. 41 is a cross-sectional view of the leadframe assembly of FIG. 39 taken along section line 41-41 of FIG. 39 in accordance with one or more embodiments.

FIG. 39 is an isometric view of a plurality of flanges 252 coupled to a leadframe 50 by a dielectric material to form a leadframe assembly 330. In some embodiments leadframe 50 and flanges 252 are placed in a mold die and a dielectric material is injected into the mold die using an injection molding process to form portions 83, 85, 86, and 281 of the dielectric structure that couple flanges 252 to leadframe 50 as shown in FIGS. 40 and 41. Portion 281 fills the portions of slot extension 258 that are between contacts 276 and the portions of slot extension 258 that are between contacts 276 and sidewalls 270, between contacts 276 and sidewalls 272, and between contacts 276 and sidewalls 274. Briefly referring to FIGS. 40-41, it should be noted that portion 85 is comprised of sub-portions 85A, 85B, and 85C, and portion 86 is comprised of sub-portion 86A and 86B. Portions 83 and 281 and sub-portions 85A and 85B of portion 85 of the dielectric material, and sub-portion 86A of portion 86 of the dielectric material are cross-sectional views, whereas sub-portions 85C are side views of portion 85 of the dielectric material and sub-portion 86B is a side view of portion 86 of the dielectric material. Portions 85 and 86 of the dielectric material are collectively referred to as dielectric rings 81. In addition, portions of the dielectric material form alignment features 87A and 87B as described with reference to FIG. 6. Portion 85 of the dielectric material fills mold locking features 33 to help it adhere to flanges 252. Suitable materials for the dielectric material include a mold compound such as, for example liquid crystal polymer, ceramic, polyimide, or glass.

Portion 85 of dielectric rings 81 are formed on the top and bottom surfaces of leadframe 50 such that it is over surface 22 of flange 252 and under portions of gate leads 64 and drain leads 66. Portion 86 of dielectric rings 81 are formed over portions of gate leads 64 and drain leads 66 and portion 86 is formed over portion 85 of dielectric rings 81. After individual packaged semiconductor components 250 (shown in FIG. 50) are singulated from leadframe 50, dielectric rings 81 electrically isolate gate leads 64, drain leads 66, and flanges 252 from each other.

FIG. 40 is a cross-sectional view taken along section line 40-40 of FIG. 39. FIG. 40 further illustrates the coupling of flanges 252 to leadframe 50. More particularly, FIG. 40 illustrates flange 252 having surfaces 22 and 24, slot portion 256, and mold lock feature 33 coupled to leadframe 50 by portions 83 and 281 and sub-portions 85A, 85B, 85C, 86A, and 86B of portions 85 and 86 of the dielectric material. In addition, FIG. 40 illustrates a cross-sectional view of gate lead 64 and drain lead 66 and a side view of alignment feature 87B.

FIG. 41 is a cross-sectional view taken along section line 41-41 of FIG. 39. FIG. 41 further illustrates the coupling of flanges 252 to leadframe 50. More particularly, FIG. 41 illustrates flange 252 having surfaces 22 and 24, slot portion 256, and mold lock feature 33 coupled to leadframe 50 by portions 83 and 281 and sub-portions 85A, 85B, 85C, 86A, and 86B of the dielectric material. It should be further noted that contact 276 is shown in FIG. 41 as a cross-sectional view, whereas contact 276 is hidden from view in FIG. 40. In addition, FIG. 41 illustrates cross-sectional views of gate lead 64, and drain lead 66 and side views of alignment feature 87B.

Figure 42:
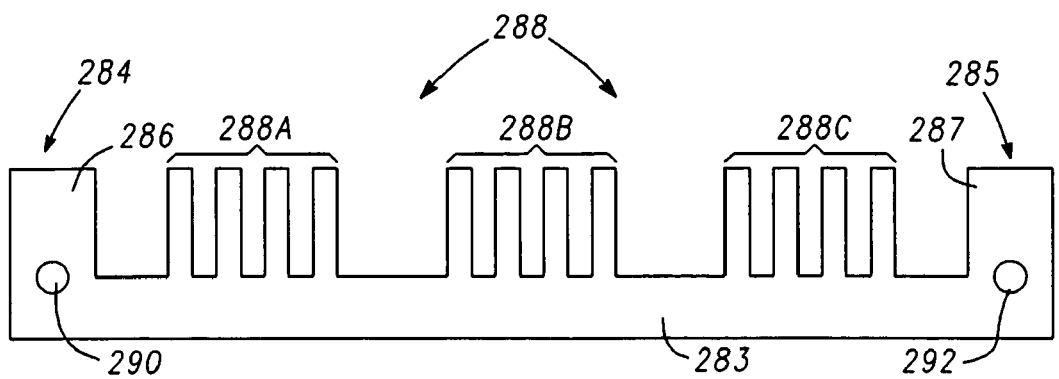
FIG. 42 is a top view of another interposer in accordance with one or more embodiments.

FIG. 42 is a top view of an interposer 282 suitable for use in manufacturing semiconductor component 250. Interposer 282 is a comb-like structure comprising a support portion or spine 283 having end regions 284 and 285, end extensions 286 and 287, and a plurality of central extensions 288. End extensions 286 and 287 extend from end regions 284 and 285, respectively, in a perpendicular or substantially perpendicular direction from the length of spine 283 and central extensions 288 extend in a perpendicular or substantially perpendicular direction from the length of spine 283. Central extensions 288 are between end extensions 286 and 287 and are referred to as gate interconnect pads, teeth, or fingers. In accordance with some embodiments, central extensions 288 are grouped as three sets 288A, 288B, and 288C of four extensions. The number of extensions, the number of sets of extensions, and the number of extensions per each set of extensions are not limitations of the claimed subject matter. Thus there can be more or fewer than three sets of extensions and more or fewer than four extensions per set of extensions. Holes 290 and 292 are formed in end regions 284 and 285, respectively. The dimensions of interposer 282 are not a limitation of the claimed subject matter.

Interposer 282 may be made by milling, stamping, grinding, etching, or the like. In some embodiments, interposer 282 is made from a material that is thermally and electrically conductive and has a CTE that matches, or substantially matches, the CTE of silicon. Examples of suitable materials for interposer 282 include copper, an alloy such as a copper alloy, a copper-tungsten alloy, or the like. The material for interposer 282 is not a limitation of the claimed subject matter. Thus, interposer 282 can be made from materials having CTEs that do not match that of silicon. In other embodiments, interposer 282 may comprise aluminum, gold, silver, or tantalum. Interposer 282 may be formed using a conductive leadframe structure and may be referred to as a conductive structure, a leadframe interposer, a leadframe structure, or a conductive leadframe structure.

Figure 43:
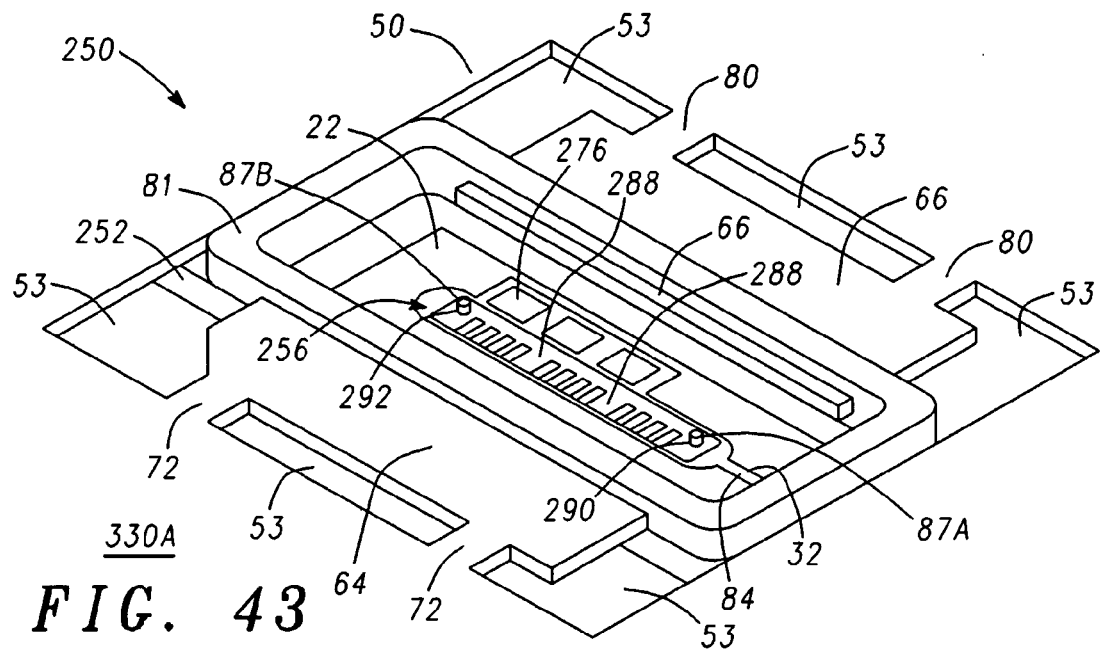
FIG. 43 is an expanded isometric view of a single assembly of a leadframe assembly in accordance with one or more embodiments.

FIG. 43 is an expanded isometric view of a single assembly 330A of leadframe assembly 330 having an interposer 282 mounted to portion 83 of the dielectric material in slot portion 256. More particularly, alignment holes 290 and 292 of interposer 282 are aligned to alignment features 87A and 87B, respectively, of slot portion 256 containing portion 83 of the dielectric material. Interposers 282 are placed on portion 83 of the dielectric material in each slot portion 256 such that alignment features 87A and 87B extend through openings 290 and 292, respectively. Alignment features 87A and 87B are melted to attach interposer 282 to portion 83 of the dielectric material.

Figure 44:
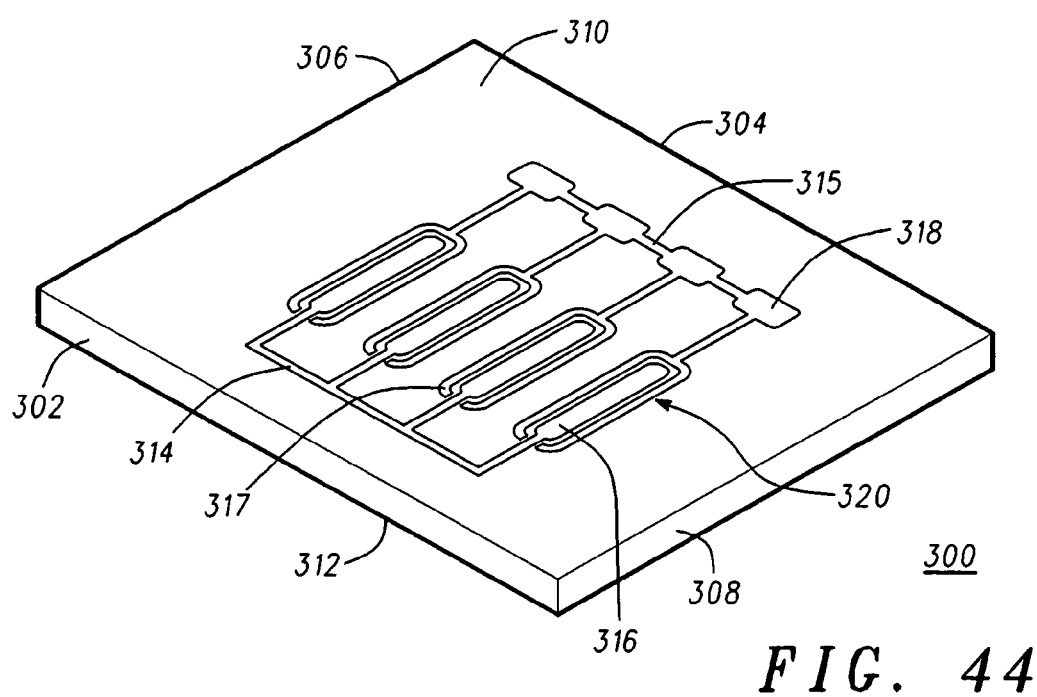
FIG. 44 is an isometric view of a semiconductor die in accordance with one or more embodiments.

Before describing the coupling of a semiconductor chip to interposer 282 and leadframe leads 64 and 66, an example of a suitable semiconductor chip for coupling to interposer 282 and leadframe leads 64 and 66 is provided. FIG. 44 is an isometric view of a semiconductor chip or die 300 having sides or edges 302 and 304 that are substantially parallel to each other, edges 306 and 308 that are parallel to or substantially parallel to each other, and a top surface 310 and a bottom surface 312 that are parallel to or substantially parallel to each other. Semiconductor die 300 may comprise a semiconductor material such as, for example, silicon (Si) or germanium, or a compound semiconductor material such as, for example, gallium arsenide (GaAs).

Although the scope of the claimed subject matter is not limited in this respect, in some embodiments, the length of semiconductor die 300, that is, the distance between edges 306 and 308 is about 1,270 micrometers (elm). The width of semiconductor die 300, that is, the distance between edges 302 and 304 is about 1,270 μm. The thickness of semiconductor die 300, that is, the distance between surfaces 310 and 312 ranges from about 125 μm to about 625 μm.

Semiconductor die 300 includes an electrical interconnect layer 314 and an electrical interconnect layer 315. Electrical interconnect layers 314 and 315 include electrical pads 316 and 318, respectively, and may be a metal layer comprising, for example, aluminum, copper, or gold. Electrical interconnect layer 315 includes extensions 317 that are spaced apart from source bond pads 316. Extensions 317 surround three sides of source bond pads 316 and are laterally adjacent to a fourth side of source bond pads 316.

In some embodiments, semiconductor die 300 is comprised of four or more transistor cell regions 320, wherein each transistor cell region 320 comprises a plurality of active devices such as, for example, transistors, although the methods and apparatuses described herein are not limited in this regard. In some embodiments, semiconductor die 300 is a discrete transistor such as a discrete power transistor, wherein each transistor cell region 320 comprises, for example, a plurality of vertical metal oxide semiconductor field effect transistors (MOSFETs) or vertical bipolar transistors (not shown). The transistors of the multiple transistor cell regions 320 are coupled to each other to function as a single transistor. In these embodiments, semiconductor component 250 may be referred to as a discrete semiconductor device, having an input lead 64, an output lead 66, and a common lead 252 (shown in FIG. 50). Leads 64, 66, and 252 may also be referred to as terminals, interconnects, or interconnections.

In the embodiments wherein semiconductor die 300 includes vertical MOSFETs (not shown), these vertical MOSFETs each have a source region (not shown), a drain region (not shown), and a gate (not shown). Electrical pads 316 may be coupled to the source regions of the vertical MOSFETs and may be referred to as source bond pads or source pads, source contacts, source terminals, source interconnects, or source interconnections. Further, source pads 316 are coupled together to function as a single source interconnect. Electrical pads 318 may be coupled to the gates of the vertical MOSFETs and may be referred to as gate bond pads, gate pads, gate contacts, gate terminals, gate interconnects, or gate interconnections. Further, gate pads 318 are coupled together to function as a single gate interconnect. In addition, semiconductor die 300 includes a drain interconnect or terminal 322 (shown in FIG. 46) over surface 312 of semiconductor die 300, wherein the drain interconnect 322 is coupled to the drain regions of the vertical MOSFETs.

The vertical MOSFET is vertical in that the source pads 316 and drain terminal 322 are at or adjacent opposite surfaces of semiconductor die 300. The gate pads 318 are formed at the same surface 310 of semiconductor die 300 as the source pads 316. During operation, the electrical current flow from source pads 316 to drain terminal 322 in the discrete vertical power transistor may be substantially perpendicular to surfaces 310 and 312 of semiconductor die 300. In other words, current flows essentially vertically through the vertical MOSFET from source pads 316 located adjacent one surface 310 of semiconductor die 300 to drain interconnect 322 located adjacent opposing surface 312 of semiconductor die 300. In other embodiments, the transistors in semiconductor die 300 may be vertical bipolar transistors such as IGBTs. In such embodiments, one side of semiconductor die 300 may have an emitter region and a base region and the other side of the die may have a collector region.

Although semiconductor die 300 is described as including vertical transistors in some embodiments, this is not a limitation of the claimed subject matter. In alternate embodiments, semiconductor die 300 may include lateral transistor structures such as, for example, an LDMOS transistor structure. In an LDMOS power transistor, the gate, the source region, and the drain region are located adjacent the same surface of a semiconductor die and electrical current flows laterally through the transistor between the source and drain regions of the LDMOS power transistor.

FIG. 45 is an isometric view of semiconductor die 300 at a later stage of manufacturing. For purposes of clarity, a passivation layer is not shown in FIG. 45 to illustrate the formation of wafer bumps 104 and 106. Gate bumps 104 are formed contacting gate bond pads 318 and source bumps 106 are formed contacting source bond pads 316. Gate bumps 104 and source bumps 106 have been described with reference to FIG. 17.

Figure 46:
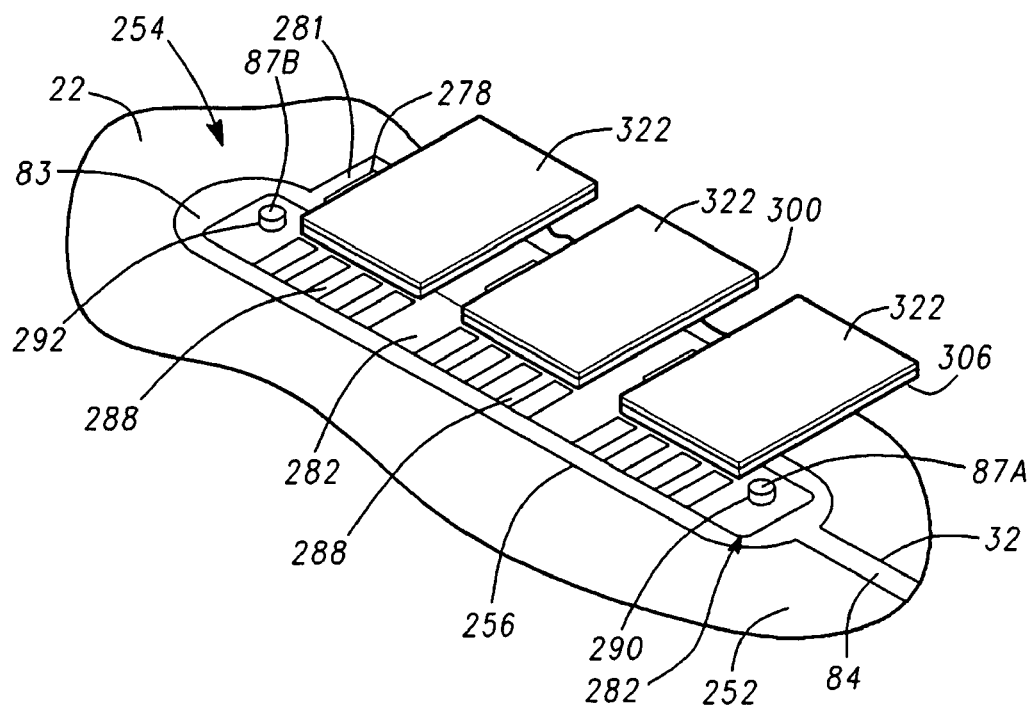
FIG. 46 is an isometric view of the semiconductor dice, interposer, and flange further along in manufacture in accordance with one or more embodiments.

FIG. 46 is an isometric view of a plurality of semiconductor dice 300 bonded to an interposer 282 and to a flange 252. More particularly, three semiconductor die 300 are flipped so that their gate bumps 104 (shown in FIG. 45) contact support portion 283 of interposer 282 and their source bumps 106 (shown in FIG. 45) contact surfaces 278 of contacts 276. It should be noted that the number of semiconductor dice is not a limitation of the claimed subject matter. There can be more than three semiconductor dice or fewer than three semiconductor dice.

Gate bumps 104 and source bumps 106 (shown in FIG. 45) may be respectively attached to support portion 283 of interposer 282 and to surfaces 278 of contacts 276 using eutectic bonding. For example, a die bonder (not shown) may be used to pick up a semiconductor die 300 and place it on interposer 282 and flange 252 so that gate bumps 104 contact support portion 283 of interposer 282 and so that source bumps 106 contact surfaces 278 of contacts 276. Then, heat and pressure, and optionally ultrasonic energy, may be applied to form the eutectic bond at the points where gate bumps 104 contact support portion 283 of interposer 282 and at the points where source bumps 106 contact surfaces 278 of contacts 276.

In embodiments wherein bumps 104 and 106 comprise a gold bump having a tin cap layer (not shown), the heat and pressure used to bond semiconductor dice 300 to flange 252 and interposer 282 may cause the gold and tin to diffuse together to form an alloy composition of, for example, 80% gold (Au) and 20% tin (Sn) at an upper portion of bumps 104 and 106 that may be used to bond bumps 104 and 106 to interposer 320° C. is applied to flange 252 and semiconductor dice 300 for a time period ranging from about 20 seconds to about 40 seconds.

Although the scope of the claimed subject matter is not limited in this respect, in some embodiments, flange 252 may comprise copper and may be gold-plated with about 30 microinches (about 0.762 microns) of gold. During the eutectic bonding process, some of the gold from the gold plating of flange 252 may be consumed during the bonding process to form the eutectic bond.

Figure 47:
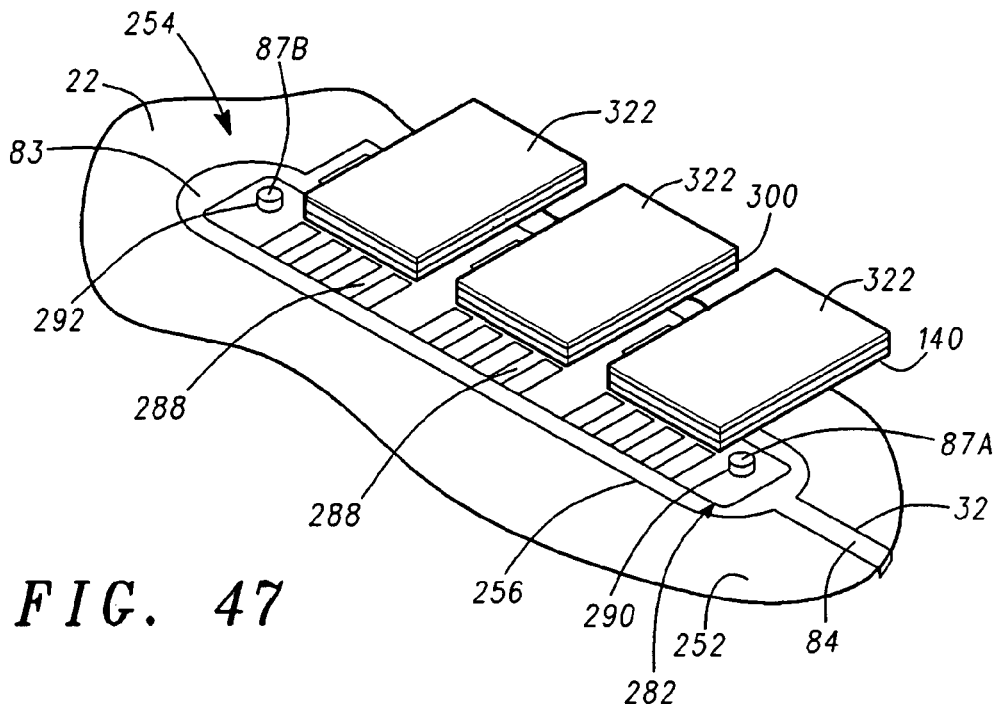
FIG. 47 is an isometric view of the semiconductor dice, interposer, and flange of FIG. 46 further along in manufacture in accordance with one or more embodiments.

Referring now to FIG. 47, an underfill material 140 may be dispensed between semiconductor dice 300 and interposer 282 and between semiconductor dice 300 and flange 252. Underfill material 140 has been discussed with reference to FIG. 19. After dispensing underfill material 140, it is cured. By way of example, underfill material 140 is polyimide. As is discussed below, including underfill material 140 in the spaces between flange 252 and semiconductor die 300 may increase the breakdown voltage of the transistors formed in semiconductor die 300. Underfill material 140 may also be used for mechanical integrity to distribute mechanical stresses more uniformly in wafer bumps 104 and 106. As may be appreciated, the type of underfill dielectric material selected may alter drain-to-gate and drain-to-source capacitance depending on the dielectric constant of the underfill dielectric material.

Figure 48:
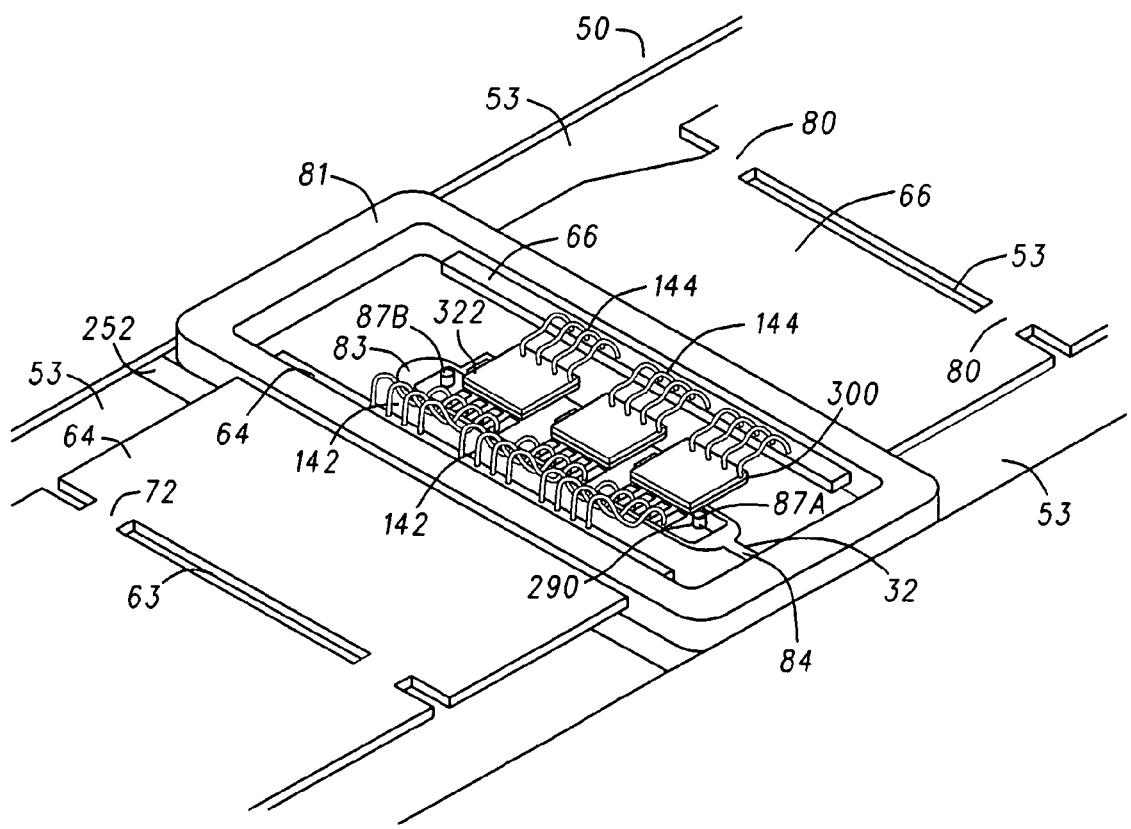
FIG. 48 is an expanded isometric view of the semiconductor dice, interposer, and flange of FIG. 47 further along in manufacture; in accordance with one or more embodiments

Referring now to FIG. 48, wirebonds 142 are formed from gate interconnect pads 288 to gate leads 64 and wirebonds 144 are formed from drain terminal 322 of semiconductor dice 300 to drain leads 66. Wirebonds 142 and 144 have been described with reference to FIG. 20. In alternate embodiments, rather than using wirebonds 142 and 144, a metal clip (not shown) may be used to couple gate lead 64 to gate interconnect pads 288 and another metal clip (not shown) may be used to couple drain terminal 322 to drain lead 66. Not using wire bonds may reduce parasitic inductance in semiconductor component 250.

Figure 49:
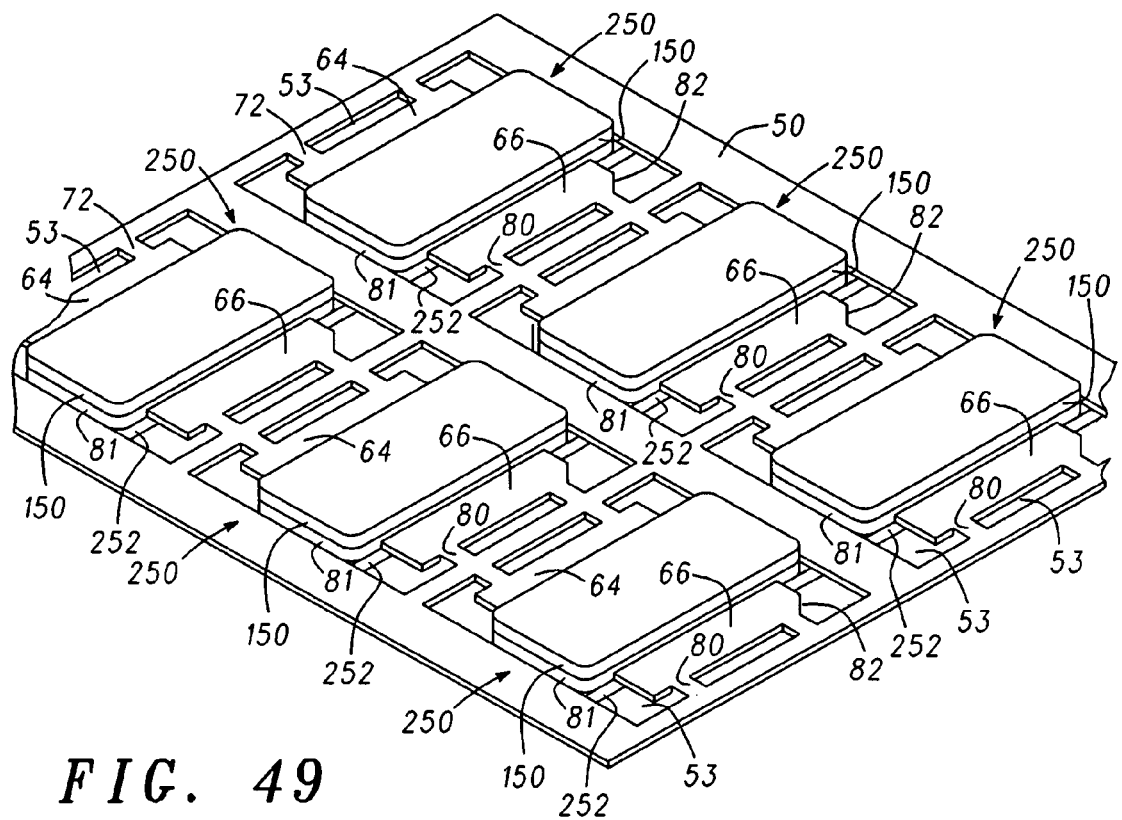
FIG. 49 is an isometric view of a plurality of semiconductor components of FIG. 48 at a later stage of manufacture in accordance with one or more embodiments.

Referring now to FIG. 49, an isometric view of a plurality of semiconductor components of FIG. 48 at a later stage of manufacture in accordance with one or more embodiments will be discussed. As shown in FIG. 49, lids 150 may comprise a dielectric material such as, for example, ceramic or plastic, are attached to dielectric rings 81 using for example, an epoxy, thereby forming a plurality of non-singulated semiconductor components 250.

Referring now to FIG. 50, individual packaged semiconductor components 250 are singulated from leadframe assembly 330 that included the plurality of non-singulated semiconductor components. As may be appreciated, tabs 80 and 72 as shown in FIG. 49 are cut to singulate the plurality of semiconductor components 250 from leadframe assembly 330. Techniques for singulating semiconductor components from leadframes are known to those skilled in the art.

A portion of gate lead 64 is partially exposed external to semiconductor component 250 to provide electrical coupling of a bias signal such as, for example, a voltage ranging from about one volt to about four volts, from an external source (not shown) to gate bond pads 318 as shown in FIG. 44 of semiconductor dice 300 via gate lead wirebonds 142 as shown in FIG. 48, gate interconnect pads 288 (shown in FIGS. 42-43), and gate bumps 104 as shown in FIG. 45. A portion of drain lead 66 is partially exposed external to semiconductor component 250 to provide electrical coupling of a bias signal such as, for example, a voltage ranging from about 20 volts to about 100 volts, from an external source (not shown) to drain terminal 322 of semiconductor dice 300 via drain lead 66 and wirebonds 144 as shown in FIG. 48. Flange 252 is partially exposed external to semiconductor component 250 to provide electrical coupling of a bias signal such as, for example, ground, to source bond pads 316 as shown in FIG. 45 of semiconductor dice 300 via flange 252 and source bumps 106 as shown in FIG. 45. Flange 252 is also partially exposed to allow coupling of flange 252 to a thermally conductive material having a relatively low thermal resistance such as, for example, a metal heat sink (not shown) to provide a thermal path for removing heat generated by semiconductor dice 300.

In the embodiment wherein semiconductor die 300 is a discrete power transistor, spacing flange 252 further away from the edges of semiconductor dice 300 may be selected to increase the breakdown voltage of semiconductor component 250. In some embodiments, flange 252 may be coupled to ground and the drain terminal 322 of semiconductor die 300 may be coupled to a relatively high voltage or voltage potential ranging from, for example, at least about 20 volts to over about 100 V. During operation, electric field potentials may be concentrated at the edges of semiconductor dice 300, and therefore, flange 252 may be positioned to be spaced apart at a predetermined distance from the edges of semiconductor dice 300 to prevent arcing between semiconductor dice 300 and flange 252. Arcing may adversely affect the breakdown voltage of a power transistor of semiconductor dice 300. As was discussed above, wafer bumps 104 and 106 are formed to have a predetermined height ranging from about 25 μm to about 100 μm to provide the spacing between semiconductor die 300 and flange 252 that produces drain-to-source breakdown voltages (BVds) ranging from about 50 volts to about 200 volts. Further, forming dielectric underfill material such as, for example, underfill material 140 discussed with reference to FIG. 47, in the spaces between flange 252 and semiconductor dice 300 may further increase the standoff and breakdown voltages of semiconductor die 300.

Figure 51:
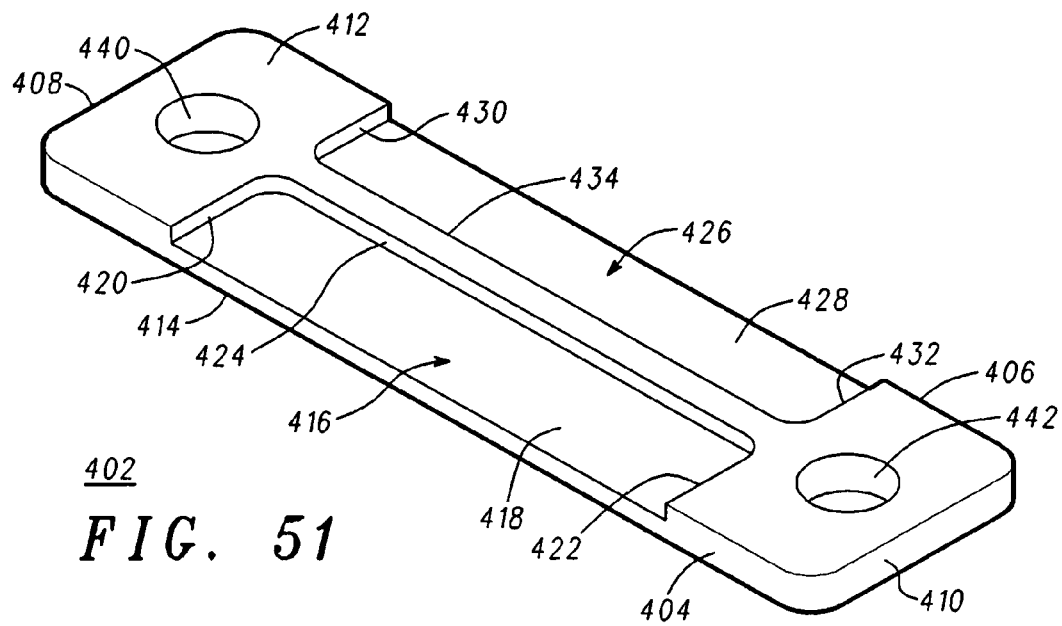
FIG. 51 is an isometric view of a flange used in the manufacture of a semiconductor component in accordance with one or more embodiments.
Figure 61:
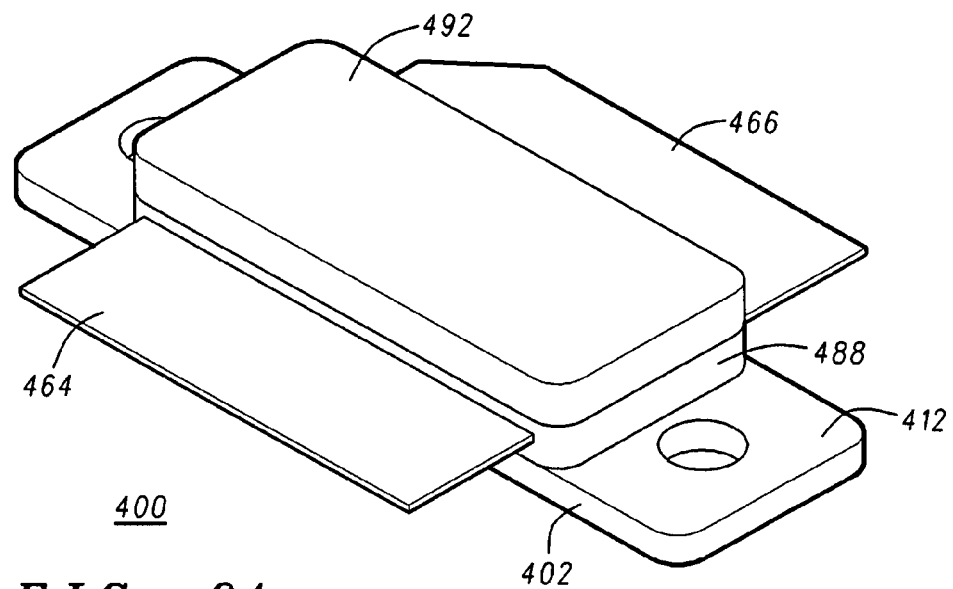
FIG. 61 is an isometric view of a semiconductor component of the plurality of semiconductor components of FIG. 60 at a later stage of manufacture in accordance with one or more embodiments.

FIG. 51 is an isometric view of a heatsink or flange 402 used in manufacturing a semiconductor component 400 as shown in FIG. 61 in accordance with another embodiment. Flange 402 may also be referred to as a heat spreader, and has opposing sides 404 and 406 that are parallel to or substantially parallel to each other, opposing sides 408 and 410 that are parallel to or substantially parallel to each other, and opposing surfaces 412 and 414 that are parallel to or substantially parallel to each other. Arrows are used in some of the figures to denote recesses, openings, voids, slots, cavities, and notches, and arrows are also used in some of the figures to denote surfaces or sides that are not visible in isometric views.

Surface 412 may be referred to as a top surface and surface 414 may be referred to as a bottom surface. In some embodiments, flange 402 is made from a material that is thermally and electrically conductive and has a CTE that matches, or substantially matches, the CTE of silicon. Examples of suitable materials for flange 402 are the same as those described with reference to flanges 12, 202, and 252.

Flange 402 is sized to assist in maintaining the temperature of semiconductor die 90 as shown in FIG. 17 at or below a predetermined temperature during operation of semiconductor die 90. For example, in RF applications, it may desirable to keep the junction temperature of an RF power transistor at a temperature of less than about 200° C. during operation. By way of example, flange 402 has a length ranging from about 20 millimeters (mm) to about 40 mm, a width ranging from about 5 mm to about 15 mm, and a thickness ranging from about 1 mm to about 3 mm. The dimensions of flange 402 are not limitations of the claimed subject matter.

A slot or notch 416 having a floor or surface 418, sidewalls 420 and 422, and a backwall 424 is formed in flange 402. Slot 416 extends from side 404 and surface 412 into the body of flange 402. A slot or notch 426 having a floor or surface 428, sidewalls 430 and 432, and a backwall 434 is formed in flange 402. Slot 426 extends from side 406 and surface 412 into the body of flange 402. Slots 416 and 426 may be formed by milling, etching, grinding, stamping, or the like and may have a rectangular shape, a quadrilateral shape, or other polygonal shape. In addition, slots 416 and 426 may have oval shapes. The shapes of slots 416 and 426 are not limitations of the claimed subject matter; however, in some embodiments, it is desirable that slots 416 and 426 have a backwall that is substantially straight.

Holes 440 and 442 are formed in the portions of flange 402 adjacent sides 408 and 410, respectively. Holes 440 and 442 extend from top surface 412 to bottom surface 414 and are typically used for securing semiconductor component 400 to another structure using a fastening means. By way of example, the other structure may be a printed circuit board (PCB), a heat sink, or the like and the fastening means may be a screw, bolt, or the like. Holes 440 and 442 are optional, as other means may be used to secure flange 402 to other structures.

Figure 52:
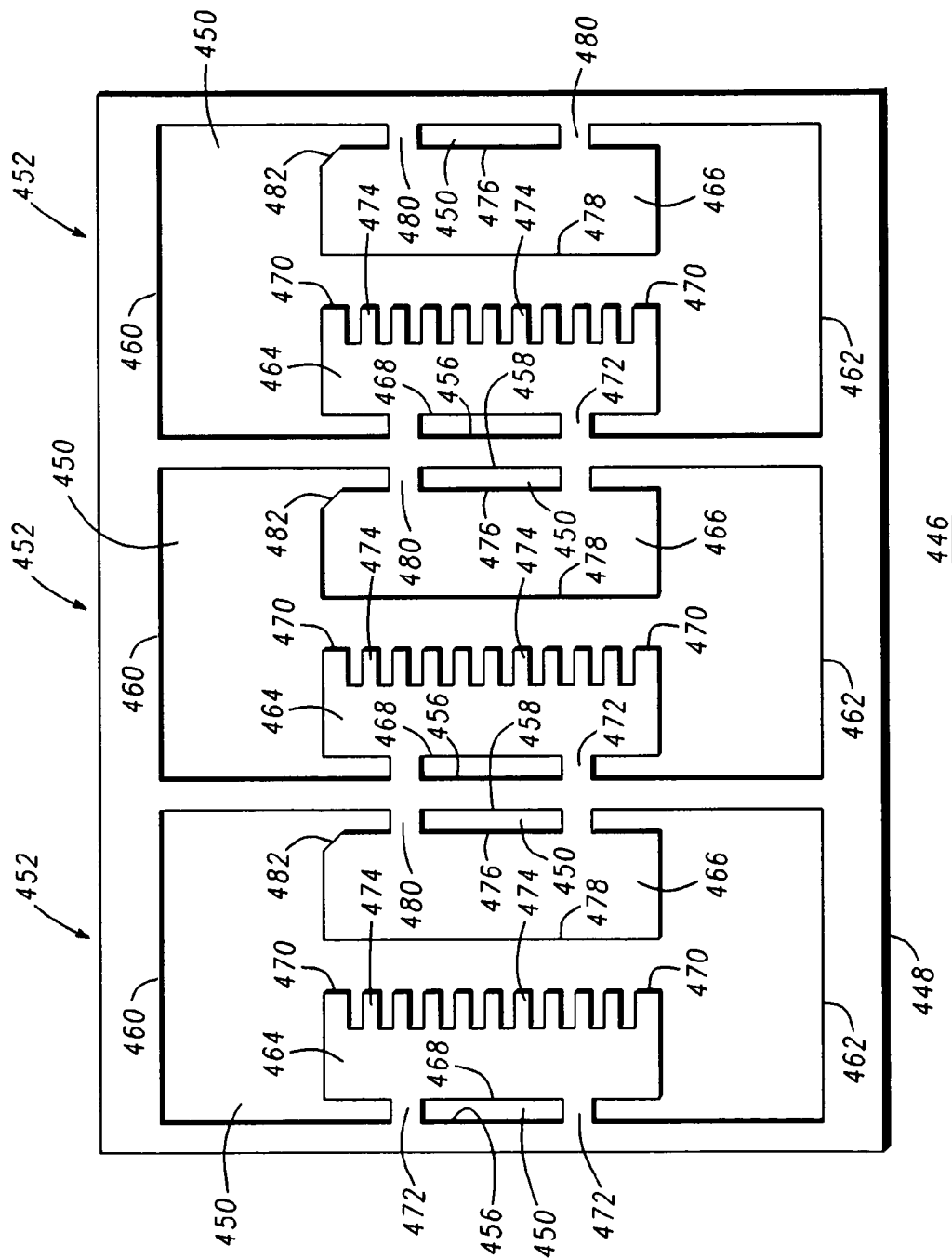
FIG. 52 is a top view of a leadframe suitable for use in manufacturing a semiconductor component in accordance with one or more embodiments.

FIG. 52 is a top view of a leadframe 446 having a leadframe body 448, a plurality of openings 450, and a plurality die attach regions 452. Each die attach region 452 has opposing sides 456 and 458, opposing sides 460 and 462, a gate lead 464 and a drain lead 466. Gate lead 464 has opposing sides 468 and 470. Tabs 472 extend from side 468 of gate lead 464 to side 456 of die attach region 452. In addition, gate lead 464 has a plurality of fingers, leads, or projections 474 extending from a body region of gate lead 464 to side 470. Drain lead 466 has opposing sides 476 and 478. Tabs 480 extend from side 478 of drain lead 466 to side 458 of die attach region 452. Drain lead 466 has a notch 482 which is used to indicate that it is the drain lead, although the methods and apparatuses described herein are not limited in this regard.

Figure 53:
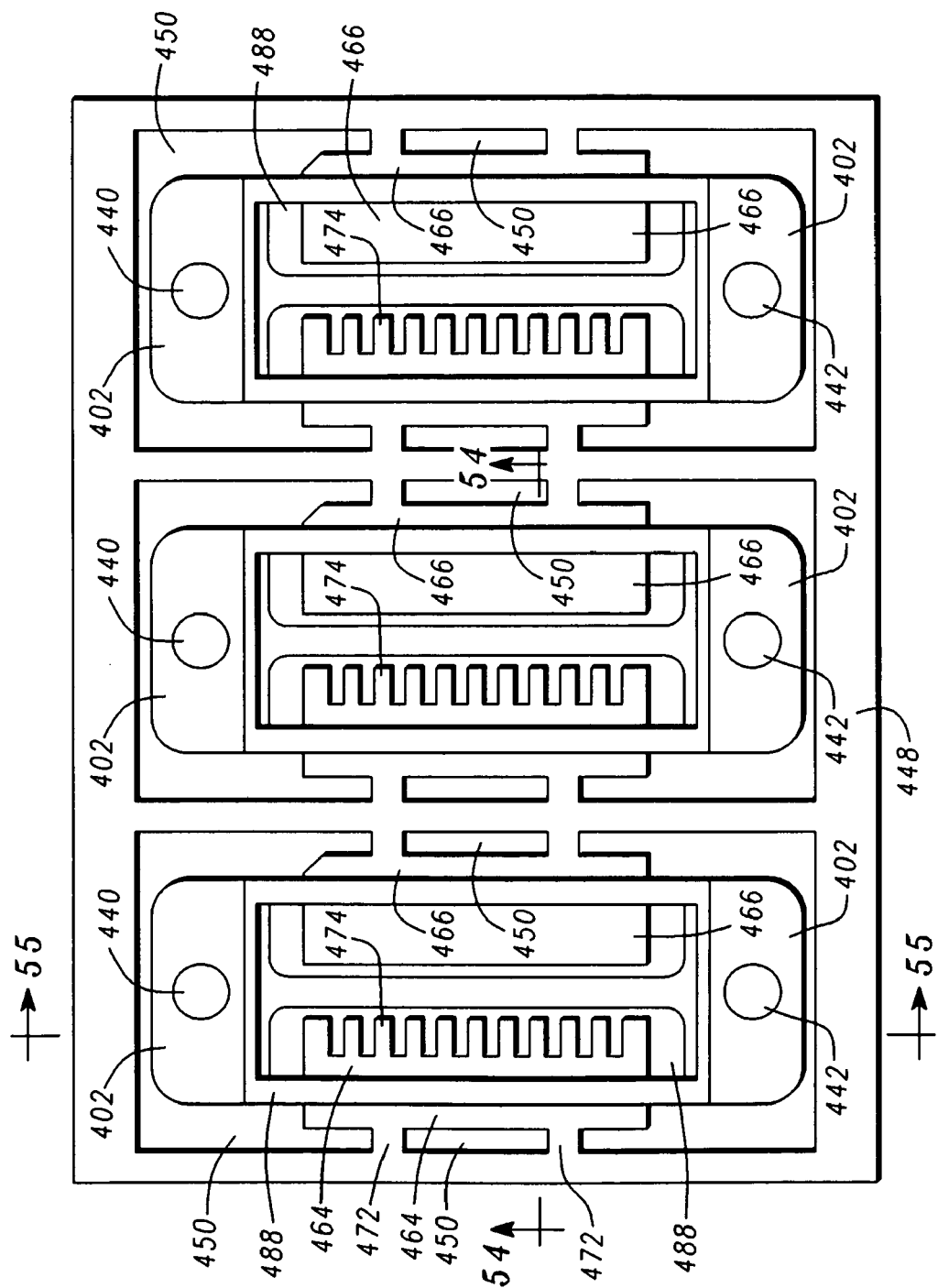
FIG. 53 is a top view of a plurality of the flanges of FIG. 51 coupled to the leadframe of FIG. 52 in accordance with one or more embodiments.

FIG. 53 is a top view of leadframe 446 and flange 402 coupled together by dielectric material 488. In accordance with some embodiments, leadframe 446 and flanges 402 are placed in a mold die and a die electric material such as, for example, a mold compound is injected into the mold die using an injection molding process to form dielectric material 488 that couples flanges 402 to leadframe 446. Suitable materials for dielectric material 488 include ceramic, polyimide, glass, or a mold compound such as, for example, a liquid crystal polymer. Dielectric material 488 has a ring-like structure and is therefore referred to as a dielectric ring in each flange attach region 452.

Figure 54:
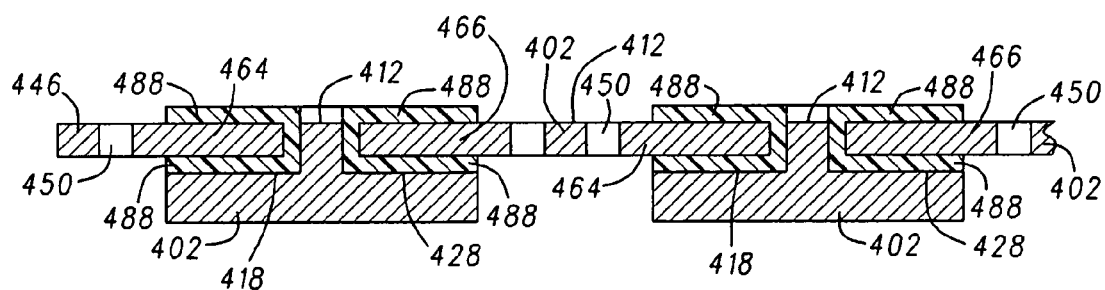
FIG. 54 is a cross-sectional view of the plurality of flanges and leadframe of FIG. 53 taken along section line 54-54 of FIG. 53 in accordance with one or more embodiments.
Figure 56:
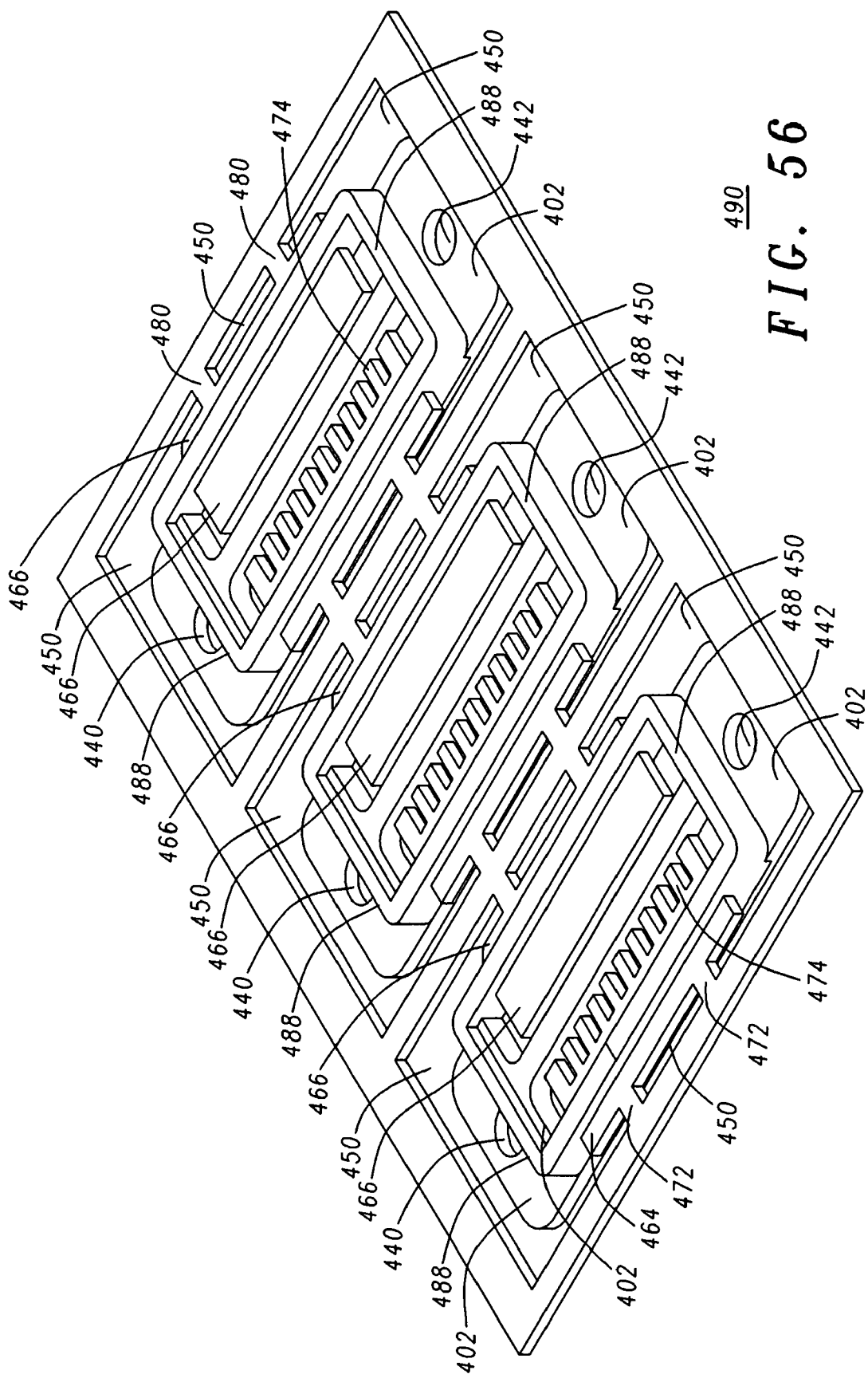
FIG. 56 is an isometric view of an assembly in accordance with one or more embodiments

FIG. 54 is a cross-sectional view taken along section line 54-54 of FIG. 53 that further illustrates dielectric rings 488 coupling flanges 402 to leadframe 446 to form leadframe assembly 490 as shown in FIG. 56. More particularly, the dielectric material of dielectric rings 488 is bonded to the top and bottom surfaces of gate leads 464 and drain leads 466 and to top surface 412 of flanges 402 and to surfaces 418 and 428 of notches 416 and 426, respectively. The portions of openings 450 between gate leads 464 and drain leads 466 remain open after forming dielectric rings 488.

Figure 55:
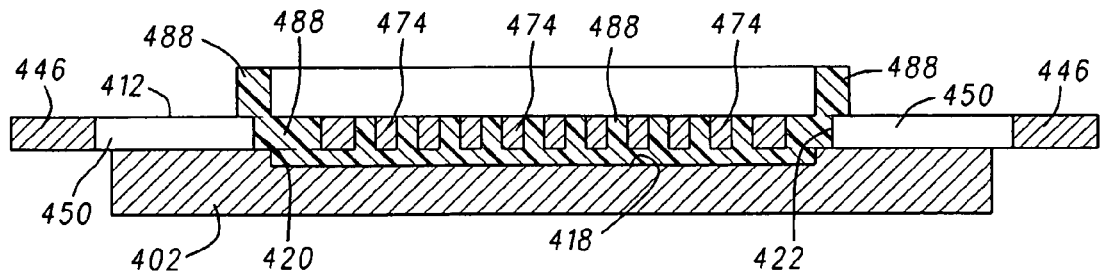
FIG. 55 is a cross-sectional view of the flanges and leadframe of FIG. 53 taken along section line 55-55 of FIG. 53 in accordance with one or more embodiments.

FIG. 55 is a cross-sectional view taken along section line 55-55 of FIG. 53 that further illustrates flange 402 bonded to leadframe 446 by dielectric material 488. More particularly, FIG. 55 shows fingers 474 within notch 416 that are spaced apart from floor 418, sidewalls 420, and adjacent fingers 474 by dielectric material 488. In addition, FIG. 55 shows dielectric material 488 bonded to top surface 412 of flange 402. Flange 402 is laterally spaced apart from leadframe 446 by opening 450.

FIG. 56 is an isometric view of leadframe assembly 490 which comprises a plurality of flanges 402 bonded to leadframe 446 by dielectric material 488. After individual packaged semiconductor components 400 (shown in FIG. 61) are singulated from leadframe 446, dielectric material 488 electrically isolates gate leads 464, drain leads 466, and flanges 402 from each other.

Figure 57:
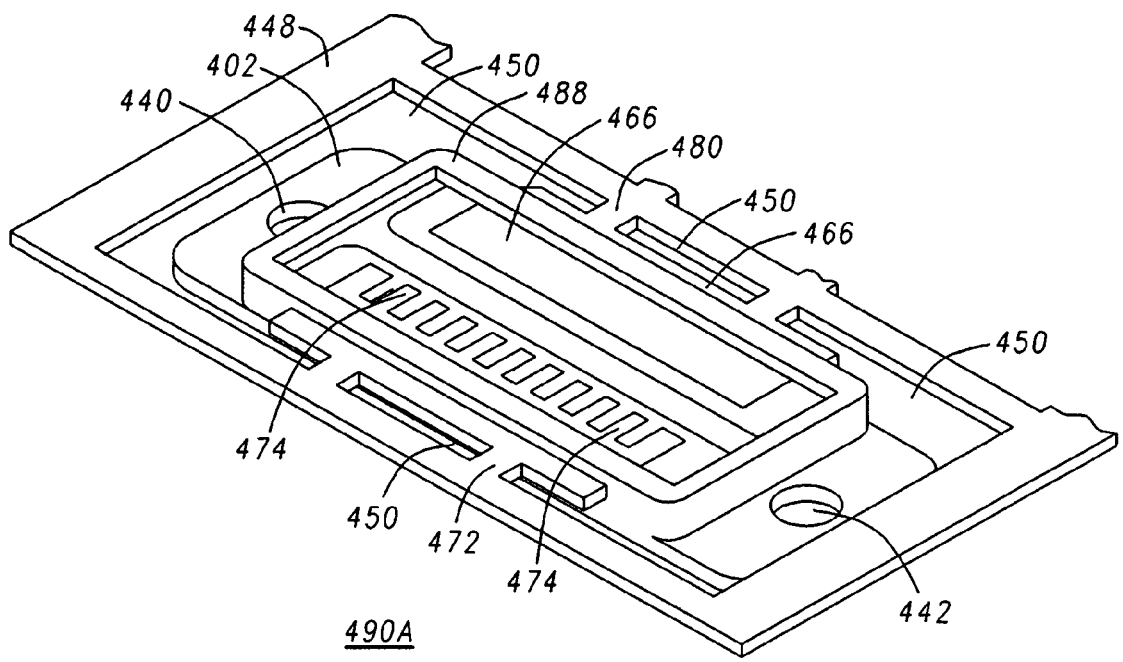
FIG. 57 is an expanded isometric view of the assembly of FIG. 56 in accordance with one or more embodiments.

FIG. 57 is an isometric view of a portion 490A of leadframe assembly 490 having a flange 402 bonded to a portion of leadframe 446 by dielectric material 488 in accordance with another embodiment. FIG. 57 further illustrates fingers 474 within notch 416 and electrically isolated from each other and from interposer 402 by dielectric material 488. Gate lead 464 is molded into position within notch 416.

Figure 58:
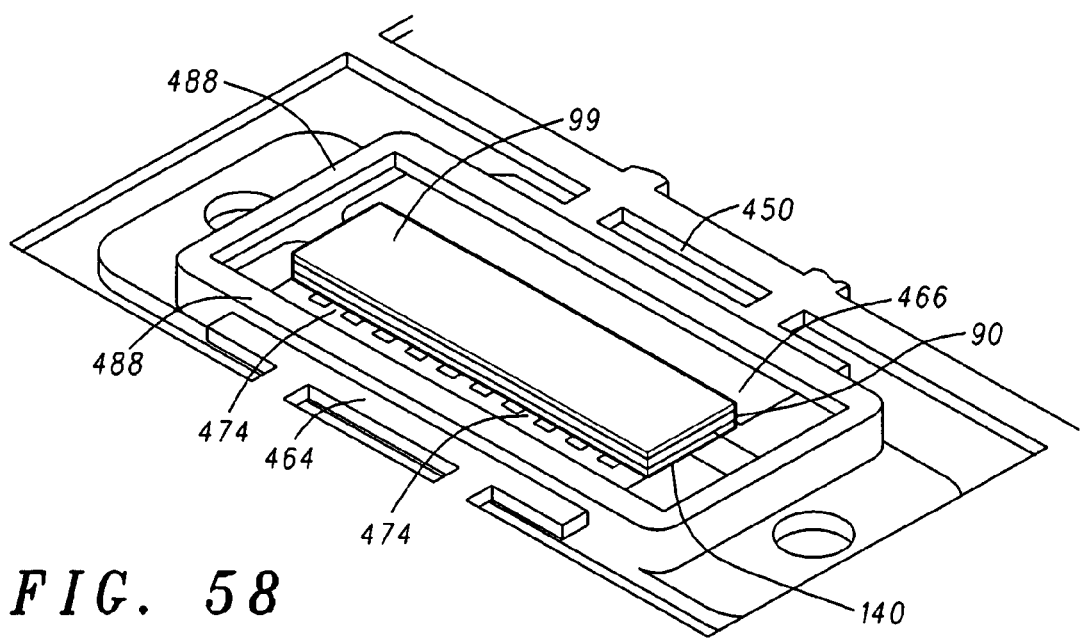
FIG. 58 is an isometric view of the single semiconductor die, interposer, and flange of FIG. 57 further along in manufacture in accordance with one or more embodiments.

FIG. 58 is an isometric view of semiconductor die 90 bonded to fingers 474 of leadframe 446 and to flange 402. More particularly, semiconductor die 90 is flipped so that gate bumps 104 (shown in FIG. 17) contact fingers 474 and so that source bumps 106 (shown in FIG. 17) contact surface 412 of flange 402.

Gate bumps 104 and source bumps 106 may be attached to contact fingers 474 and flange 402, respectively, using eutectic bonding. For example, a die bonder (not shown) may be used to pick up semiconductor die 90 and place it on contact fingers 474 and flange 402 so that gate bumps 104 contact fingers 474 and source bumps 106 contact flange 402. Then, heat and pressure, and optionally ultrasonic energy, may be applied to form the eutectic bond at the points where gate bumps 104 contact fingers 474 and at the points where source bumps 106 contact flange 402.

In embodiments wherein bumps 104 and 106 comprise a gold bump having a tin cap layer (not shown), the heat and pressure used to bond semiconductor die 90 to flange 402 and fingers 474 may cause the gold and tin to diffuse together to form an alloy composition of, for example, 80% gold (Au) and 20% tin (Sn) at an upper portion of bumps 104 and 106 that may be used to bond bumps 104 and 106 to fingers 474 and flange 402, respectively. As an example, a temperature of about 280° C. to about 320° C. is applied to flange 402 and semiconductor die 90 for a time period ranging from about 20 seconds to about 40 seconds.

Although the scope of the claimed subject matter is not limited in this respect, in some embodiments, flange 402 may comprise copper and may be gold-plated with about 30 microinches (about 0.762 microns) of gold. During the eutectic bonding process, some of the gold from the gold plating of flange 402 may be consumed during the bonding process to form the eutectic bond.

An underfill material 140 may be dispensed between semiconductor die 90 and fingers 474 and between semiconductor die 90 and flange 402 and then cured. By way of example, underfill material 140 is polyimide. Underfill material 140 is described with reference to FIG. 19.

Figure 59:
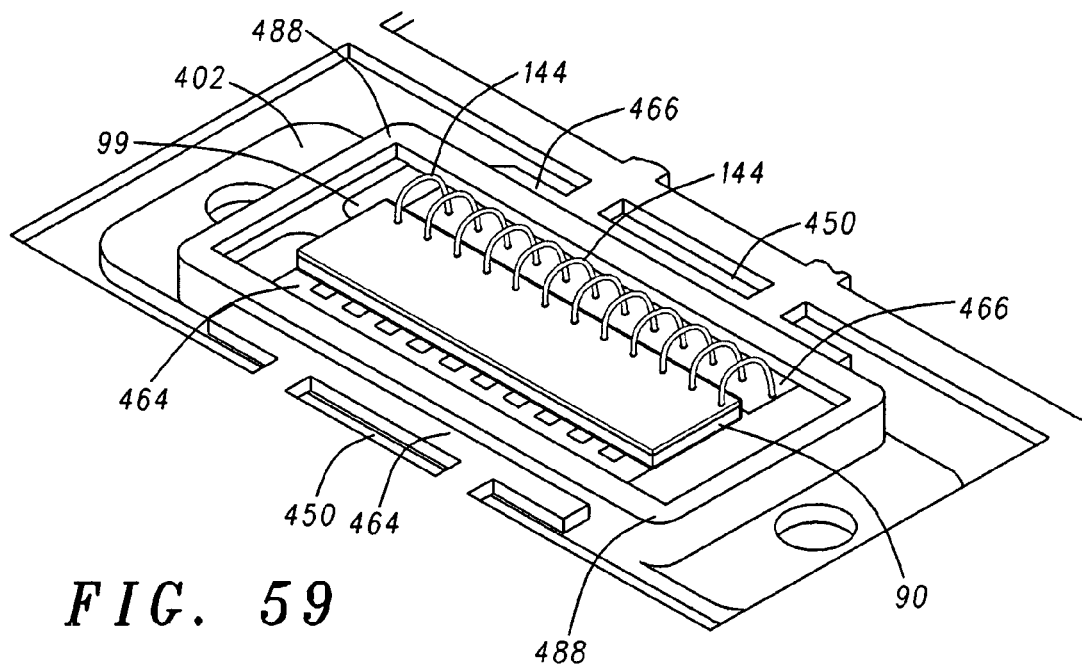
FIG. 59 is an isometric view of the single semiconductor die, interposer, and flange of FIG. 58 further along in manufacture in accordance with one or more embodiments.

Referring now to FIG. 59, wirebonds 144 are formed from drain terminal 99 of semiconductor die 90 to drain leads 466. Suitable dimensions and materials for wirebonds 144 have been described with reference to FIG. 20. In alternate embodiments, rather than using wirebonds 144, a metal clip (not shown) may be used to couple drain terminal 99 to drain lead 466. Not using wire bonds to couple fingers 474 to gate bumps 104 reduces the parasitic inductance in semiconductor component 400, which increases the bandwidth of semiconductor component 400.

Referring now to FIG. 60, lids 492 comprising a dielectric material such as, for example, ceramic or plastic, are attached to dielectric material 488 using for example, an epoxy, thereby forming a plurality of non-singulated semiconductor components 400.

Referring now to FIG. 61, individual packaged semiconductor components 400 are singulated from leadframe assembly 490 shown in FIG. 60 that included a plurality of non-singulated semiconductor components. As may be appreciated, tabs 472 and 480 are cut to singulate the plurality of semiconductor components 400, that is, to form a plurality of individual semiconductor components. Techniques for singulating semiconductor components from leadframes are known to those skilled in the art.

A portion of gate lead 464 is partially exposed external to semiconductor component 400 to provide electrical coupling of a bias signal such as, for example, a voltage ranging from about one volt to about four volts, from an external source (not shown) to gate bond pads 100 as shown in FIG. 17 of semiconductor die 90 via gate lead wirebonds 142 as shown in FIG. 59, gate interconnect pads 474 as shown in FIG. 53, and gate bumps 104 as shown in FIG. 17. A portion of drain lead 466 is partially exposed external to semiconductor component 400 to provide electrical coupling of a bias signal such as, for example, a voltage ranging from about 20 volts to about 100 volts, from an external source (not shown) to drain terminal 99 of semiconductor die 90 via drain lead 466 and wirebonds 144 as shown in FIG. 59. Flange 402 is partially exposed external to semiconductor component 400 to provide electrical coupling of a bias signal such as, for example, ground, to source bond pads 102 as shown in FIG. 17 of semiconductor die 90 via flange 402 and source bumps 106 as shown in FIG. 17. Flange 402 is also partially exposed to allow coupling of flange 402 to a thermally conductive material having a relatively low thermal resistance such as, for example, a metal heat sink (not shown) to provide a thermal path for removing heat generated by semiconductor die 90.

In embodiments wherein semiconductor die 90 is a discrete power transistor, spacing flange 402 further away from the edges of semiconductor die 90 may be accomplished to increase the breakdown voltage of semiconductor component 400. In some embodiments, flange 402 may be coupled to ground and the drain terminal 99 of semiconductor die 90 may be coupled to a relatively high voltage or voltage potential ranging from, for example, at least about 20 volts to over about 100 V. During operation, electric field potentials may be concentrated at the edges of semiconductor die 90, and therefore, flange 402 may be positioned to be spaced apart by a predetermined distance from the edges of semiconductor die 90 to prevent arcing between semiconductor die 90 and flange 402. Arcing may adversely affect the breakdown voltage of the power transistor of semiconductor die 90. As was discussed above, wafer bumps 104 and 106 are formed to have a predetermined height ranging from about 25 µm to about 100 µm to provide the amount of spacing between semiconductor die 90 and flange 402 to support drain-to-source breakdown voltages (BVds) ranging from about 50 volts to about 200 volts.

Although specific embodiments have been disclosed herein, it is not intended that the claimed subject matter be limited to the disclosed embodiments. Those skilled in the art will recognize that modifications and variations can be made without departing from the spirit and scope of the claimed subject matter. It is intended that the claimed subject matter encompass all such modifications and variations as fall within the scope of the appended claims.

What is claimed is:

1. An apparatus, comprising:
   a flange including an interposer trench formed therein and a mold lock formed about a periphery of the interposer trench;
   a dielectric ring including a dielectric material formed in the interposer trench, in the mold lock, and around the periphery of the mold lock, wherein the mold lock comprises one or more alignment structures formed thereon;
   an interposer disposed in the interposer trench, wherein the interposer includes two or more fingers and one or more holes formed therein coupled with the one or more alignment structures;
   a semiconductor die disposed within the dielectric ring, wherein the semiconductor die includes a gate pad and a source pad, each formed on a first side of the die, wherein a drain pad is disposed on a second side of the semiconductor die opposite to the first side, and wherein the gate pad is coupled to the interposer and the source pad is coupled to the flange; and
   a gate lead and a drain lead, wherein the gate lead is coupled to the interposer and the drain lead is coupled to the drain pad.

2. The apparatus of claim 1, wherein the gate pad is coupled to the interposer and the source pad is coupled to the flange via a plurality of wafer bumps, and wherein the wafer bumps have a height such that the semiconductor die is disposed at a distance apart from the flange to provide a selected standoff voltage.

3. The apparatus of claim 1, wherein the gate lead is coupled to the interposer via a wirebond, a clip, or a combination thereof, and wherein the drain lead is coupled to the drain lead via a wirebond, a clip, or a combination thereof.

4. The apparatus of claim 1, further comprising an underfill material disposed between the semiconductor die and the flange, and further disposed between the semiconductor die and the interposer, wherein the underfill material is selected to provide a selected breakdown voltage.

5. The apparatus of claim 1, wherein the gate pad is coupled to the two or more fingers of the interposer.

6. The apparatus of claim 1, wherein the interposer is generally planar with respect to a surface of the flange within the dielectric ring.

7. The apparatus of claim 1, further comprising a slot disposed between the interposer trench, wherein the slot includes the dielectric material formed therein and extends from the interposer to a channel lock.

8. The apparatus of claim 1, further comprising a slot disposed between the interposer trench, wherein the slot includes the dielectric material formed therein and extends from the interposer toward a channel lock without reaching the channel lock.

9. The apparatus of claim 1, wherein the gate pad comprises extensions that at least partially surround a corresponding source pad on the semiconductor die.

10. The apparatus of claim 1, further comprising a lid coupled to the dielectric ring such that the semiconductor die is enclosed by the flange, the dielectric ring, and the lid.

11. An apparatus comprising:
a flange including both a first slot and a second slot formed therein;
a dielectric ring including a dielectric material formed in both the first slot and the second slot and disposed around a periphery of the first slot and the second slot;
a gate lead disposed in the first slot and a drain lead disposed in the second slot, wherein the gate lead includes two or more fingers formed thereon; and
a semiconductor die disposed within the dielectric ring and including a gate pad and a source pad, each formed on a first side of the die, wherein the semiconductor die further includes a drain pad disposed on a second side of the semiconductor die opposite to the first side, wherein the gate pad is coupled to the gate lead, wherein the source pad is coupled to the flange between the first slot and the second slot, and wherein the drain pad is coupled to the drain lead.

12. The apparatus of claim 11, wherein the gate pad is coupled to the gate lead and the source pad is coupled to the flange via a plurality of wafer bumps, and wherein the wafer bumps have a height such that the semiconductor die is disposed at a distance apart from the flange to provide a selected standoff voltage.

13. The apparatus of claim 11, wherein the drain lead is coupled to the drain lead via a wirebond, a clip, or a combination thereof.

14. The apparatus of claim 11, further comprising an underfill material disposed between the semiconductor die and the flange, wherein the underfill material is selected to provide a selected breakdown voltage.

15. The apparatus of claim 11, wherein the gate pad is coupled to the two or more fingers of the gate lead.

16. The apparatus of claim 11, wherein the gate lead and the drain lead are generally planar with respect to a surface of the flange within the dielectric ring.

17. The apparatus of claim 11, wherein the gate pad comprises extensions that at least partially surround a corresponding source pad on the semiconductor die.

18. The apparatus of claim 11, further comprising a lid coupled to the dielectric ring such that the semiconductor die is enclosed by the flange, the dielectric ring, and the lid.

19. An apparatus comprising:
a flange including an interposer trench formed therein and a mold lock formed about a periphery of the interposer trench;
a dielectric ring including a dielectric material formed in the interposer trench, in the mold lock, and around the periphery of the mold lock, wherein the mold lock comprises one or more alignment structures formed thereon;
an interposer disposed in the interposer trench, wherein the interposer includes two or more groups of two or more fingers and one or more holes formed therein coupled with the one or more alignment structures;
two or more semiconductor die disposed within the dielectric ring and including gate pads and source pads, each formed on a first side of a respective semiconductor die, wherein the two or more semiconductor die further include drain pads disposed on a second side of the die opposite to the first side, wherein the gate pads are coupled to the interposer and the source pads are coupled to the flange, and wherein the two or more semiconductor die are coupled to a respective group of two or more fingers of the interposer; and
a gate lead and a drain lead, wherein the gate lead is coupled to the interposer and the drain lead is coupled to the drain pads.

20. The apparatus of claim 19, wherein the gate pads of the two or more semiconductor die are coupled to the fingers of the respective group.

* * * * *

UNITED STATES PATENT AND TRADEMARK OFFICE
CERTIFICATE OF CORRECTION

PATENT NO. : 8,338,937 B2
APPLICATION NO. : 12/506721
DATED : December 25, 2012
INVENTOR(S) : Elliott et al.

It is certified that error appears in the above-identified patent and that said Letters Patent is hereby corrected as shown below:

In the Specification

In Column 6, Line 28, delete "now" and insert -- now to --, therefor.

In Column 9, Line 44, delete "slots" and insert -- slot --, therefor.

In Column 12, Line 17, delete "um," and insert -- μm, --, therefor.

In Column 12, Line 18, delete "um, width $W_2$ is about 120 um," and insert -- μm, width $W_2$ is about 120 μm, --, therefor.

In Column 12, Line 19, delete "um." and insert -- μm. --, therefor.

In Column 23, Line 60, delete "(elm)." and insert -- (μm). --, therefor.

In Column 25, Line 40, delete "interposer" and insert -- interposer 282 and flange 252, respectively. As an example, a temperature of about 280° C. to about --, therefor.

Signed and Sealed this
Ninth Day of July, 2013

Teresa Stanek Rea
*Acting Director of the United States Patent and Trademark Office*